United States Patent [19]

Tajima et al.

[11] Patent Number: 5,801,589
[45] Date of Patent: Sep. 1, 1998

[54] FREQUENCY SYNTHESIZER WHICH SUPPRESSES A SPURIOUS

[75] Inventors: Kenichi Tajima; Kenji Itoh; Shuji Nishimura; Masayuki Doi; Akio Iida, all of Tokyo, Japan

[73] Assignee: Mitsubishi Denki Kabushiki Kaisha, Tokyo, Japan

[21] Appl. No.: 781,519

[22] Filed: Jan. 9, 1997

[30] Foreign Application Priority Data

Jun. 28, 1996 [JP] Japan ..................... 8-169949

[51] Int. Cl.[6] ..................... H03L 7/00; H03B 27/00
[52] U.S. Cl. ..................... 331/1 R; 331/18; 331/25; 331/46; 331/49; 331/51
[58] Field of Search ..................... 331/1 R, 18, 25, 331/46, 49, 51

[56] References Cited

U.S. PATENT DOCUMENTS

| | | | |
|---|---|---|---|
| 4,965,553 | 10/1990 | Gilmore | 331/18 |
| 5,184,093 | 2/1993 | Itoh et al. | 331/25 |
| 5,270,669 | 12/1993 | Jokura | 331/25 |
| 5,497,128 | 3/1996 | Sasaki | 331/49 |

FOREIGN PATENT DOCUMENTS

| | | |
|---|---|---|
| 6-235379 | 1/1993 | Japan . |
| 5-67969 | 11/1993 | Japan . |

OTHER PUBLICATIONS

A. Bramble, *Proc. 35th Ann.Freg.Control Symposium*, pp. 406–414.

*Primary Examiner*—David C. Nelms
*Assistant Examiner*—Trong Phan

[57] ABSTRACT

A variable divider in which a dividing number setting parameter can be set is provided in a reference oscillator. When a frequency setting parameter is selected so that a DDS will not output a spurious at a specified level or at a level higher than the specified level within an output band of an PLL in response to an output frequency from the PLL, both a conversion function setting parameter for a variable divider in the PLL and a dividing number setting parameter for a variable divider in the reference oscillator are adjusted so that the output frequency and the selected frequency setting parameter are satisfied.

20 Claims, 46 Drawing Sheets

FIG.4

| k | DETERMINATION FLAG h FOR k |
|---|---|
| 0 | 1 |
| . | . |
| . | . |
| . | . |
| ks−1 | 1 |
| ks | 0 |
| ks+1 | 1 |
| . | . |
| . | . |
| . | . |
| $2^L-1$ | 1 |

FIG.9

| ADDRESS IN MEMORY | DETERMINATION FLAG h FOR k |
|---|---|
| 00000 | 1 |
| . | . |
| . | . |
| . | . |
| 01010 | 1 |
| 01011 | 0 |
| 01100 | 1 |
| . | . |
| . | . |
| . | . |
| $2^L-1$ | 1 |

FIG.11

| k | ADDRESS IN MEMORY | DETERMINATION FLAG h |
|---|---|---|
| 00000 | 0000 | 1 |
| 00001 | | |
| 00010 | 0001 | 1 |
| 00101 | | |
| . | . | . |
| . | . | . |
| . | . | . |
| 10110 | 1011 | 0 |
| 10111 | | |
| 11000 | 1100 | 1 |
| 11001 | | |
| . | . | . |
| . | . | . |
| . | . | . |
| 11110 | 1111 | . |
| 11111 | | 1 |

FIG.13

| ADDRESS i | CONTENTS OF MEMORY | |
|---|---|---|
| | LOWER LIMIT VALUE $a_i$ | UPPER LIMIT VALUE $b_i$ |
| 0 | 0000000 | 0000010 |
| 1 | 0000100 | 0000110 |
| 2 | 0001000 | 0001100 |
| 3 | 0010000 | 0011000 |
| 4 | 0100000 | 0110000 |
| 5 | 1000000 | 1100000 |
| . | . | . |
| . | . | . |
| . | . | . |

FIG.16

| ADDRESS IN MEMORY i | ORDERS $m_i$ |
|---|---|
| 0 | 2 |
| 1 | 3 |
| 2 | 4 |
| 3 | 5 |
| 4 | 9 |
| 5 | 11 |
| 6 | 15 |
| 7 | 21 |
| 8 | 42 |
| . | . |
| . | . |
| . | . |

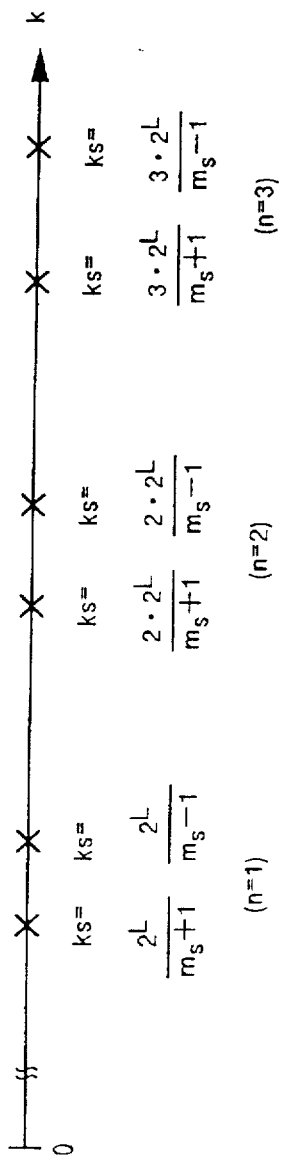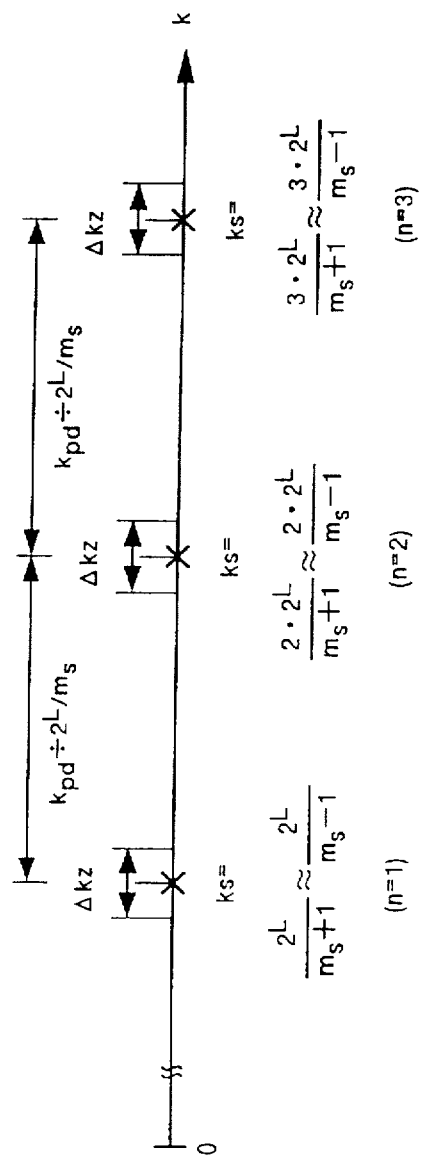

FIG.23

| ADDRESS IN MEMORY i | ORDERS $m_i$ |
|---|---|
| 0 | 2 |
| 1 | 3 |
| 2 | 4 |
| 3 | 5 |
| 4 | 9 |
| 5 | 11 |
| 6 | 15 |
| 7 | 21 |
| 8 | 42 |
| . | . |
| . | . |
| . | . |

FIG.26

| ADDRESS IN MEMORY | | | CONTENTS OF MEMORY | |
|---|---|---|---|---|
| k | R | N | α | β |
| 00000 | 00000 | 00000 | 00000 | 00000 |
| 00001 | 00001 | 00001 | 00001 | 00001 |
| 00010 | 00010 | 00010 | 00010 | 00010 |
| . | . | . | . | . |
| . | . | . | . | . |
| . | . | . | . | . |
| 10110 | 10110 | 10110 | 10110 | 10110 |
| 10111 | 10111 | 10111 | 10111 | 10111 |
| 11000 | 11000 | 11000 | 11000 | 11000 |
| . | . | . | . | . |
| . | . | . | . | . |
| . | . | . | . | . |

FIG.29

| ADDRESS IN MEMORY 7 | CONTENTS OF MEMORY 7 | | |
|---|---|---|---|
| $D_{out}$ | k | R | N |
| 00000 | 00000 | 00000 | 00000 |
| 00001 | 00001 | 00001 | 00001 |
| 00010 | 00010 | 00010 | 00010 |
| . | . | . | . |
| . | . | . | . |
| . | . | . | . |
| 10110 | 10110 | 10110 | 10110 |
| 10111 | 10111 | 10111 | 10111 |
| 11000 | 11000 | 11000 | 11000 |
| . | . | . | . |
| . | . | . | . |
| . | . | . | . |

OUTPUT SPECTRUM FROM DDS
REFERENCE CLOCK $f_{ck}$, FREQUENCY
SETTING PARAMETER $k_1$

OUTPUT SPECTRUM FROM PLL
REFERENCE CLOCK $f_{ck}$, FREQUENCY
SETTING PARAMETER $k_1$

EXAMPLE OF $SP_{dds}$ TO AN ORDER m OF HARMONIC IN $f_d$ 5,801,589

FREQUENCY SYNTHESIZER WHICH SUPPRESSES A SPURIOUS

FIELD OF THE INVENTION

The present invention relates to a frequency synthesizer having a direct digital synthesizer used as a transmitter/receiver especially in a radio communication system or the like.

BACKGROUND OF THE INVENTION

FIG. 39 shows an example of configuration of a conventional type of frequency synthesizer based on a phase locked loop (described as PLL hereinafter) in which is applied a direct digital synthesizer (described as DDS hereinafter) as disclosed in "Direct Digital Frequency Synthesis" by A. L. Bramble introduced from p. 406 to p. 414 of the proceedings for the IEEE 35th Annual Frequency Control Symposium held in May, 1981 or U.S. Pat. No. 4965533.

In FIG. 39, reference numeral 11 is a reference clock, 12 a DDS, 1$i$ a reference oscillator as a first frequency synthesizer comprising a DDS 12 and the reference clock 11. Reference numeral 21 is a phase comparator, 22 a loop filter, 23 a voltage control oscillator (VCO), 24 a variable divider, and 2 a PLL as a second frequency synthesizer comprising a phase comparator 21, a loop filter 22, a voltage control oscillator 23, and a variable divider 24. Also in this figure, the sign $f_{ck}$ indicates an output frequency of a reference clock, $f_d$ indicates an output frequency from the DDS 12, $f_r$ indicates an input frequency for the phase comparator 21, and $f_{out}$ indicates an output frequency from the PLL 2. In the synthesizer based on the conventional configuration shown in FIG. 39, the PLL 2 operates so that a phase difference between an output wave from the VCO 23 divided by N with the variable divider 24 and an output wave from the reference oscillator 1 having the DDS 12 therein will be output, namely so that frequencies of the output waves will be identical to each other, and outputs the output frequency $f_{out}$.

FIG. 40 shows configuration of the DDS 12 shown in FIG. 39. In FIG. 40, reference numeral 12$a$ is a phase accumulator, at 12$b$ a memory, at 12$c$ a D-A converter, and at 12$d$ a filter. The DDS 12 accumulates frequency setting data k with an L bit length inputted from the phase accumulator 12$a$, converts the frequency setting data to phase data $\phi$, and outputs the converted data $\phi$. In the memory 12$b$, amplitude data $\sin \phi$ for a sinusoidal wave is stored, and the amplitude data $\sin \phi$ is outputted according to the phase data $\phi$ and is converted to an analog waveform in the D-A converter 12$c$. The digital computing described above is executed in synchronism with the reference clock 11, and spurious components such as a component of the reference clock 11 included in an output wave from the D-A converter 12$d$ or a harmonic wave component are removed by the filter 12$d$.

FIG. 41 shows an example of another configuration of the DDS 12. In the DDS 12 shown in FIG. 41, in order to prevent the memory 12$b$ of the DDS 12 shown (in FIG. 40 in a case of resolution for a high frequency) from requiring a large memory capacity, a $\sin \phi$ computing circuit 12$e$ making use of the CORDIC algorithm is provided in place of the memory 12$b$, and the $\sin \phi$ is computed through digital computing.

An output frequency $f_d$ from the DDS 12 shown in FIG. 40 as well as in FIG. 41 is generally defined by the following expression:

$$f_d = k \cdot f_{ck}/2^L \qquad (1)$$

wherein $f_{ck}$ indicates an output frequency from the reference clock 11 and L indicates a bit number of the frequency setting parameter k for the DDS 12.

In the frequency synthesizer having a PLL 2 as shown in FIG. 39, the output frequency $f_{out}$ from the PLL which is an output frequency therefrom is controlled so that a frequency of an output wave from the VCO 23 divided by N with the variable divider 24 will be identical to that of an output wave from the reference oscillator 1 having the DDS 12, so that the output frequency $f_{out}$ becomes N times larger than the output frequency $f_d$ from the DDS 12 (N·$f_d$) For this reason, in the frequency synthesizer having the configuration as described above, it is possible to select the output frequency $f_{out}$ with a gap of $f_d$ by changing the dividing number N in the variable divider 24 based on a conversion function setting parameter N, and also it is possible to select the output frequency $f_{out}$ with a gap of N·$f_{ck}/2^L$ by changing the frequency setting parameter k in the DDS 12.

As clearly understood from the expression (1) expressing the output frequency $f_d$ from the DDS 12, in this DDS 12, by making a word length of the frequency setting parameter k a multi-bit one, it is possible to easily obtain a high frequency resolution without causing degradation of other characteristics. For this reason, by using the reference oscillator 1 having the DDS 12 in the PLL 2, it is possible to select an output frequency with a fine gap by changing the frequency setting parameter k in the DDS 12.

FIG. 42 shows another example of configuration of a frequency synthesizer having therein a PLL in which the DDS 12 is applied. In FIG. 42, reference numeral 13 is a variable divider with a dividing member R provided in a latter state of the DDS 12 within the reference oscillator 1$j$, and other portions of this configuration are the same as those shown in FIG. 39, so that the same reference numerals are assigned to the corresponding sections and description thereof is omitted.

In the frequency synthesizer having the configuration shown in FIG. 42, the PLL 2 operates so that the output frequency $f_{out}$ from the VCO 23 divided by N with the variable divider 24 will be identical to $f_r$ which is an output frequency $f_d$ from the DDS 12 divided by R in the variable divider 13'. Generally in an IC for a low price PLL synthesizer commercially available, the variable divider 13' is provided in the reference oscillator 1$i$ as described above, so that the IC as described above is preferably used.

FIG. 43 shows further different configuration of the frequency synthesizer having a PLL in which a DDS is applied (Refer to Japanese Patent Laid-Open Publication No. HEI 5-67969, Japanese Patent Application No. HEI 6-235379, for example). In FIG. 43, reference numeral 14 is a local oscillator, 15 a mixer, 16 a band pass filter (BPF), and 17 an amplifier (AMP) which is provided in the latter stage of the DDS 12 inside the reference oscillator 1$k$. Other portions of the configuration are the same as those shown in FIG. 39, so that the same reference numerals are assigned to the corresponding sections and description thereof is omitted.

In the frequency synthesizer having the configuration as shown in FIG. 43, the PLL 2 operates so that the output frequency $f_{out}$ from the VCO 23 divided by N with the variable divider 24 will be identical to $f_r$ obtained by converting the output frequency $f_d$ from the DDS 12 to a high frequency in the mixer 15. For this reason, the configuration with the mixer 15 as described above has the advantage that the output frequency $f_d$ from the DDS 12 may be lower as compared to that in the configuration shown in FIG. 39, and the DDS 12 can operate therein with low power consumption therein.

In the conventional types of frequency synthesizers as shown in FIG. 39 to FIG. 43, is used the DDS 12 as a reference oscillator for enabling change of an output frequency from the frequency synthesizer with the DDS 12, so that there has been an advantage that a frequency gap for a narrow channel can easily be obtained without causing degradation of the characteristics in, for instance, a phase noise near a carrier wave for the frequency synthesizer or a period of time required for switching a frequency.

However, the DDS 12 generates and outputs a sinusoidal wave through digital computing, so that in some frequencies it may sometimes generate and output a spurious high level at a specified level or at a level higher than the specified level (described as high spurious hereinafter) caused by a quantization error or for some other reasons and affecting communication. In this case, if high spurious is generated in an output band from the PLL 2, the high spurious can not be removed in the PLL 2, and the high spurious is outputted in a carrier wave outputted from the PLL 2, which causes degradation of communication quality or a frequency selectivity.

Next detailed description is made for this problem with reference to the related drawings.

FIG. 44 shows an example of an output spectrum from the DDS 12. In FIG. 44, the horizontal axis shows a detuning frequency (MHz) from a carrier wave which is an output wave from the PLL 2 with the vertical axis expressing an amplitude (dBc), and from this figure it is understood that there are many spuriouses near the output wave from the DDS 12. For this reason, if there is the spurious near a carrier wave for the frequency synthesizer, the spurious is amplified by $20 \cdot LOG_{10} N$ (dB) in a pass band of the PLL 2 shown in FIG. 39. So in FIG. 39, assuming that a spurious level in the DDS 12 is $SP_{dds}$ (dBc) and a spurious level in an output from the synthesizer is $SP_{out}$ (dBc), the relation is given by the following expression (2):

$$SP_{out} = 20 \cdot LOG_{10}(f_{out}/f_r) + SP_{dds} = 20 \cdot LOG_{10}(N) + SP_{dds} \quad (2)$$

Herein $f_r$ indicates a phase comparison frequency which is an input frequency to the PLL 2 and N indicates a dividing number in the variable divider 24 in the PLL 2.

However, generally it is conceivable that a spurious included in an output frequency from the DDS 12 is generated due to mixture of a harmonic frequency $m \cdot f_d$ having an order m in the output frequency $f_d$ from the DDS 12 and a harmonic frequency $n \cdot f_{ck}$ having an order n in the output frequency $f_{ck}$ from the reference clock 11 in the DDS 12. For this reason, assuming that a frequency of the spurious is $f_{dds}$ (Hz), the $f_{dds}$ can be given through the following expression (3):

$$f_{dds} = |m \cdot f_d - n \cdot f_{ck}| = |m \cdot (k \cdot f_{ck}) / 2^L - n \cdot f_{ck}| = |m \cdot k/2^L - n| \cdot f_{ck} \quad (3)$$

and the order of m in this case is called an order m of the spurious.

For this reason, in a synthesizer having the configuration as described above, the frequency $f_{dds}$ of a low order spurious at a high spurious level is present near the output frequency $f_d$ from the DDS 12; namely $f_{dds}$ is approximately equal to $f_d$ ($f_{dds} \approx f_d$), in a case where a frequency of a high spurious is near a frequency of an output carrier wave from the PLL 2, the PLL 2 uses a frequency area near this frequency $f_d$ as a reference frequency and causes multiplication or other phenomenon, so that a spurious in the DDS 12 can not be controlled with a filter nor with the PLL 2 as shown in FIG. 45A or FIG. 45B, and a high spurious at a high level may be outputted, which degrades the communication quality or frequency selectivity due to output of a high spurious.

FIG. 46 shows an example of $SP_{dds}$ to an order m of a harmonic in the output frequency $f_d$ from the DDS 12. In FIG. 46, the horizontal axis indicates the order m of the harmonic with the vertical axis indicating a level $SP_{dds}$ of a spurious included in an output wave from the DDS 12, and from this figure it is understood that in a relatively low order area where such causes as non-linearity of a D-A converter 52 (Refer to FIG. 44 and FIGS. 45A, 45B) constituting the DDS 12 or an excessive response are dominant, the spurious level $SP_{dds}$ is high. So it is also understood that, when a spurious having a lower order m at the high level as described above is generated in an output band from the PLL 2, a spurious at an extremely high level is outputted, which in turn causes degradation of communication quality or frequency selectivity.

For this reason, to prevent a high level spurious from being included in output from the PLL 2, it is necessary to set appropriate setting parameters such as a dividing number setting parameter, a frequency setting parameter or the like for the reference oscillator 1i, PLL 2 or other components according to the output frequency $f_{out}$ to be outputted from the PLL 2.

However, in the conventional type of frequency synthesizer as described above, as shown in FIG. 39, FIG. 42, and FIG. 43, each setting parameter is of a two-resonation type, namely one setting parameter is set for the reference oscillator and the PLL 2 respectively, so that, if one of the setting parameters is decided so that the target output frequency $f_{out}$ will be outputted, the other setting parameter is automatically decided following the setting parameter previously set, and generally in a frequency synthesizer having the configuration as described above, fine adjustment of a frequency is executed in the DDS 12 in the reference oscillator 1i or the like, while rough adjustment for frequency conversion is executed in the PLL 2, and a value of a dividing number setting parameter set in the PLL 2 is much rougher as compared to that of a setting parameter set in the reference oscillator, so that a very long period of time and work load are required to decide two setting parameters so that the PLL 2 will output the required output frequency $f_{out}$ not including a high spurious therein, which is disadvantageous.

SUMMARY OF THE INVENTION

It is an object of the present invention to provide a frequency synthesizer which can prevent degradation of communication quality or frequency selectivity and also can prevent generation of a high spurious without requiring a long period of time or large work load for setting each setting parameter.

*With the frequency synthesizer according to the present invention, in a case where a frequency setting parameter for the DDS is selected so that a high-spurious will not be outputted according to an output frequency from the second frequency synthesizer, both conversion function setting parameters for the frequency converter as well as for the second frequency synthesizer can be adjusted according to the frequency setting parameter, so that a range for selecting a frequency setting parameter is widened when a spurious is to be made lower, which makes it possible to improve a freedom in setting a frequency parameter.

With the frequency synthesizer according to the present invention, when data corresponding to an output frequency to be outputted from the second frequency synthesizer is inputted thereinto, each parameter to be set in the second frequency synthesizer, the frequency converter and the DDS of the first frequency synthesizer can be computed according to the data and set therein, so that parameters according to an output frequency $f_{out}$ can easily be set.

In the present invention, when a frequency setting parameter is computed, a determination is made as to whether the frequency setting parameter outputs a high spurious at a specified level or at a level higher than the specified level from the direct digital synthesizer in an output band from the second frequency synthesizer, and in a case where it is determined that the parameter outputs a high spurious, a conversion function setting parameter and a frequency setting parameter are changed so that a high spurious will not be outputted therefrom and then the changed parameters are set, so that a frequency setting parameter having a high possibility to output a high spurious from the second frequency synthesizer is automatically prevented from being used, and a high spurious appearing in output from the DDS can be taken away from an output band of the second frequency synthesizer, and for this reason a spurious appearing therein can be made lower.

In the present invention, data for the determination as to whether a high spurious appearing in output from the DDS is outputted from the second frequency synthesizer or not is previously stored therein at each frequency setting parameter to be set in the DDS, and in a case where determination is to be made as to whether the frequency setting parameter outputs a high spurious at a specified level or at a level higher than the specified level from the direct digital synthesizer in an output band from the second frequency synthesizer, the determination is made according to the data for determination, so that determination can quickly be executed as compared to a case of determination executed by computation or the like, and for this reason a period of time required for changing each setting parameter can be shortened, and a speed required for switching a frequency can be quickened.

In the present invention, regarding a frequency setting parameter for the DDS as an address, data for determination as to whether a high spurious appearing in output from the DDS is outputted from the second frequency synthesizer or not is previously stored in a data storage area indicated by each address according to each frequency setting parameter, so that determination can be executed more quickly.

In the present invention, regarding a specified upper bit of a frequency setting parameter for the DDS as an address, data for the determination as to whether a high spurious appearing in an output from the DDS is outputted from the second frequency synthesizer or not is previously stored in each data storage area indicated by each address according to a frequency setting parameter having a specified upper bit at each address, so that the memory capacity can be reduced, and a low-cost memory can be used, and for this reason reduction of production cost can be realized.

In the present invention, a range of a frequency setting parameter for the direct digital synthesizer in a case where a high spurious appearing in output from the DDS is outputted from the second frequency synthesizer is previously stored, and determination is made as to whether a high spurious will be outputted from the second frequency synthesizer or not by determining whether the parameter is within the range or not, so that the memory capacity can further, and a low-cost memory can be used, and for this reason further reduction of production cost can be realized.

In the present invention, an order of the spurious in which a high spurious appears in output from the DDS is previously stored, a high spurious frequency included in output frequency from the DDS is obtained according to an order of the spurious and to the frequency setting parameter, and determination is made as to whether a high spurious will be outputted from the second frequency synthesizer or not by determining whether the obtained frequency for a high spurious is outputted from second frequency synthesizer or not, so that the memory capacity can further be reduced, and a low-cost memory can be used, and for this reason further reduction of production cost can be realized.

In the present invention, in a case where a width of change from an output frequency from a DDS is narrow, a range of a frequency setting parameter for the DDS in which a high spurious appears is almost identical to the specified cycle, and at the same time an order of a high spurious at a specified level or at a level higher than the specified level appearing in output from the DDS is limited to a particular number order, a specified cycle in a range of a frequency setting parameter is obtained according to the particular order, and determination is made as to whether a high spurious will be outputted therefrom or not by determining whether the frequency setting parameter is within the range of the frequency setting parameter at each obtained specified cycle or not, so that a memory for storing determination flags and orders of spuriouses in the DDS is not required, and for this reason further reduction of production cost can be realized.

In the present invention, a frequency setting parameter for a DDS is adjusted by an automatic frequency controller (AFC) or the like so that an output frequency from the DDS is swept, and an order of a high spurious appearing in output from the DDS is previously stored therein, whereby a range of an order of a high spurious appearing in output from the direct digital synthesizer is obtained adjustment in a parameter adjuster, the order of the spurious is read out from storage, and the determination is made as to whether a high spurious will be outputted therefrom or not by determining whether the order of the spurious read out as described above is within a range of the order or not, so that, even in a case where the AFC or the like together with the present device can be used for a transmitter/receiver such as a radio communication unit or the like, a high spurious can be prevented.

In the present invention, at least either one of conversion function setting parameter for the second frequency synthesizer and a conversion function setting parameter for a frequency converter is incremented or decremented by a specified rate in a case where each setting parameter is changed so that a high spurious will not be outputted from the second frequency synthesizer, and a frequency setting parameter for the DDS having a large resolution is changed according to the conversion function setting parameters at least either of which is incremented or decremented, so that each parameter can easily be changed to a value of each parameter corresponding to an output frequency to be outputted, and at the same time to a value of each parameter in which a high spurious will not be outputted.

In the present invention, there is previously stored therein an increment or a decrement of at least either one of a conversion function setting parameter for the second frequency synthesizer and a conversion function setting parameter for a frequency converter, said second frequency synthesizer and frequency converter not allowing each frequency setting parameter to output of a spurious at a specified level or at a level high than the specified level within an output band of the second frequency synthesizer from the direct digital synthesizer, in correspondence to a conversion function setting parameter for the second frequency synthesizer, a conversion function setting parameter for the frequency converter, and a frequency setting parameter for the DDS, and in a case where each setting parameter is changed, the increment or the decrement described above corresponding to each setting parameter is read out, at least either one of the conversion function setting parameters is incremented or decremented according to the increment or the decrement, and a frequency setting parameter for the DDS is changed according to the conversion function setting parameters at least either of which is incremented or decremented, so that a parameter can be changed to a frequency setting parameter by means of changing at one time so that a spurious at a specified level or at a level higher than the specified level will not be outputted, and each setting parameter can be changed more speedy.

In the present invention, regarding data corresponding to an output frequency to be outputted from the second frequency synthesizer as an address, a frequency setting parameter for the DDS, a conversion function setting parameter from the frequency converter, and a conversion function setting parameter for the second frequency synthesizer, each not allowing a high spurious appearing in output from the DDS to be outputted from the second frequency synthesizer, and allowing an output frequency corresponding to the data to be outputted from the second frequency synthesizer, are previously obtained and stored in each data storage area indicated by each address, and in a case where data corresponding to an output frequency to be outputted from the second frequency synthesizer is inputted as an address, a frequency setting parameter and a conversion function setting parameter each corresponding to the address are outputted to the DDS, frequency converter, and to the second frequency synthesizer respectively, so that it is not required to compute, determine, and change each setting parameter inside the synthesizer, which makes configuration simple, and also makes it possible to shorten a period of time required for setting parameters. As a result, a speed required for switching a frequency in a frequency synthesizer can increased.

In the present invention, as a frequency converter, a plurality units of variable divider for dividing an output frequency from the DDS are provided inside the first frequency synthesizer, or the variable divider and a frequency mixer are combined and provided therein, so that an output frequency from the DDS can further be converted up to a higher level, so that an input frequency to the second frequency synthesizer such as a PLL or the like can be enhanced without raising a frequency for operating the DDS, and a frequency multiplying number in the second frequency synthesizer can be reduced. In addition, freedom in setting a frequency is further increased because of using a plurality units of variable divider.

Other objects and features of this invention will become understood from the following description with reference to the accompanying drawings.

BRIEF DESCRIPTION OF THE DRAWINGS

FIG. 4 is a view showing contents of the determination flag table T stored in the memory 32 according to Embodiment 2;

FIG. 9 is a view showing contents of the memory 32 according to Embodiment 3;

FIG. 11 is a view showing contents stored in the memory 32 according to Embodiment 4;

FIG. 13 is a view showing contents stored in the memory 32 according to Embodiment 5;

FIG. 16 is a view showing contents stored in the memory 32 according to Embodiment 6;

FIG. 19A is a view showing how a particular frequency setting parameter ks appears in the frequency setting parameter k;

FIG. 19B is a view showing how a particular frequency setting parameter ks appears in the frequency setting parameter k;

FIG. 23 is a view showing contents stored in the memory 32 according to Embodiment 8;

FIG. 26 is a view showing contents stored in the memory 32 according to Embodiment 9;

FIG. 29 is a view showing contents of the memory 7 according to Embodiment 10;

DESCRIPTION OF THE PREFERRED EMBODIMENTS

Description is made hereinafter of a frequency synthesizer according to Embodiment 1 of the present invention with reference to the related drawings.

Figure 1:
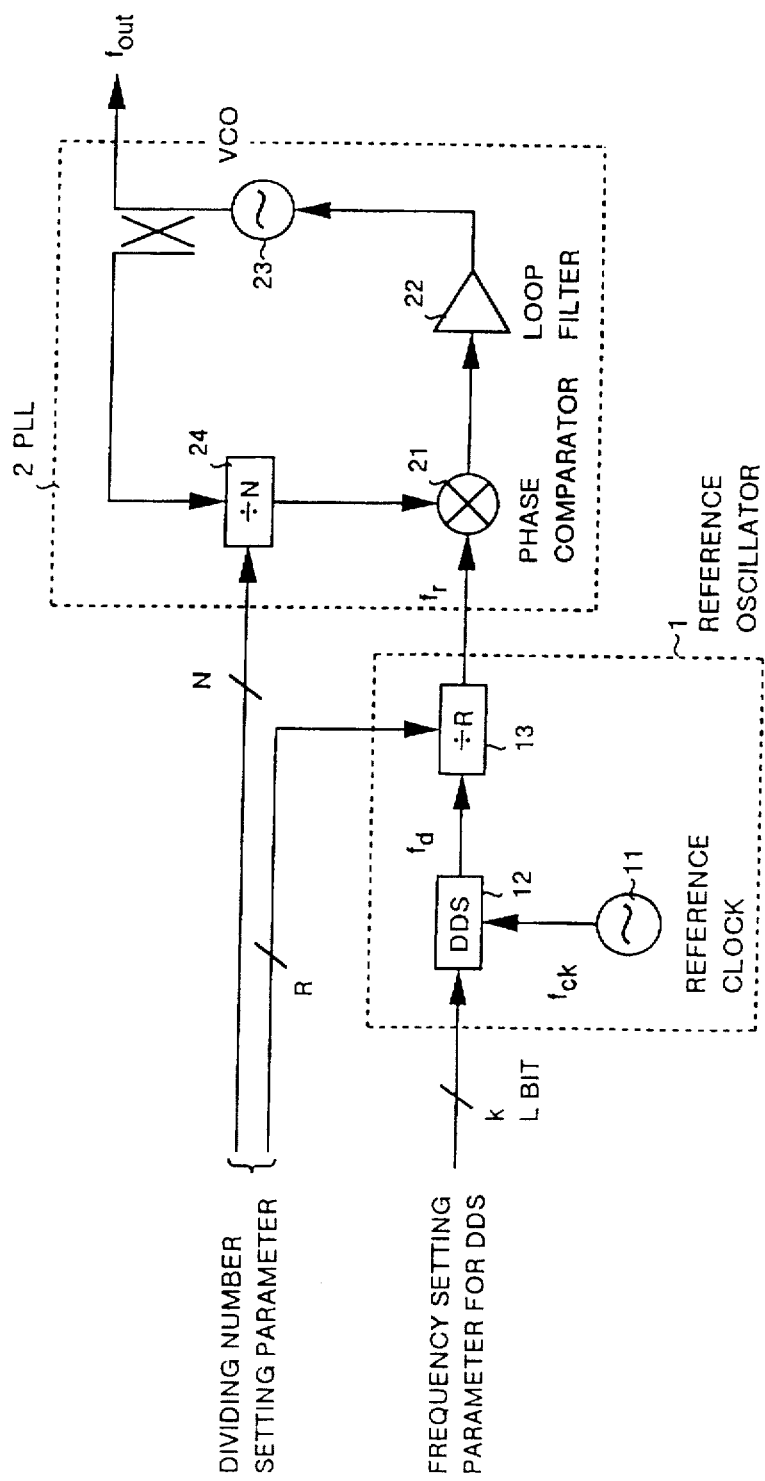
FIG. 1 is a block diagram showing the configuration of Embodiment 1 of the present invention.
Figure 42:
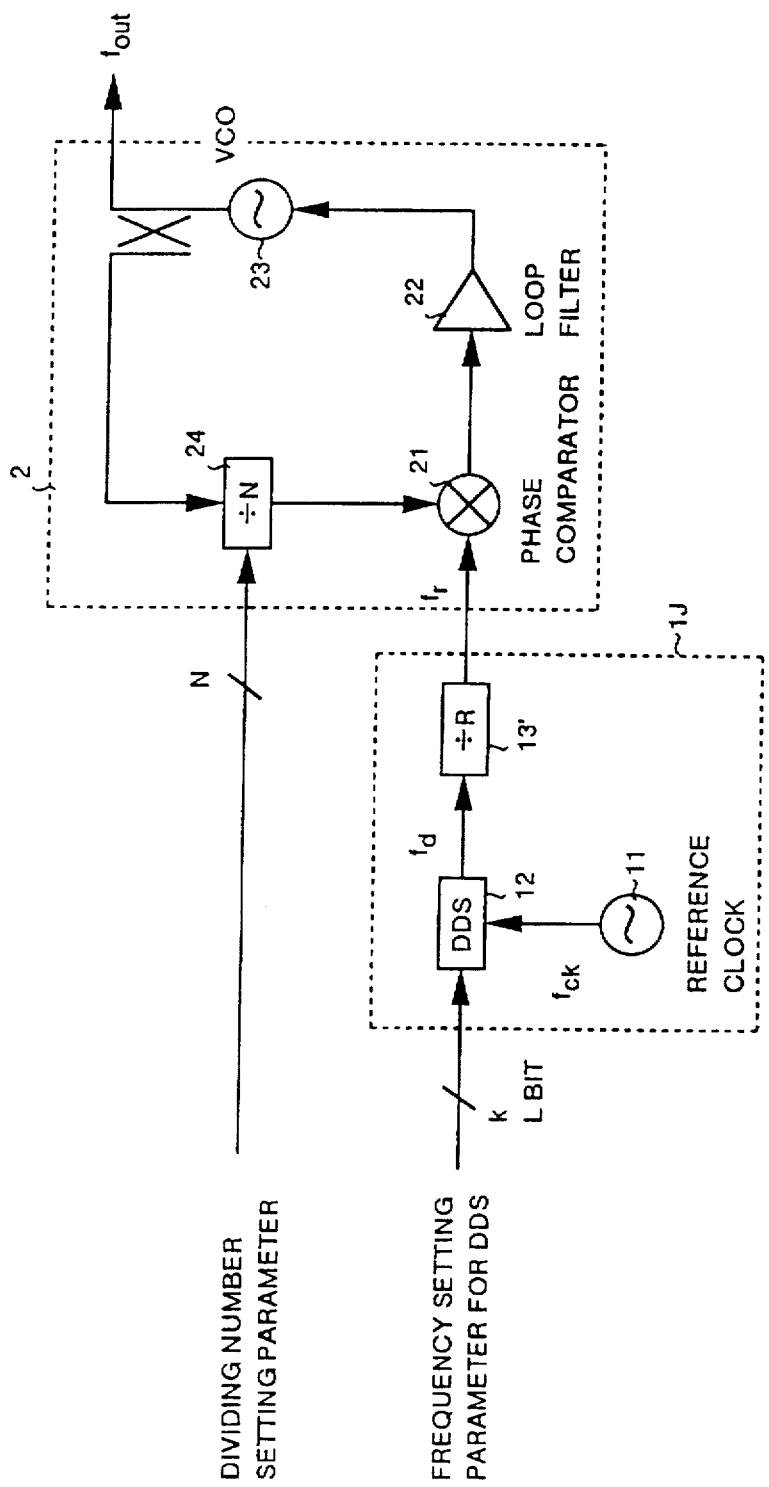
FIG. 42 is another type of block diagram showing configuration of the frequency synthesizer based on conventional technology.
Figure 43:
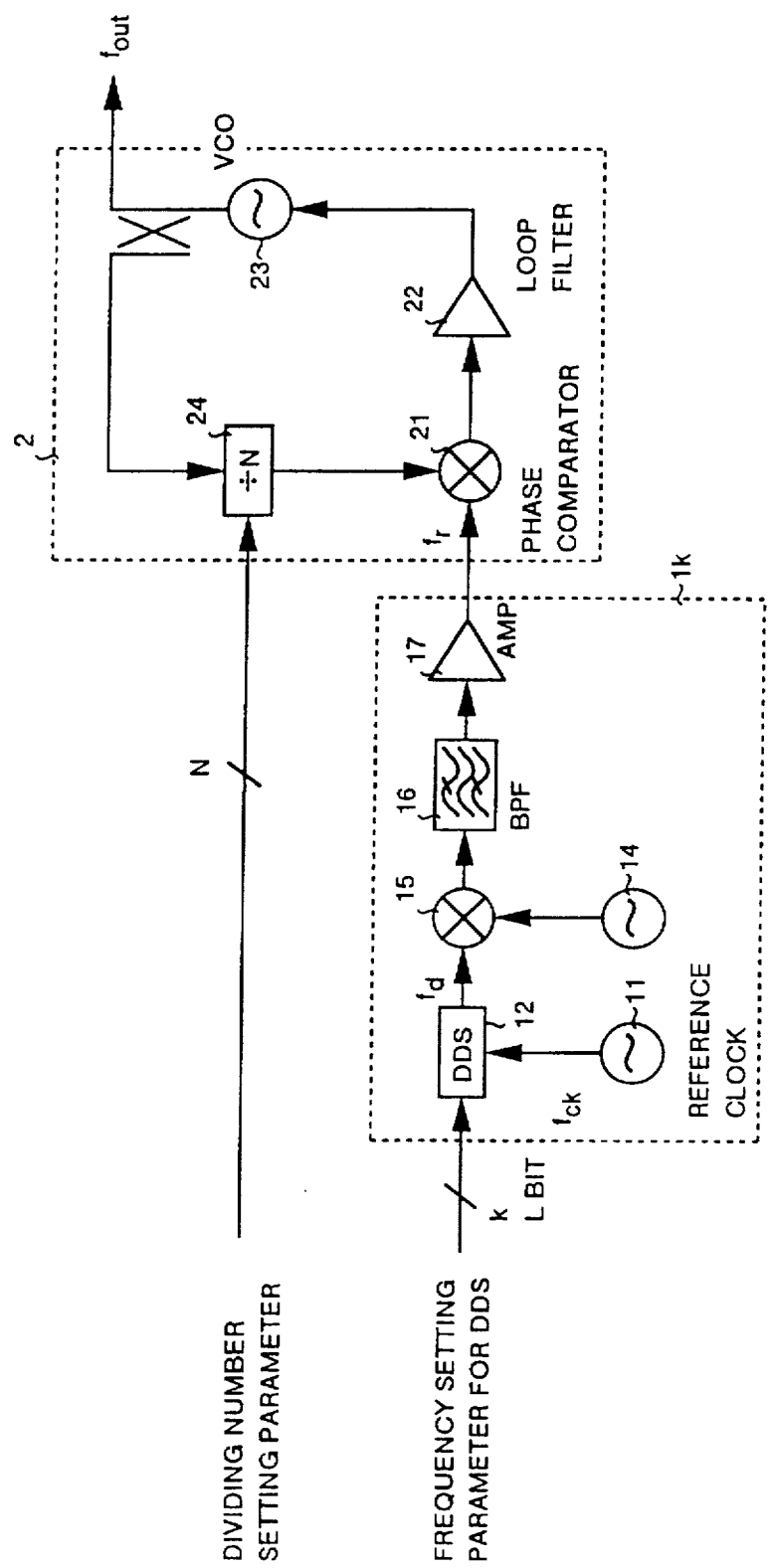
FIG. 43 is another type of block diagram showing configuration of the frequency synthesizer based on conventional technology.

FIG. 1 shows configuration of the frequency synthesizer according to Embodiment 1 of the present invention. It should be noted that, in FIG. 1, the same reference numerals are assigned to the sections corresponding to those based on the conventional technology shown in FIG. 42.

In FIG. 1, the frequency synthesizer according to Embodiment 1 includes a reference oscillator 1 as a first frequency synthesizer and a PLL 2 as a second frequency synthesizer, and the reference oscillator 1 includes a reference clock 11 for outputting a clock signal with a frequency $f_{ck}$, a DDS 12 synchronizing to the clock signal and outputting a frequency $f_d$ based on the frequency setting parameter k, and a variable divider 13 for dividing an output frequency $f_d$ from the DDS 12 by a conversion function setting parameter (described as a dividing number setting parameter hereinafter) R which is a dividing number, while the PLL 2 includes a phase comparator 21, a loop filter 22, a voltage control oscillator (VCO) 23, and a variable divider 24 for dividing an output frequency $f_{out}$ from the voltage control oscillator (VCO) 23 by a dividing number setting parameter N.

In the frequency synthesizer according to Embodiment 1 described above, the frequency setting parameter k for the DDS 12 in the reference oscillator 1 can be set according to setting from outside, and a dividing number setting parameter N for the variable divider 24 in the PLL 2 can also be set alike, and in addition a dividing number setting parameter R for the variable divider 13 in the reference oscillator 1 can also be set similarly, so that the frequency synthesizer according to Embodiment 1 is of a three-resonanation type in which three setting parameters can be set according to an output frequency $f_{out}$ from the PLL 2. It should be noted that, in FIG. 1, L indicates a bit number of the frequency setting parameter k for the DDS 12, and $f_r$ indicates an output frequency from the variable divider 13, which is an input frequency for the PLL 2.

Herein, the output frequency $f_d$ from the DDS 12 is expressed as shown in the expression (1), so that an output frequency $f_{out}$ from the frequency synthesizer according to Embodiment 1 shown in FIG. 1 is given by the following expression (4).

$$f_{out}=f_d \cdot N/R=N \cdot k \cdot f_{ck}/(R \cdot 2^L) \tag{4}$$

Namely, it is shown that the output frequency $f_{out}$ from the frequency synthesizer is decided, as shown in the expression (4), according to values of three setting parameters k, R, N. It should be noted that the parameters k, R, and N can not be decided all at once because each of the parameters has a freedom in setting respectively.

Next description is made for operation of the frequency synthesizer according to Embodiment 1, and when a setting parameter is to be set in the reference oscillator 1 and in the PLL 2 according to the output frequency $f_{out}$ to be outputted from the PLL 2, the frequency setting parameter k is appropriately selected so that the DDS 12 will not output a high spurious at a specified level or at a level higher than the specified level within an output band of the PLL 2 according to the output frequency $f_{out}$ from the PLL 2, however, as three parameters of the frequency setting parameter k for the DDS 12, dividing number setting parameter N for the variable divider 24, and dividing number setting parameter R for the variable divider 13 are possible to be set, both of the dividing number setting parameter N and dividing number setting parameter R are adjusted so that the output frequency $f_{out}$ to be outputted from the PLL 2 and the selected frequency setting parameter k can satisfy the expression (4).

Accordingly, with the frequency synthesizer according to Embodiment 1, in a case where the frequency setting parameter k is to be selected so that the DDS 12 will not output a high spurious within an output band of the PLL 2 according to the output frequency $f_{out}$ from the PLL 2, both a dividing number setting parameter N and a dividing number setting parameter R can be adjusted, so that a range for selection of the frequency setting parameter k for achieving a low spurious is made wider, and although a number of units of variable divider are increased, a range of dividing numbers R, N as dividing number setting parameters for variable dividers 13, 24 is not required so wide respectively, and for this reason, it is possible to select any of low-cost components, which makes it possible to improve a freedom of setting a frequency setting parameter with low cost as a whole.

It should be noted that, although the above description of Embodiment 1 assumes a case where a variable divider 13 which can set a dividing number setting parameter R according to the output frequency $f_{out}$ from PLL 2 is provided in the reference oscillator 1, but in the present invention, two units or more variable dividers described above may be provided in the reference oscillator 1, and one unit or a plurality of units thereof may be provided in the PLL 2, or one unit or a plurality of units thereof may be provided in somewhere outside the reference oscillator 1 and PLL 2, and it is important that a number of setting parameters in the frequency synthesizer each of which can be set according to an output frequency $f_{out}$ may be three units or more.

In the frequency synthesizer according to Embodiment 2 of the present invention, optimal setting parameters k, R, and N each inhibiting output of a high spurious in Embodiment 1 can easily and automatically be set.

Figure 2:
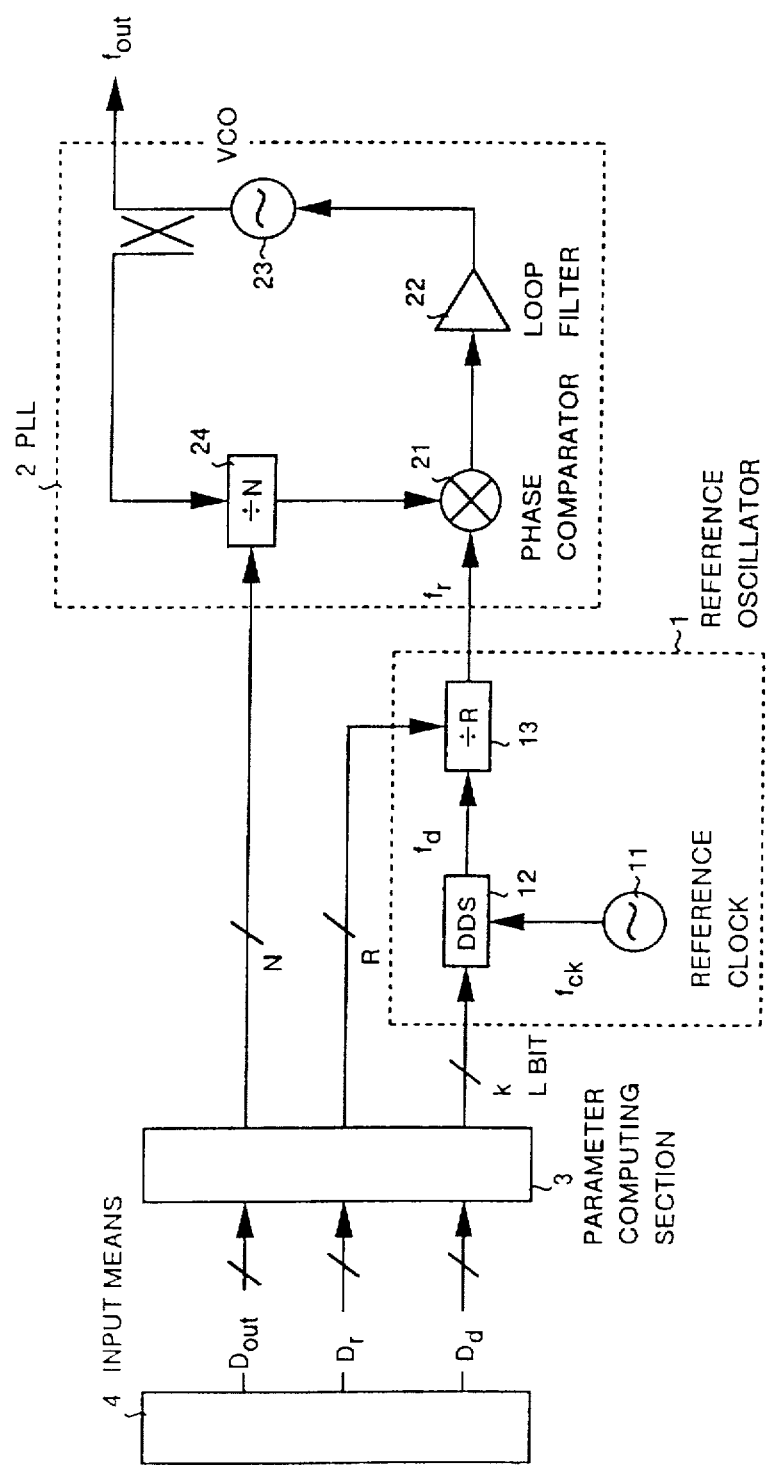
FIG. 2 is a block diagram showing the configuration of Embodiment 2.

FIG. 2 shows the configuration of the frequency synthesizer according to Embodiment 2. It should be noted that, in FIG. 2, the same reference numbers are assigned to the sections corresponding to those in Embodiment 1 shown in FIG. 1.

In FIG. 2, the frequency synthesizer according to Embodiment 2 includes the reference oscillator 1 including the reference clock 11, DDS 12, and variable divider 13; and the PLL 2 comprising the phase comparator 21, loop filter 22, voltage control oscillator (VCO) 23, and variable divider 24, and also includes a parameter computing section 3 and an input device 4.

The input device 4 includes a switch, a ten-key, and a key board or the like, and is constructed herein so that data for output frequencies $D_{out}$, $D_r$, $D_d$ corresponding to an output frequency $f_{out}$ from the PLL 2 to the parameter computing section 3, an output frequency $f_r$ from the variable divider 13, and an output frequency $f_d$ from the DDS 12 respectively are received thereby.

As for the parameter computing section 3, description is made for the function thereof although the configuration thereof is described in FIG. 2, and when each output frequency data $D_{out}$, $D_r$, $D_d$ are received thereby from the input device 4, a dividing number setting parameter N as a dividing number N of the variable divider 24, a dividing number setting parameter R as a dividing number R of the variable divider 13, and the frequency setting parameter k of the DDS 12 are computed so that a spurious at a specified level or at a level higher than the specified level appearing in output from the DDS 12 will not be outputted, but an output frequency $f_{out}$ corresponding to the received $D_{out}$ will be outputted from the PLL 2, and the computed setting parameters k, R, and N are set in the variable divider 24, the variable divider 13, and the DDS 12 respectively. It should be noted that, in FIG. 1, $f_{ck}$ indicates an output frequency from the reference clock 11, $f_r$ indicates an output frequency from the variable divider 13 and also an input frequency to the PLL 2, and L indicates a bit number of the frequency setting parameter k for the DDS 12.

Figure 3:
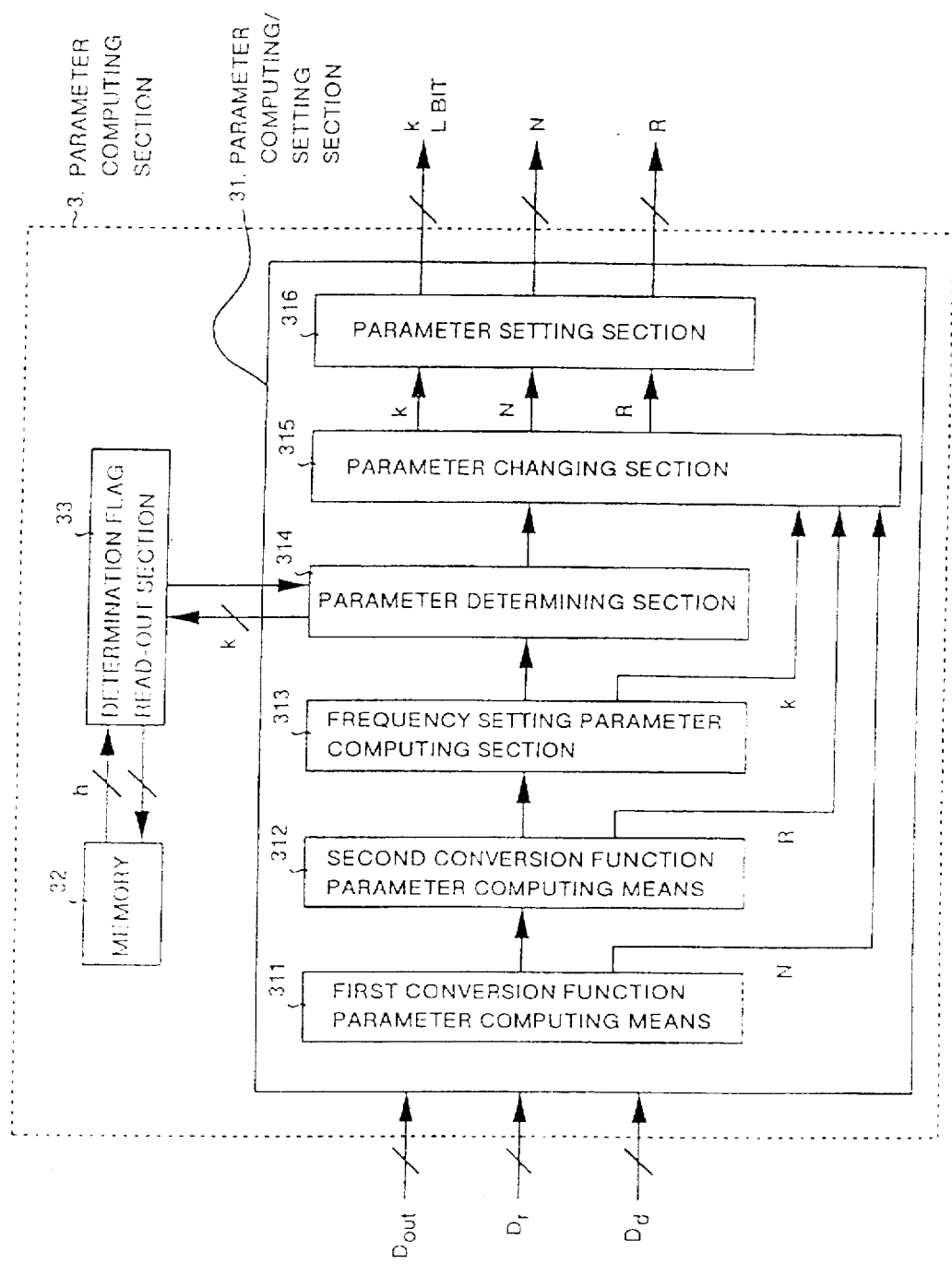
FIG. 3 is a block diagram showing the configuration of the parameter computing section 3 according to Embodiment 2.

FIG. 3 shows the configuration of the parameter computing section 3 according to Embodiment 2. In the figure, reference numeral 311 is a first conversion function setting parameter computing section, 312 a second conversion function setting parameter computing section, 313 a frequency setting parameter computing section, 314 a parameter determining section, 315 a parameter changing section, 316 a parameter setting section, and 31 a parameter computing/setting section including the sections 311 to 316. Also, reference numeral 32 indicates a memory in which a determination flag table T described later is stored, and reference numeral 33 indicates a determination flag read-out section for reading out a flag for determination corresponding to the specified frequency setting parameter k from the determination flag table T stored in the memory 32.

FIG. 4 shows the contents of the determination flag table T stored in the memory 32. In the figure, previously stored in the determination flag table T is a flag h for determination indicating with 0 or 1, whether each frequency setting parameter k is a particular frequency setting parameter ks with a spurious at a high level or not, for each frequency setting parameter k in a range from 0 to $2^L-1$ for the DDS 12. It should be noted that L indicates a bit number of a frequency setting parameter outputted to the DDS 12.

Herein, it is assumed that the flag h for determination takes the values each in the following expression (5):

$$h=1(k\neq ks)h=0(k=ks) \qquad (5)$$

It is assumed herein that there are p pieces of the values of s varying in a range from 1 up to p in the particular frequency setting parameter ks with a spurious at a high level.

Next description is made for operation of the frequency synthesizer according to Embodiment 2 having the configuration described above with reference to the related drawings.

Figure 5:
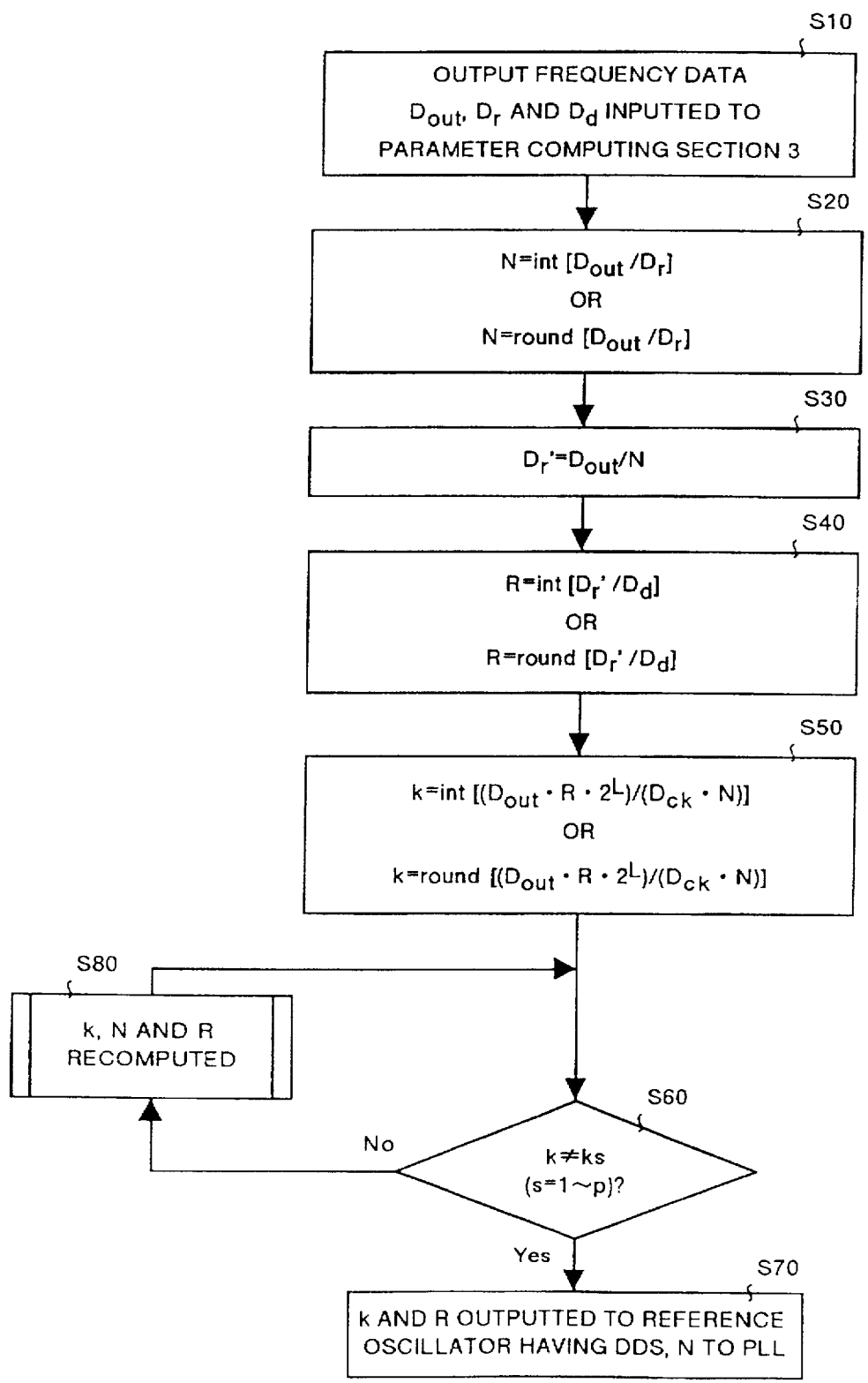
FIG. 5 is a flow chart showing operations of the frequency synthesizer according to Embodiment 2.

FIG. 5 shows operation of the frequency synthesizer according to Embodiment 2.

At first, in the frequency synthesizer according to Embodiment 2, the input device 4 inputs data $D_{out}$ corresponding to an output frequency $f_{out}$ to be outputted from the PLL 2, given data $D_r$ corresponding to an output frequency $f_r$ from the variable divider 13, and given data $D_d$ corresponding to an output frequency $f_d$ from the DDS 12 to the parameter computing/setting section 31 respectively (step S10).

Then, in the parameter computing/setting section 31, the data $D_{out}$, $D_r$, and $D_d$ each inputted thereto by the input device 4 are received by the first conversion function setting parameter computing section 311, second conversion function setting parameter computing section 312, and by the frequency setting parameter computing section 313, and a dividing number N of the variable divider 24 in the PLL 2, a dividing number R of the variable divider 13 and a setting frequency k for the DDS 12 each in the reference oscillator 1, are computed backward from the variable divider 24 so that an output frequency $f_{out}$ can be outputted in this order, namely the frequency $f_{out}$ corresponding to the data $D_{out}$ can be outputted from the PLL 2 (steps S20 to S50).

To be more specific, at first the first conversion function setting parameter computing section 311 computes a dividing number setting parameter N for setting a dividing number N of the variable divider 24 through, for instance, the following expression (6) (step S20).

$$N=\text{int}[D_{out}/D_r], \text{ or } N=\text{round}[D_{out}/D_r] \qquad (6)$$

Herein, round [ ] indicates a function for rounding off a value of the decimal fraction in [ ], and int [ ] indicates a function for discarding a value of the decimal fraction in [ ]. The functions described above are used because each of the setting parameters k, R, and N can take only an integer value in the frequency synthesizer according to Embodiment 2, and it is needless to say that other functions may be substituted for the functions described above, or if each of the setting parameters k, R, and N can take values other than an integer value, a function taking a value other than an integer value may be used.

Then the second conversion function setting parameter computing section 312 computes a $D_r'$ corresponding to an output frequency to be outputted from the variable divider 13 through the following expression (7) in a case of an output frequency $f_{out}$ corresponding to data $D_{out}$ and of a dividing number N by using the dividing number N and the received data $D_r$ (step S30).

$$D_r'=D_{out}/N \qquad (7)$$

Herein, the dividing number setting parameter R to be set in the variable divider 13 also takes an integer value, so that the second conversion function setting parameter computing section 312 will compute the dividing number setting parameter R for the variable divider 13 from the $D_r'$ and $D_d$ with the following expression (8) (step S40).

$$R = \text{int}[D_r'/D_d], \text{ or } R = \text{round}[D_r'/D_d] \quad (8)$$

Then lastly, the frequency setting parameter computing section 313 computes the frequency setting parameter k to be set in the DDS 12, but this k also takes an integer value, so that the frequency setting parameter k for the DDS 12 is computed from $D_{out}$, R, and N through the following expression (9) based on the expression (4), and the computed parameter is outputted to the parameter determining section 314 (step S50).

$$k = \text{int}[(D_{out} \cdot R \cdot 2^L)/(D_{ck} \cdot N)], \text{ or}$$

$$k = \text{round}[(D_{out} \cdot R \cdot 2^L)/(D_{ck} \cdot N)] \quad (9)$$

Herein, L indicates a bit number of the frequency setting parameter k to be set in the DDS 12, and $D_{ck}$ indicates data corresponding to a clock frequency $f_{ck}$ in the DDS 12. It should be noted that L and $D_{ck}$ may previously be stored in the parameter computing section 3 as data, or may be inputted thereinto from outside.

The parameter determining section 314 sends the frequency setting parameter k, when having received the frequency setting parameter k from the frequency setting parameter computing section 313, to the determination flag read-out section 33, makes the determination flag read-out section 33 read out a determination flag h corresponding to the frequency setting parameter k from the determination flag table T in the memory 32 shown in FIG. 3, and makes a determination as to whether the -frequency setting parameter k is the particular frequency setting parameter ks with a high spurious or not, namely as to whether k is not equal to ks (k≠ks) or not, according to the determination flag h (step S60).

As a result, in a case where the read-out determination flag h is 1, and it is determined that k≠ ks, namely the frequency setting parameter k does not correspond to the particular frequency setting parameter ks with a high spurious (step S60 "YES"), the parameter determining section 314 outputs the result of determination to the parameter changing section 315. Then the parameter changing section 315 sends each of the setting parameters k, R, and N obtained by computation to the parameter setting section 316 without any change thereof, and the parameter setting section 316 outputs the computed setting parameters k, R, and N to the DDS 12, variable divider 13, and to the variable divider 24 as they are respectively for setting (step S70).

In contrast, in a case where the read-out determination flag h is 0, and it is determined that k=ks, namely the frequency setting parameter k is the particular frequency setting parameter ks with a high spurious (step S60 "NO"), and the parameter determining section 314 outputs the result of determination to the parameter changing section 315. Then the parameter changing section 315 repeats the processing for changing the setting parameters k, R, and N each described in detail in FIG. 6 (step S80) until k becomes not equal to ks (step S60 "YES"), and when k has become not equal to ks (step S60 "YES"), the parameter changing section 315 sends the setting parameters k, R, and N to the parameter setting section 316, and the parameter setting section 316 outputs the setting parameters k, R, and N to the DDS 12, variable divider 13, and to the variable divider 24 respectively for setting (step S70).

Next detailed description is made for the processing for changing each of the setting parameters k, R, and N in the parameter changing section 315 shown in Step S80 in FIG. 5.

Figure 6:
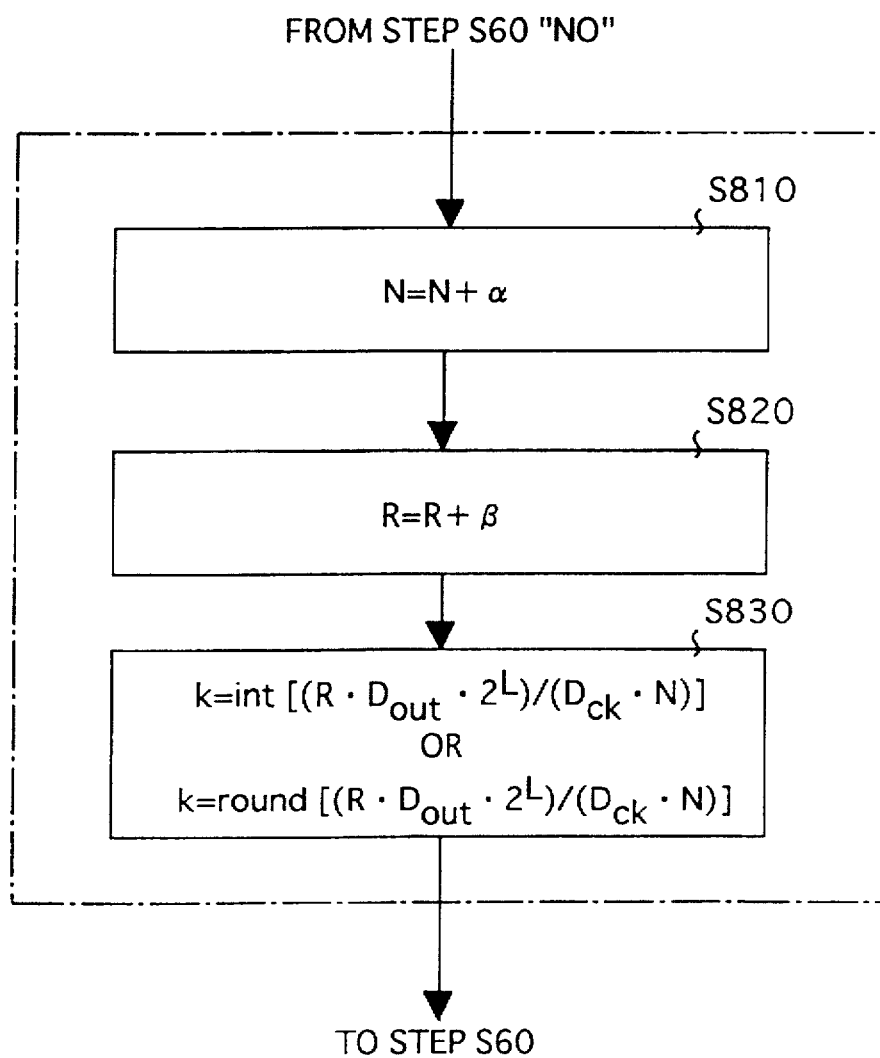
FIG. 6 is a flow chart showing changing processing of setting parameters k, R, and N shown in step S80 in FIG. 5.

FIG. 6 shows a sequence of the processing for changing the setting parameters k, R, and N shown in Step S80 in FIG. 5.

In the changing processing, the parameter changing section 315, at first, corrects R and N, among the setting parameters k, R, and N computed with the data $D_{out}$ corresponding to an output frequency to be outputted from the PLL 2 received in the processing in the step 10 and by the processing in the steps 20 to 50, according to the following expression (10) (steps S810, S820).

$$N = N + \alpha$$

$$R = R + \beta \quad (10)$$

Herein, α indicates an increment of N, β indicates an increment of R, and the α and β are previously stored in the parameter computing section 3. It should be noted that, in Embodiment 2, both R and N are changed, but only N or only R may be changed by incrementing or decrementing either one of them.

The R and N each changed as described above are substituted into the expression (9) for computing a new setting parameter k (step S830).

After the setting parameters k, R, and N are re-computed and each of the values is changed, system control returns to the processing in Step S60 shown in FIG. 5, and determination as to the setting parameter k is executed again, the processing for re-computing each of the setting parameters k, R, and N is repeatedly computed until k becomes not equal to ks while the parameters N and R are incremented by α and β, respectively.

Accordingly, in the frequency synthesizer according to Embodiment 2, when data $D_{out}$ or the like corresponding to an output frequency $f_{out}$ to be outputted from the PLL 2 by the input means 4 is inputted to the parameter computing section 3, the parameter computing section 3 automatically computes the parameters k, R, and N and sets the computed parameters in the variable dividers 24, 13, and in the DDS 12 respectively, so that each of setting parameters k, R, and N corresponding to an output frequency $f_{out}$ to be outputted from the PLL 2 can easily be set.

In the frequency synthesizer according to Embodiment 2, when the setting parameters k, R, and N are computed, a value for the setting parameter k is compared to the previously-stored value ks for a spurious at a high level, the setting parameters k, R, and N are repeatedly computed until k becomes not equal to ks, and the setting parameters k, R, and N satisfying the condition of k≠ks are outputted, so that ks for a spurious at a high level is automatically avoided from its use, and for this reason, a high-spurious appearing in an output from the DDS 12 can be kept away from the output band of the PLL 2. For this reason, a high spurious will not be outputted from the PLL 2, so that a spurious therein can be made lower.

Furthermore, in the frequency synthesizer according to Embodiment 2, a result of determination as to whether the setting parameter k is ks for a spurious at a high level or not is previously stored in the memory 32, so that, as compared to a case where determination is made by computing as to whether the setting parameter k is ks or not, a period of time required for determination concerning k, namely a period of time required for changing each of the setting parameters can be shortened, and a speed required for switching a frequency can be improved.

It should be noted that, in the frequency synthesizer according to Embodiment 2 described above, there is described a case where the input device 4 receives the three types of data for output frequencies $D_{out}$, $D_r$, and $D_d$, but in the present invention, it is sufficient for the input device 4 to receive at least data $D_{out}$ for an output frequency indicating an output frequency $f_{out}$ to be outputted from the PLL 2, so that it is not necessarily required to receive other data $D_r$ and $D_d$ for output frequencies thereby. Namely, the data $D_{out}$ corresponding to an output frequency $f_{out}$ to be outputted from the PLL 2 is required to be received from outside and to be instructed, but values of $D_r$ and $D_d$ may be given values, so that the parameter computing/setting section 31 may set therein fixed values or the like as default values or may store them therein.

In the frequency synthesizer according to Embodiment 2, there is described a case where a result of the determination as to whether the setting parameter k is ks for a high-level spurious or not is previously stored in the memory 32 as a determination flag table T, but in the present invention, the determination may be made by computing or the like as to whether the frequency setting parameter k is for outputting a spurious at a specified level or at a level higher than the specified level from the DDS 12 within an output band of the PLL 2 or not, without providing therein the memory 32 described above in which the determination flag table T is stored.

In the frequency synthesizer according to Embodiment 2, there is described a case where a variable divider 13 is provided in the reference oscillator 1, but even if a plurality of variable dividers 13 are provided inside or outside of the reference oscillator 1, Embodiment 2 can be applicable to the case described above.

Figure 7:
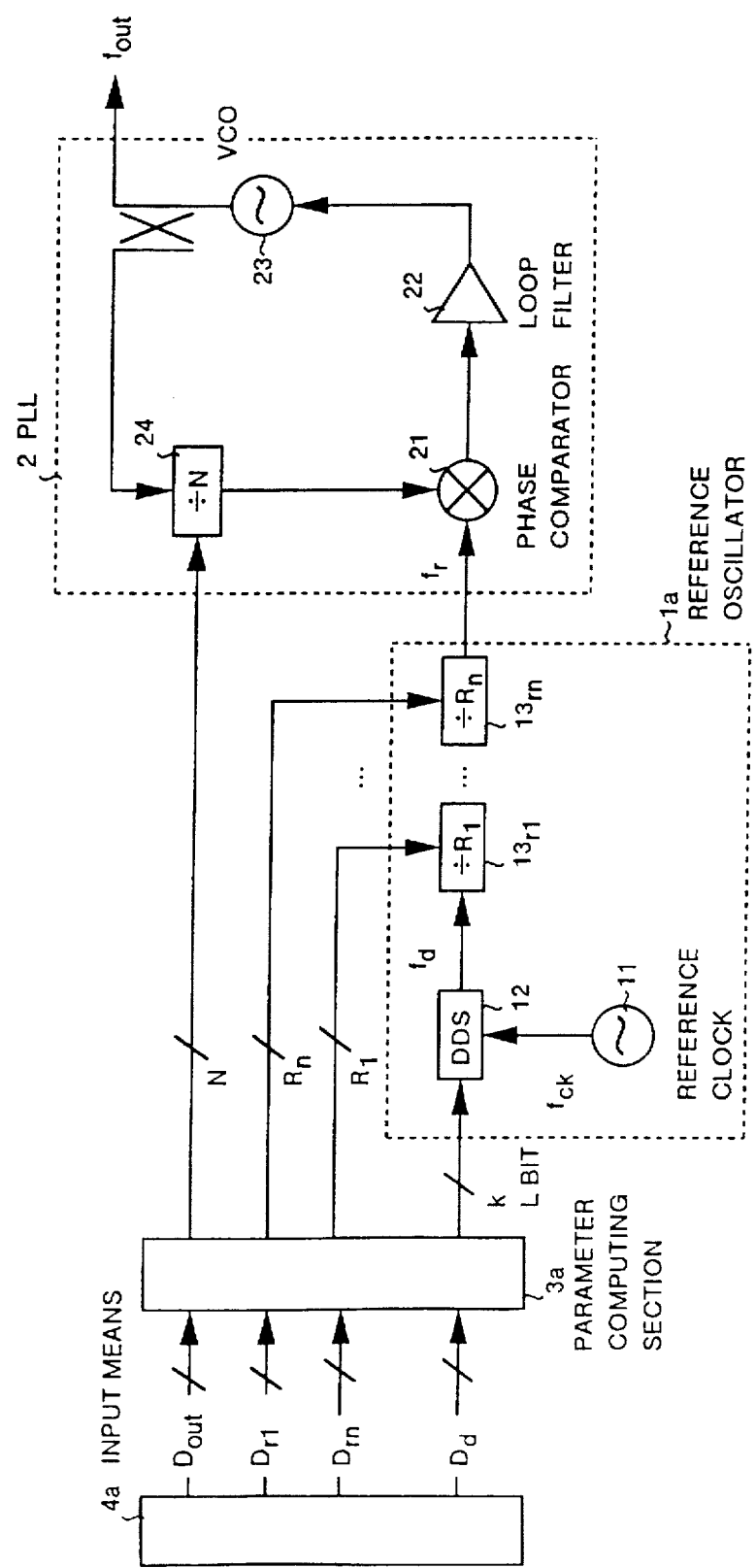
FIG. 7 is a block diagram showing the configuration of Embodiment 2 in which the present invention is applied to a frequency synthesizer having a plurality of variable divides provided inside the reference oscillator.

FIG. 7 shows the configuration of the frequency synthesizer according to Embodiment 2 applied to the frequency synthesizer with a plurality of variable dividers provided in the reference oscillator. In the frequency synthesizer shown in the figure, a reference oscillator 1a has N variable dividers $13_{r1}$ to $13_{rn}$, and an input device 4a inputs data $D_{r1}$ to $D_{rn}$ corresponding to output frequencies of the variable dividers $13_{r1}$ to $13_{rn}$ respectively other than the data $D_{out}$ and $D_d$ to a parameter computing section 3a.

For this reason, the parameter computing section 3a, when having received data $D_{r1}$ to $D_{rn}$ corresponding to output frequencies for variable dividers $13_{r1}$ to $13_{rn}$ respectively together with data $D_{out}$ and $D_d$ from the input device 4a, computes dividing number setting parameters for the variable divider 24 in the PLL 2 and then for a variable divider $13_{rn}$, a variable divider $13_{rn-1}$, ..., a variable divider $13_{r2}$ in this order, and a variable divider $13_{r1}$, and lastly computes a frequency setting parameter for the DDS 12. With this configuration, it becomes possible to output setting parameters to the variable divider 24 in the PLL 2, or to the plurality units of variable dividers $13_{r1}$ to $13_{rn}$ each in the reference oscillator 1a, and to the DDS 12 respectively like in a case of the configuration shown in FIG. 1 described above.

Furthermore, in the frequency synthesizer according to Embodiment 2, there is not specifically described the configuration of the parameter computing/setting section 31 including the first conversion function setting parameter computing section 311 having the parameter computing section 3, second conversion function setting parameter computing section 312, frequency setting parameter computing section 313, parameter determining section 314, parameter changing section 315, and parameter setting section 316, and nor configuration of the determination flag read-out section 33, but the configuration thereof may be realized with hardware based on either a logic circuit, or with processing based on software according to a DSP or a CPU or the like on the condition that the function described above can be realized.

In the frequency synthesizer according to Embodiment 3 of the present invention, like in Embodiment 2, the setting parameters k, R, and N are re-computed or changed so that a particular frequency parameter ks for a spurious at a high level can be prevented, but configuration of the parameter computing section herein is different from that of Embodiment 2, so that the configuration of the determination flag read-out section 33 in the parameter computing section 3 is not required herein because a method of storing a determination flag h in the memory is different.

For this reason, the frequency synthesizer according to Embodiment 3 has the same configuration and the same method as those in Embodiment 2 except the configuration of the parameter computing section and the storing method of a determination flag h in the memory, so that description is made herein for the frequency synthesizer according to Embodiment 3 with reference to the view of configuration and flow chart in Embodiment 2.

Figure 8:
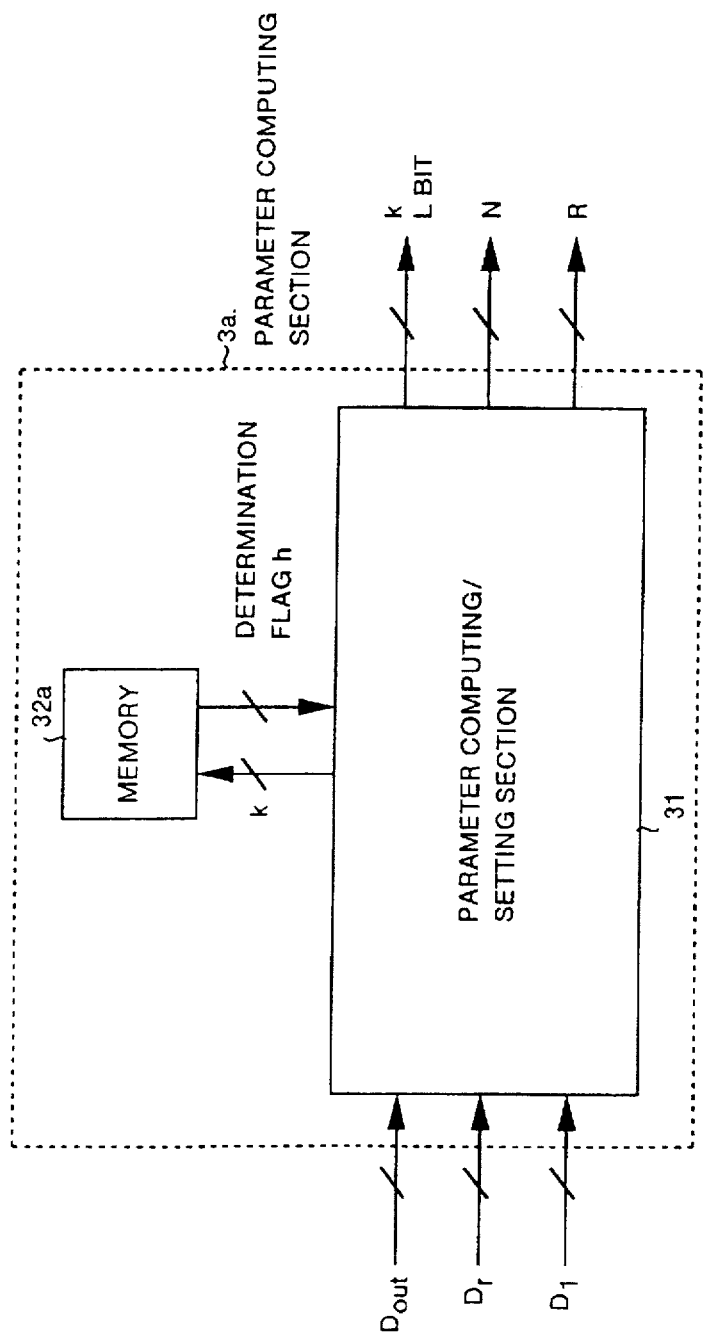
FIG. 8 is a view showing configuration of the parameter computing section 3 according to Embodiment 3.

FIG. 8 shows configuration of the parameter computing section 3a according to Embodiment 3. In the figure, reference numeral 31 is the parameter computing/setting section like in Embodiment 2, at 32a a memory in which a determination flag h is stored by a method shown in FIG. 9.

FIG. 9 shows the contents stored in the memory 32a according to Embodiment 3. As shown in the figure, regarding the frequency setting parameter k having an L-bit length in the DDS 12 as an address, a determination flag h, for determining as to whether an output from the DDS 12 according to the frequency setting parameter k as each address in each data storage area indicated by each address includes a high-spurious or not, is previously stored in the memory 32a.

More specifically, the frequency parameter k for the DDS 12 is indicated as 00000, 00001, ..., 01010, ..., $2^L-1$, as a 5-bit address in the memory 32a, and a determination flag h indicated with 0 or 1 is stored in the storage area indicated by the address. It should be noted that L indicates a bit number in the frequency setting parameter k to be outputted to the DDS 12.

Next description is made for operation of the frequency synthesizer according to Embodiment 3.

In Embodiment 3, when the input device 4 inputs data $D_{out}$ corresponding to an output frequency $f_{out}$ to be outputted from the PLL 2 to the parameter computing/setting section like in Embodiment 2, the parameter computing/setting section 31 computes each of setting parameters k, R, and N through the processing steps from Steps S10 to S50 shown in FIG. 5, and the computed setting parameter k is outputted to make a determination in Step S60 as to whether the computed setting parameter k is the particular frequency setting parameter ks for a spurious at a high level or not.

Then, in Embodiment 3, the setting parameter k is inputted to the memory 32a as an address, so that the memory 32a outputs a determination flag h corresponding to the setting parameter k stored in the address to the parameter computing/setting section 31, and the parameter computing/setting section 31 makes a determination thereof according to the determination flag h like in Embodiment 2.

More specifically, in a case where the frequency setting parameter k for the DDS 12 obtained by computation is, for instance, is 01011 (k=01011), access is made to the address No. 01011 of the memory 32a, so that a determination flag h indicated by 0 stored in the address No. 01011 is read out as shown in FIG. 9.

For this reason, this case indicates the fact that the setting parameter k obtained by the determination flag h indicated by 0 is the particular frequency setting parameter ks for a spurious at a high level, so that it is determined in Step S60 shown in FIG. 5 as NO, then system control shifts to processing in Step S80, processing for Step S80 shown in FIG. 6 is executed, and each of the setting parameters k, R, and N is computed again therein.

Accordingly, in the frequency synthesizer according to Embodiment 3, when an output frequency $f_{out}$ is received from outside by the parameter computing section 3a like in Embodiment 2, the parameter computing section 3a automatically computes parameters k, R, and N and sets the computed parameters in the DDS 12, and variable dividers 24, 13 respectively, so that a long period of time for setting parameters k, R, and N is not required, and determination is also made as to whether the setting parameter k is identical to the particular frequency setting parameter ks with a spurious at a high level or not when each of the setting parameters k, R, and N is obtained, so that output of the particular frequency setting parameter ks can be prevented before its output, and for this reason a spurious in a frequency synthesizer can be made lower.

In the frequency synthesizer according to Embodiment 3, regarding the frequency setting parameter k for the DDS 12 as an address, a determination flag h for determining as to whether each of frequency setting parameter k is the particular frequency setting parameter ks or not is stored in each data storage area indicated by each address, so that, when each of setting parameters k, R, and N is computed, the determination flag h can be read out with the setting parameter k as an address, and as compared to the case of Embodiment 2, configuration of the determination flag readout section 33 is not required to be provided therein, so that the configuration becomes simple, and a period of time required for making determination of the setting parameter k can be reduced. As a result, with Embodiment 3, a period of time required for changing each of setting parameters can be shortened as compared to the case in Embodiment 2, and a speed required for switching a frequency of a frequency synthesizer can be quickened.

It should be noted that, in the frequency synthesizer according to Embodiment 3, there is described a case where all flags h for determination from 0 to $2^L-1$ of the frequency setting parameter k are registered in the memory 32a, but in the preset invention, for instance, only a range in which the frequency setting parameter k is actually used may be registered. With this feature, increase of the capacity required for the memory 32a can be prevented.

In the frequency synthesizer according to Embodiment 3, there is not specifically described the configuration of the parameter computing/setting section 31, but the configuration thereof may be achieved either with hardware based on a logic circuit, or with processing based on software according to a DSP or a CPU like in a case of Embodiment 2, so that either one may be employed so long as the function can be achieved as described above. What was described above is also applicable to the embodiment described below.

A frequency synthesizer according to Embodiment 4 is an improved one so that a capacity of the memory 32a in Embodiment 3 will not be increased. Namely, in a case where a bit-length L of the frequency setting parameter k for the DDS 12 is set to 32 bits, this frequency setting parameter k is regarded as an address of the memory 32a in Embodiment 3, so that a capacity of around 4.3 G bit is required for the memory 32a, which is not practical, and for this reason, addresses in the memory are thinned out in Embodiment 4.

For this reason, only the configuration of the parameter computing section in the frequency synthesizer according to Embodiment 4 is different from that in Embodiment 2, so that description is made herein mainly for configuration and operations of the parameter computing section.

Figure 10:
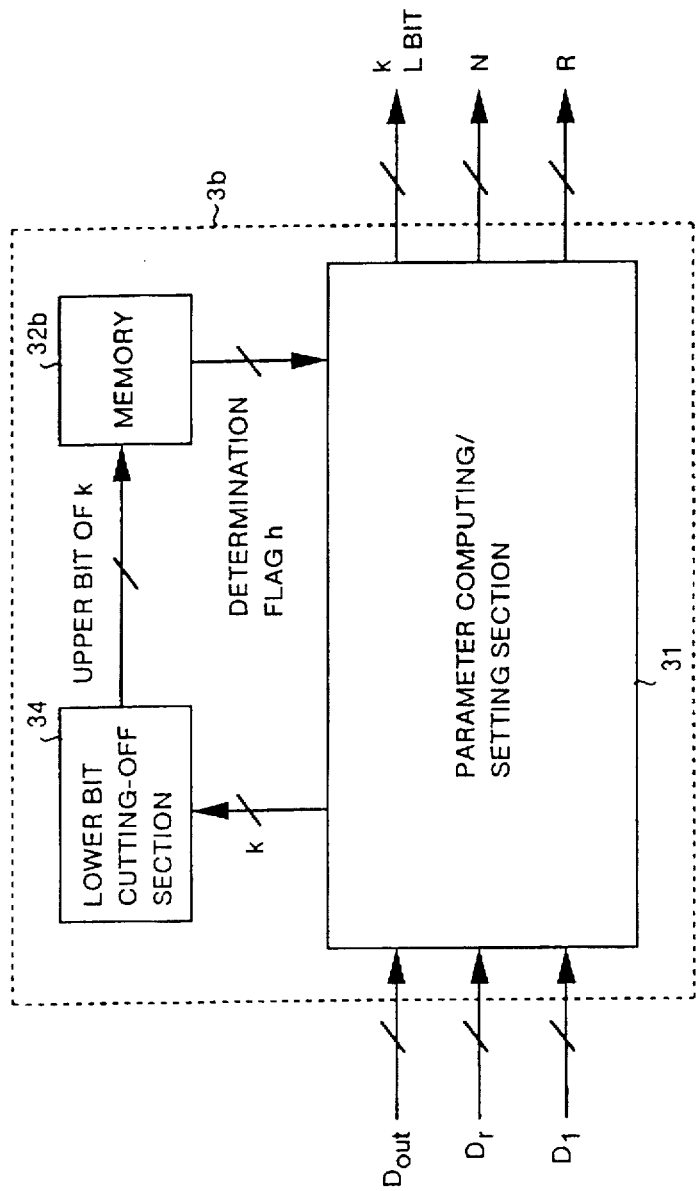
FIG. 10 is a view showing the configuration of the parameter computing section 3 according to Embodiment 4.

FIG. 10 shows configuration of a parameter computing section 3b according to Embodiment 4. In the figure, designated at the reference numeral 31 is the same parameter computing/setting section as that in each of Embodiments described above, at 32b a memory for largely reducing a storage capacity as compared to the case in Embodiment 3 as shown in FIG. 11 and storing therein a determination flag h, and at 34 a lower bit cutting-off section for cutting off a lower bit of the frequency setting parameter k in the DDS 12 outputted from the setting parameter computing/setting section 31 and outputting the cut-off parameter to the memory 32b.

FIG. 11 shows the contents stored in the memory 32b according to Embodiment 4. Previously stored in this memory 32b is a determining flag h for determination, as shown in the figure, whether an output from the DDS 12 according to the frequency setting parameter k having upper 4 bits at each address includes a high spurious in each data storage area indicated by each address or not, regarding the upper 4 bits as addresses of the memory in a case where the frequency setting parameter k for the DDS 12 is indicated with, for instance, 5 bits. It should be noted that the upper 4 bits among 5 bits of the setting parameter k are used as addresses herein, and only the lowest bit is cut off, so that a capacity of the memory 32b becomes ½ as compared to the case in Embodiment 3.

Next description is made for operation of the frequency synthesizer according to Embodiment 4.

In the frequency synthesizer according to Embodiment 4, at first, when the input device 4 inputs data $D_{out}$ corresponding to an output frequency $f_{out}$ to be outputted from the PLL 2 to the parameter computing section 3b like in Embodiment 3, the parameter computing/setting section 31 in the parameter computing section 3 computes each of setting parameters k, R, and N through the processing steps from Steps S10 to S50 shown in FIG. 5, and the computed setting parameter k is outputted to the lower bit cutting-off section 34 to make determination in Step S60 as to whether the computed setting parameter k is the particular frequency setting parameter ks for a spurious at a high level or not.

The lower bit cutting-off section 34 cuts off, when having received the setting parameter k, lower bits under the upper 4 bits in the setting parameter k and outputs the parameter to the memory 32b. The memory 32b receives the upper 4 bits in the setting parameter k as addresses, so that the memory 32b outputs a determination flag h corresponding to the upper 4 bits in the setting parameter k to the parameter computing/setting section 31, and the parameter computing/setting section 31 makes the determination as to whether the setting parameter k is the particular frequency setting parameter ks for a spurious at a high level or not according to the determination flag h.

More specifically, in a case where the frequency setting parameter k for the DDS 12 obtained by computation is, for instance, k=10110, or 10111, the upper 4 bits indicates 1011, so that a determination flag h indicated by 0 stored in the address No. 1011 of the memory 32b is outputted as shown in FIG. 11. For this reason, in this case, the parameter computing/setting section 31 indicates the fact that the setting parameter k obtained by the determination flag h indicated by 0 is the particular frequency setting parameter ks for a spurious at a high level, so that it is determined in Step S60 shown in FIG. 5 as NO, then system control shifts to processing in Step S80, processing step S80 shown in FIG. 6 is executed, and each of the setting parameters k, R, and N is re-computed therein.

Accordingly, in the frequency synthesizer according to Embodiment 4, when data $D_{out}$ corresponding to an output frequency $f_{out}$ to be outputted from the PLL 2 is received by the parameter computing section 3b like in Embodiments 2 and 3, the parameter computing section 3b automatically computes parameters k, R, and N for setting, so that a long period of time is not required for setting parameters k, R, and N, and a determination is also made as to whether the setting parameter k is identical to the particular frequency setting parameter ks with a spurious at a high level or not when each of the setting parameters k, R, and N is obtained, so that output of the particular frequency setting parameter ks can be prevented before its output, and for this reason a spurious in a frequency synthesizer can be made lower.

In the frequency synthesizer according to Embodiment 4, regarding specified upper bits in the frequency setting parameter k for the DDS 12 as addresses, a determination flag h, for determination as to whether each of frequency setting parameter k having the specified upper bit as an address is the particular frequency setting parameter ks or not, is stored in each data storage area indicated by each address, so that a period of time required for making the determination of the setting parameter k can be reduced like in Embodiment 3, and a capacity of the memory 32b can also be reduced as compared to the case in Embodiment 3. To be more specific, if the frequency setting parameter k is set to, for instance, 32-bit high resolution, a capacity of the memory 32b becomes around 4.3 G bits, but if the bits are thinned out to ½ of 16 bits, only around 66 k bits are required. As a result, a low-cost memory can be used because of reduction of the required memory capacity, which makes it possible to reduce production cost thereof.

A frequency synthesizer according to embodiment 5 has the same configuration as that in Embodiment 4 in which a memory capacity for making determination of a setting parameter k is reduced as compared to the case in Embodiment 3, and regarding the frequency setting parameter k as an address by being thinned out like in Embodiment 3, a range of a particular frequency setting parameter ks for a spurious at a high level is previously stored in the memory but a determination flag h corresponding to the frequency setting parameter k is not previously stored therein, and determination is made as to whether the frequency setting parameter k computed according to the range is ks or not.

For this reason, only the configuration of the parameter computing section in the frequency synthesizer according to Embodiment 5 is different from that in Embodiments 2 to 3, so that description is made herein mainly of the configuration and operation of the parameter computing section.

Figure 12:
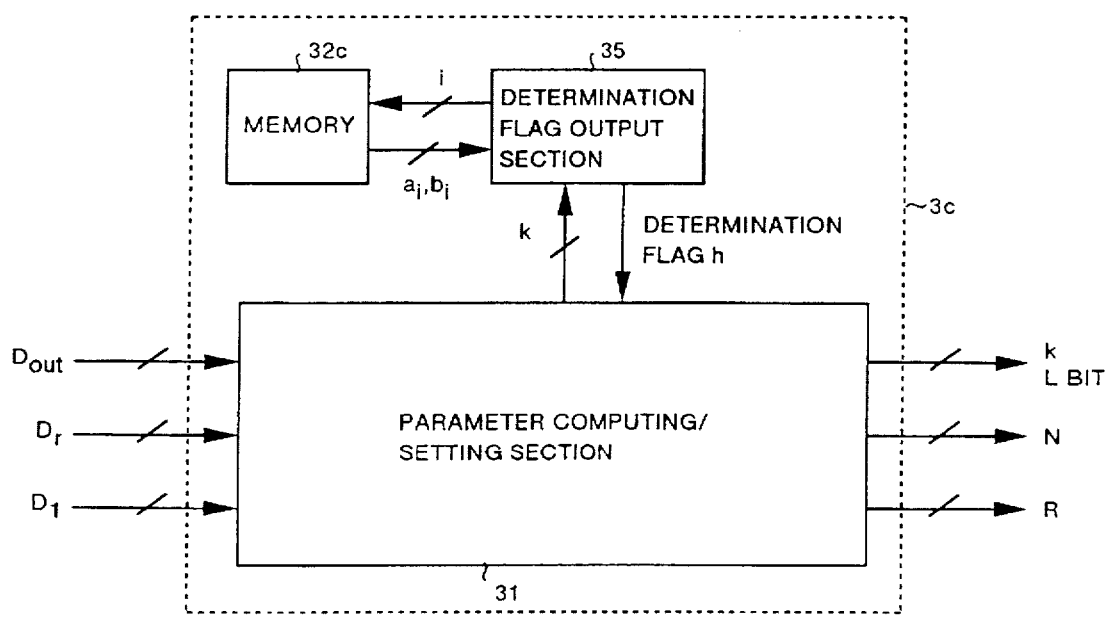
FIG. 12 is a view showing the configuration of the parameter computing section 3 according to Embodiment 5.

FIG. 12 shows the configuration of a parameter computing section 3c according to Embodiment 5. In the figure, designated at the reference numeral 31 is the same parameter computing/setting section as that in each of the embodiments, at 32c a memory for storing therein a range of particular frequency setting parameters ks for a spurious at a high level for the DDS, and at 35 a determination flag output section for making determination as to whether the frequency setting parameter k is ks or not according to the particular frequency setting parameter ks stored in the memory 32c and outputting the result of determination as a determination flag h.

FIG. 13 shows the contents stored in the memory 32c according to Embodiment 5. Stored in this memory 32c are a lower limit value $a_i$ and an upper limit value $b_i$ each of the particular frequency setting parameter ks in each range for the particular frequency setting parameter ks corresponding to an address i (i=0, 1, 2, ... ) in the order from the lower value thereof. It should be noted that the particular frequency setting parameter ks herein is indicated with 7 bits as shown in the figure.

Next description is made for operations of the frequency synthesizer according to Embodiment 5 with reference to the related drawing.

Figure 14:
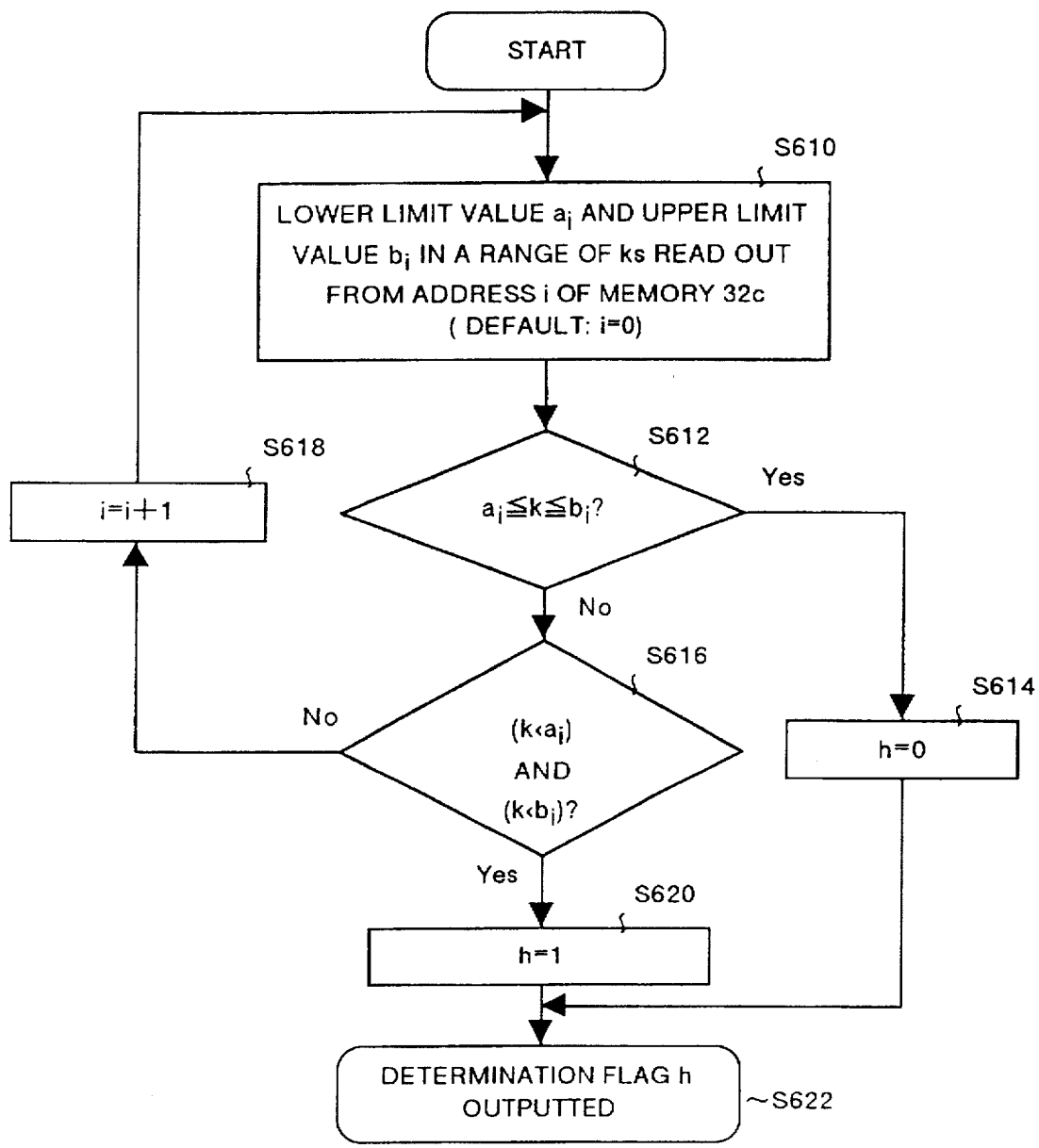
FIG. 14 is a flow chart showing a processing sequence up to output of a determination flag in the determination flag output section 35.

FIG. 14 shows a processing sequence up to output of a flag for determination in a determination flag output section 35. It should be noted that, in the frequency synthesizer according to Embodiment 5, it is assumed that data $D_{out}$, $D_r$, $D_d$ have been inputted to the parameter computing/setting section 31 by the input device 4 before start of the processing, each of setting parameters k, R, and N has been computed, and the frequency setting parameter k has been outputted to the determination flag output section 5, like the case in each embodiment described above.

At first, the determination flag output section 5 accesses the memory 32c when having received the frequency setting parameter k from the parameter computing/setting section 31, reads out the lower limit value $a_i$ and the upper limit value $b_i$ in a range of the particular frequency setting parameter ks for an address i (default: i=0) (step S610), and makes determination as to whether the setting parameter k is within the range between the lower limit value $a_i$ and the upper limit value $b_i$ or not (step S612). As a result of determination herein, in a case where it is determined that $a_i<<k<<b_i$, namely, that the setting parameter k is within the range between the lower limit value $a_i$ and the upper limit value $b_i$ (step S612 "YES"), the setting parameter k indicates the parameter ks for a spurious at a high level, so that the flag for determination is set to 0 like in each embodiment described above (step S614), the determination flag h indicated by 0 is outputted to the parameter computing/setting section 31 (step S670).

In contrast, in a case where it is determined that $k<a_i$ or $k>b_i$, namely the setting parameter k does not belong to the range between the lower limit value $a_i$ and the upper limit value $b_i$ (step S612 "NO"), then determination is made as to whether the value of the parameter k is smaller than values of $a_i$ and $b_i$ or not (step S616), and if the value of the parameter k is not smaller than the values of $a_i$ and $b_i$ (step S616 "NO"), i is incremented by 1 because the determination as to whether the setting parameter k is within the range in which a spurious is at a high level or not has not yet been completed (step S618), and the processing from the steps S610 to S616 is executed again.

On the other hand, in a case where it is determined that the value of the parameter k is smaller than the values of $a_i$ and $b_i$ (step S616 "YES"), the determination indicates that the determination as to whether the setting parameter k is within the range in which a spurious is at a high level or not has already been completed, and also indicates that the parameter k does not correspond to the particular setting parameter ks, so that the determination flag h is set to 1 (step S620), and the parameter h indicating 1 is outputted to the parameter computing/setting section 31 (step S622).

Accordingly, in the frequency synthesizer according to Embodiment 5, when data $D_{out}$ corresponding to an output frequency $f_{out}$ to be outputted from the PLL 2 is received by the parameter computing section 3c like in the embodiments 2 to 5, the parameter computing section 3c automatically computes parameters k, R, and N according to the data $D_{out}$ and sets the parameters in the DDS 12 or the like, so that a long period of time for setting parameters k, R, and N is not required, and determination is also made as to whether the setting parameter k is identical to the particular frequency setting parameter ks for a spurious at a high level or not when each of the setting parameters k, R, and N is obtained, so that output of the particular frequency setting parameter ks for a spurious at a high level to the DDS 12 can be prevented before its output, and for this reason a spurious in a frequency synthesizer can be made lower.

In the frequency synthesizer according to Embodiment 5, a range of particular frequency setting parameters ks each for a spurious at a high level is stored in the memory 32c, so that a capacity of the memory 32c can be reduced as compared to the cases in Embodiments 2 to 4. As a result, a low-cost memory can be used by reducing the memory capacity, which makes it possible to reduce production cost thereof.

A frequency synthesizer according to embodiment 6 has the same configuration as that in each of Embodiments 4 and 5 in which a memory capacity for making determination of a setting parameter k is reduced, and to largely reduce a memory capacity, the DDS 12 previously stores an order of a spurious at a specified level or a level higher than the specified level to be outputted in an output band from the PLL 2 in the memory, and makes determination as to whether the frequency setting parameter k obtained according to the order is the parameter ks or not.

For this reason, only the configuration of the parameter computing section in the frequency synthesizer according to Embodiment 6 is different from that in each of Embodiments 2 to 5, so that the description herein is mainly of the configuration and operation of the parameter computing section.

Figure 15:
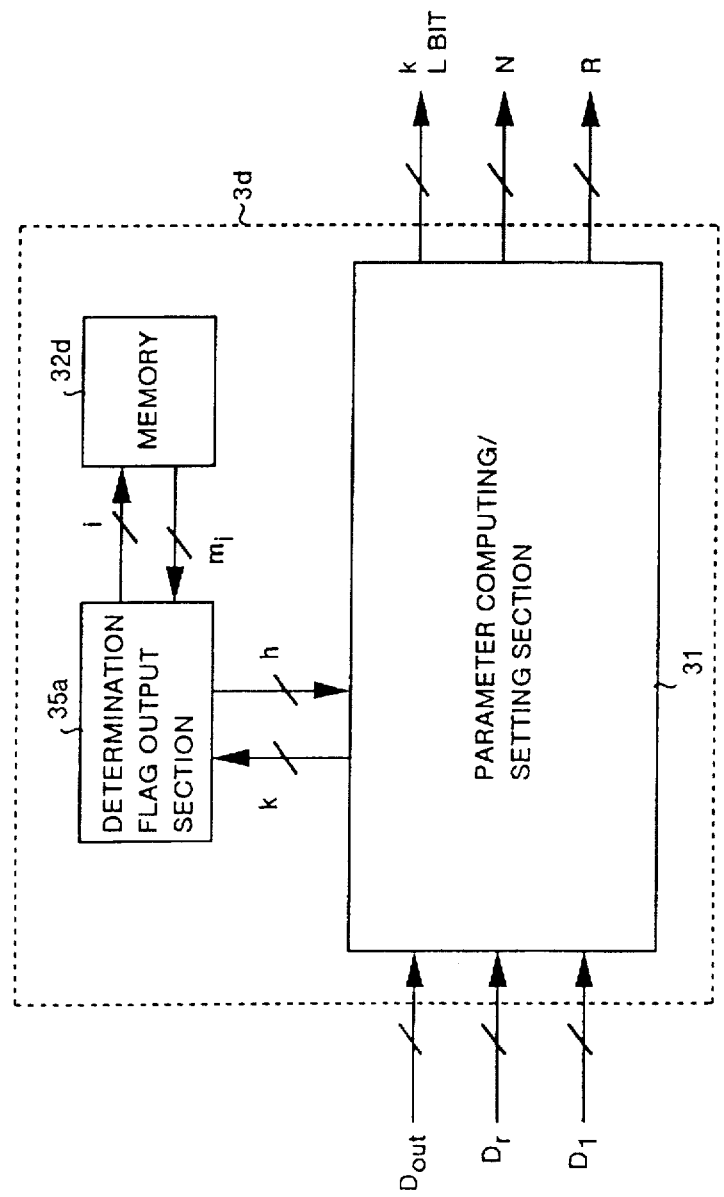
FIG. 15 is a view showing configuration of the parameter computing section 3 according to Embodiment 6.

FIG. 15 shows configuration of a parameter computing section 3d according to Embodiment 6. In the figure, reference numeral 31 is the same parameter computing/setting section as that in each of the previous embodiments, 32d a memory for previously storing therein an order m of a high spurious at a specified level or a level higher than the specified level to be outputted in an output band from the PLL 2 by the DDS 12 as shown in FIG. 16, and 35a a determination flag output section for making a determination as to whether the frequency setting parameter k is the particular frequency setting parameter ks with a spurious at a high level or not according to the order m of a high spurious stored in the memory 32 and outputting the result of the determination as a determination flag h.

FIG. 16 shows the contents stored in the memory 32d according to Embodiment 6. Previously registered in this memory 32d are orders $m_i$ as 2, 3, 4, . . . of a high spurious at a specified level or a level higher than a specified level appearing in an output from the DDS 12 for each address (i=0, 1, 2, . . . , q) of the memory 32d.

Figure 46:
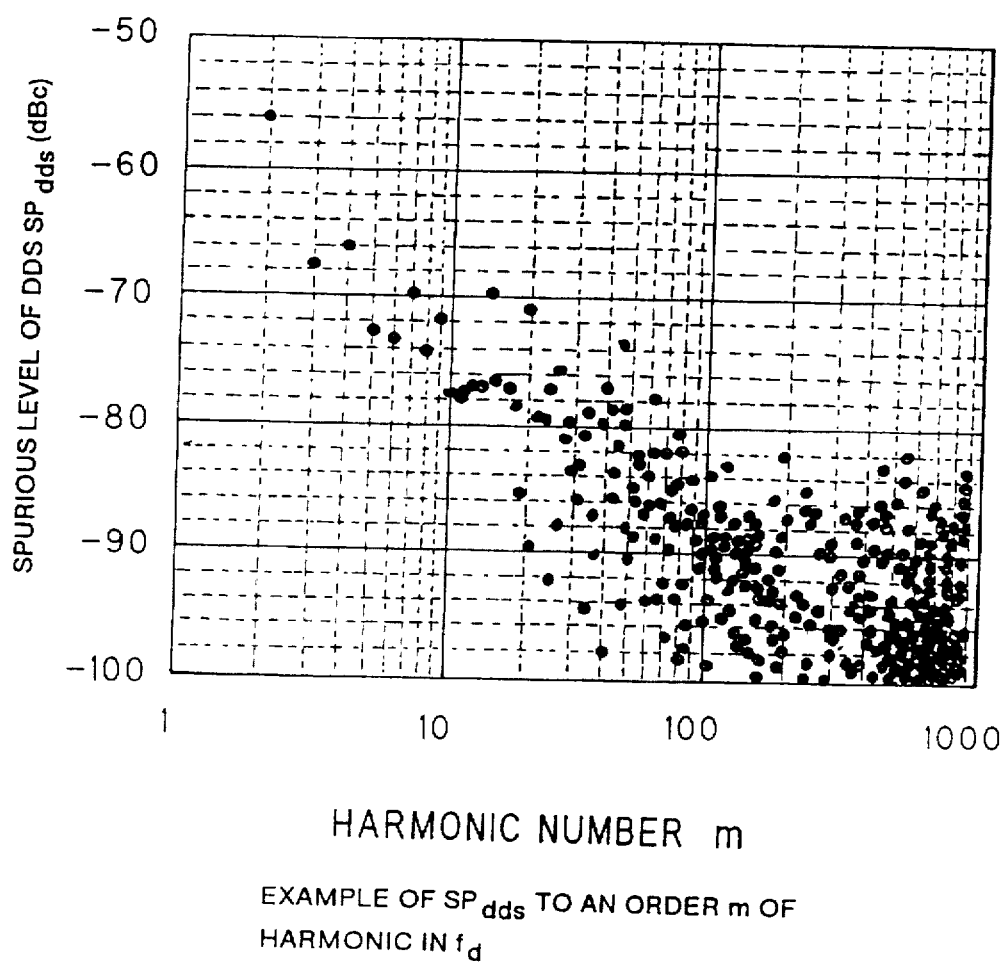
FIG. 46 is a view showing a spurious level $SP_{dds}$ of an order m of a harmonic in an output frequency $f_d$ from the conventional DDS.

Herein, to describe how a determination can be made as to whether a spurious is at a high level or not according to an order m of a spurious, generally with a particular output frequency $f_d$ from the DDS 12 substantially equal to a frequency $f_{dds}$ of a high spurious ($f_d \neq f_{dds}$) the high spurious can not be controlled nor removed by the PLL 2 or a filter or the like. However, the frequency $f_{dds}$ for a high spurious, as expressed in the expression (3), is given by the expression of $f_{dds}=|m \cdot f_d - n \cdot f_{ck}|$, and a spurious level $SP_{dds}$ to an order m of the spurious is as shown in FIG. 46, and from this feature it is understood that an order m of a spurious at a high spurious level $SP_{dds}$ is limited to a particular low order m. For this reason, in the frequency synthesizer according to Embodiment 6, only a particular order m in which a spurious included in an output from the DDS 12 becomes a high level is stored in the memory 32d.

Next description is made for a principle of determination in the determination flag output section 35 according to Embodiment 6.

At first, in order that a high spurious may not be finally outputted from the PLL 2, the requirement is only that a frequency $f_{dds}$ of a spurious having an order m at a high spurious level will not exist within an output frequency band from the PLL 2, so that the following expression (11) should not be satisfied.

$$|f_{dds}-f_d|<\Delta f_{pll} \tag{11}$$

(wherein, $\Delta f_{pll}$ indicates an output frequency band from the PLL 2)

When the expression (3) is substituted into the expression (11), the following expression is obtained:

$$|(m\pm1)k/2^L-n|<\Delta f_{pll}/f_{ck} \tag{12}$$

Also, a frequency $f_{dds}$ of a high spurious which needs to be considered is generally not more than ½ of an output frequency $f_{ck}$ from the reference clock 11. With this feature, the $f_{dds}$ is expressed by the following expression (13).

$$f_{dds}=|m \cdot f_d-n \cdot f_{ck}|<0.5f_{ck}=|m \cdot k/2^L-n|<0.5 \tag{13}$$

Then, in this expression (13), a harmonic order n of an output wave $f_{ck}$ from the reference clock 11 is obtained through the expression (13), and the following expression (14) is obtained thereby.

$$m \cdot k/2^L-0.5<n<m \cdot k/2^L+0.5 \tag{14}$$

Herein, n is an integer, so that the expression (14) can be changed to the following expression (15).

$$n=\text{round}[k \cdot m/2^L] \tag{15}$$

This expression (15) is substituted into the expression (12), so that an expression for determination of the frequency setting parameter k for the DDS 12 becomes as expressed by the following expression (16).

$$|(m\pm1)k/2^L-\text{round }[k \cdot m/2^L]|<\Delta f_{pll}/f_{ck} \tag{16}$$

Accordingly, in a case where a setting parameter k satisfies the expression (16), it indicates that a high spurious is outputted from the PLL 2. For this reason, if a value of $2^L$ and a value of $\Delta f_{pll}/f_{ck}$ are previously stored, determination of the frequency setting parameter k can be made according to an order m of the spurious.

Next description is made for operation of the frequency synthesizer according to Embodiment 6 with reference to the related drawing.

Figure 17:
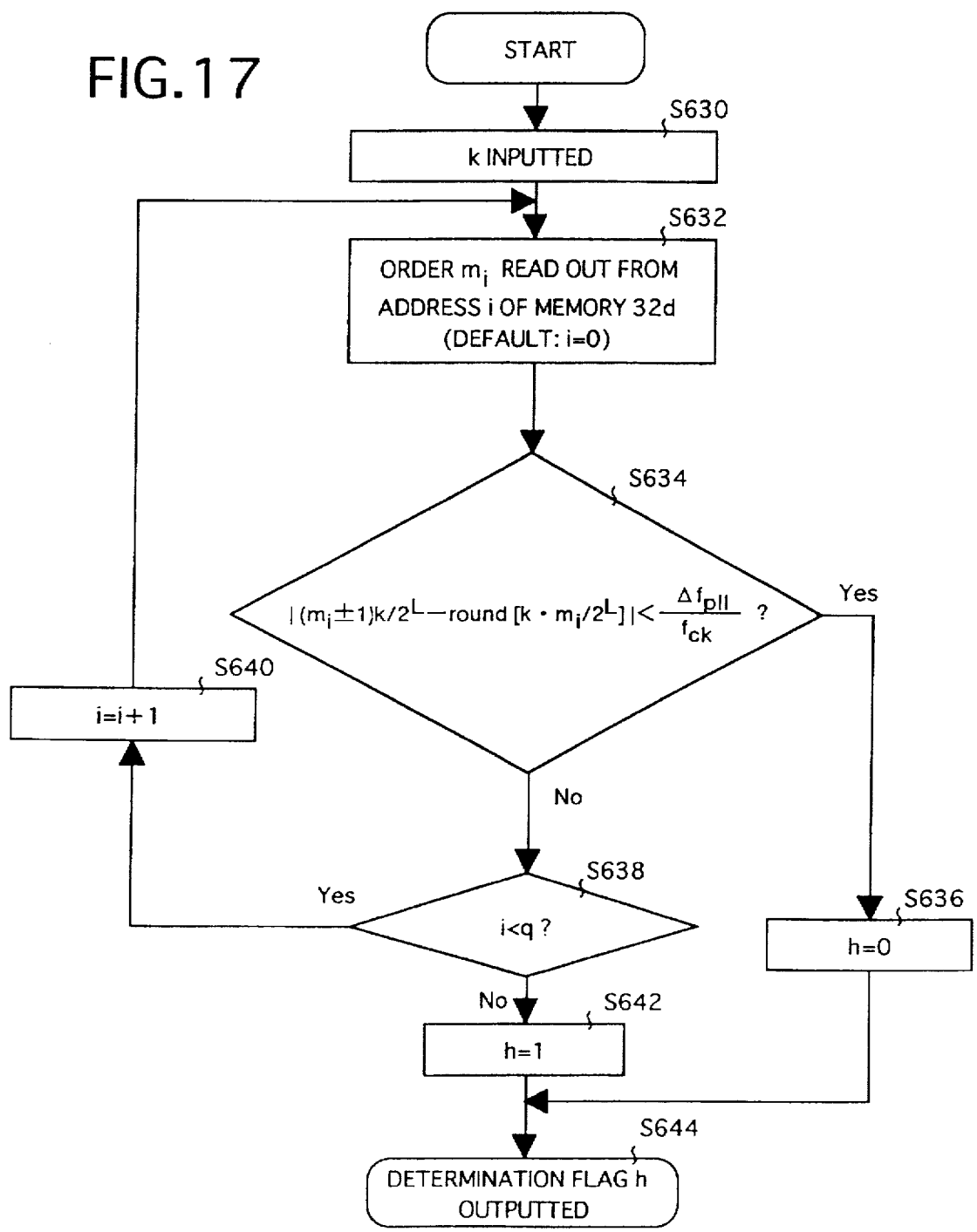
FIG. 17 is a flow chart showing a processing sequence up to output of a determination flag in the determination flag output section 35 according to Embodiment 6.

FIG. 17 shows a operational sequence up to output of a flag for determination in a determination flag output section 35 according to Embodiment 6. It should be noted that, in the frequency synthesizer according to Embodiment 6, it is assumed that data $D_{out}$, $D_r$, $D_d$ have been inputted to the parameter computing/setting section 31 by the input device 4, each of setting parameters k, R, and N has been computed, and the frequency setting parameter k has been outputted to the determination flag output section 5 before start of the processing, like in each embodiment described above.

At first, the determination flag output section 35a accesses the memory 32c when having received the frequency setting parameter k from the parameter computing/setting section 31 (step S630), reads out a high level order $m_i$ of a spurious at an address i (default: i=0) (step S632), substitutes k and $m_i$ into the expression (16), and compares the expression to that of $\Delta f_{pll}/f_{ck}$ (step S634).

As a result, a case where an expression becomes the following one: $|(m_i\pm1)k/2^L$-round $[k \cdot m/2^L]| < \Delta f_{pll}/f_{ck}$ (step S634 "YES") indicates the fact that a high spurious is outputted from the PLL 2 in the order $m_i$ of the spurious, so that zero is set as a determination flag h (step S636), and this determination flag h=0 is outputted to the parameter computing/setting section 31 (step S644).

In contrast, a case where the condition of $|(m_i\pm1)$ k $/2^L$-round $[k \cdot m_i/2^L]| < \Delta f_{pll}/f_{ck}$ is satisfied (step S634 "NO") indicates the fact that a high spurious is not outputted from the PLL 2 with the order $m_i$ of the spurious, so that determination is made as to whether an address i of the determined order $m_i$ is smaller than the maximum value q or not in order to make determination as to whether any order $m_i$ which has not been determined yet is present or not (step S638). Then, a case where the address i is smaller than the maximum value q (step S 638 "YES") indicates the fact that an order $m_i$ of the spurious not yet to be determined remains, so that the address i is incremented (step S640), and the processing steps S632 and S634 are executed according to a new address i, while a case where the address i becomes equal to the maximum value q (step S638 "NO") indicates the fact that the determination for all the orders $m_i$ each stored in the memory 32d is complete and that a high spurious is not outputted from the PLL 2 in all the orders $m_i$, so that one is set as a flag for determination (step S642), and the flag for determination of h=1 is outputted to the parameter computing/setting section 31 (step S644).

Accordingly, in the frequency synthesizer according to Embodiment 6, when data $D_{out}$ corresponding to an output frequency $f_{out}$ to be outputted from the PLL 2 is received by the parameter computing section 3d like in each of Embodiments 2 to 5, the parameter computing section 3d automatically computes parameters k, R, and N and sets the parameters in the DDS 12 or the other place, so that a long period of time and work load for setting parameters k, R, and N are not required, a determination is also made as to whether the setting parameter k is identical to the particular frequency setting parameter ks for a spurious at a high level or not when each of the setting parameters k, R, and N is obtained, so that output of the particular frequency setting parameter ks for a spurious at a high level to the DDS 12 can be prevented before its output, and for this reason a spurious in a frequency synthesizer can be made lower.

In the frequency synthesizer according to Embodiment 6, an order of a high spurious appearing in an output from the DDS 12 is stored in the memory 32d, and a frequency setting parameter is determined according to the order, so that a capacity of the memory 32d can largely be reduced as compared to the cases in Embodiments 2 to 5. As a result, a low-cost memory can be used because of reduction of the memory capacity, which makes it possible to reduce production cost thereof. Especially, a number of orders m of an spurious in which a high spurious described above is outputted is extremely limited as shown in FIG. 46, so that, generally, it is not required to provide a exclusive memory to store the orders of a spurious described above, and the data can be stored in any available area in other memory, and for this reason, production cost can be reduced due to not providing a memory for a specific purpose.

A frequency synthesizer according to Embodiment 7 simplifies determination as to whether the frequency setting parameter k to the DDS in a case of a synthesizer ($\Delta f_d/f_{ck}$ = 0.04% in the reference) having a narrow width of change $\Delta f_d$ of an output frequency $f_d$ from the DDS is ks for a spurious at a high level or not, as introduced in "A PLL synthesizer driven by a two-resonation type of low spurious DDS using a frequency converter" disclosed by the inventor et al. of the present application in the electronic data communication institute MW No. 94-156.

For this reason, only the configuration of the parameter computing section 3 in the frequency synthesizer according to Embodiment 7 is different from that in each of Embodiments 2 to 6, so that description is made herein mainly for configuration and operations of the parameter computing section 3.

Figure 18:
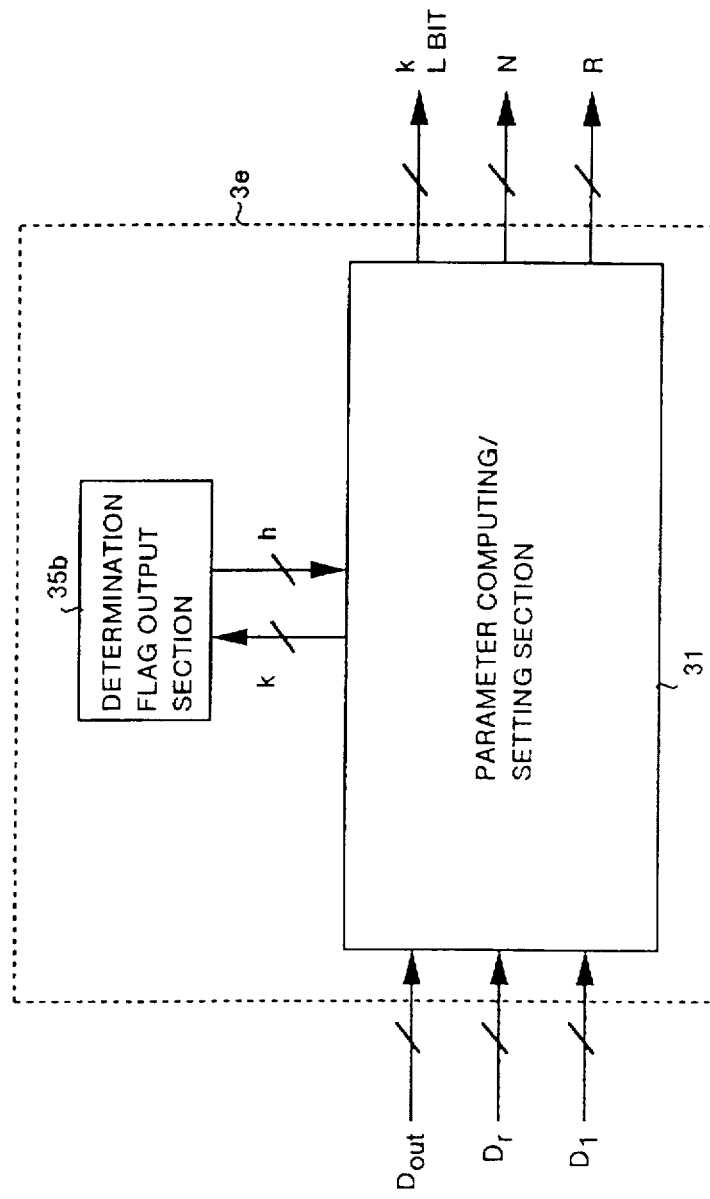
FIG. 18 is a view showing the configuration of the parameter computing section 3 according to Embodiment 7.

FIG. 18 shows the configuration of a parameter computing section 3e according to Embodiment 7. In the figure, reference numeral 31 is the same parameter computing/setting section as that in each of the embodiments, and 35b is a determination flag output section for making a determination as to whether the frequency setting parameter k is a particular frequency setting parameter ks outputting a high spurious or not according to the setting parameter k outputted for determination by the parameter computing/setting section 31 and outputting the result of determination as a determination flag h.

Next description is made for a principle of determination in the determination flag output section 35b according to Embodiment 7.

At first, description is made for a relation between the frequency setting parameter k for the DDS 12 and a particular frequency setting parameter ks for the DDS 12 in which a spurious is at a high level, in a case where a width of change $\Delta f_d$ of an output frequency $f_d$ from the DDS 12 is extremely narrow.

Figure 44:
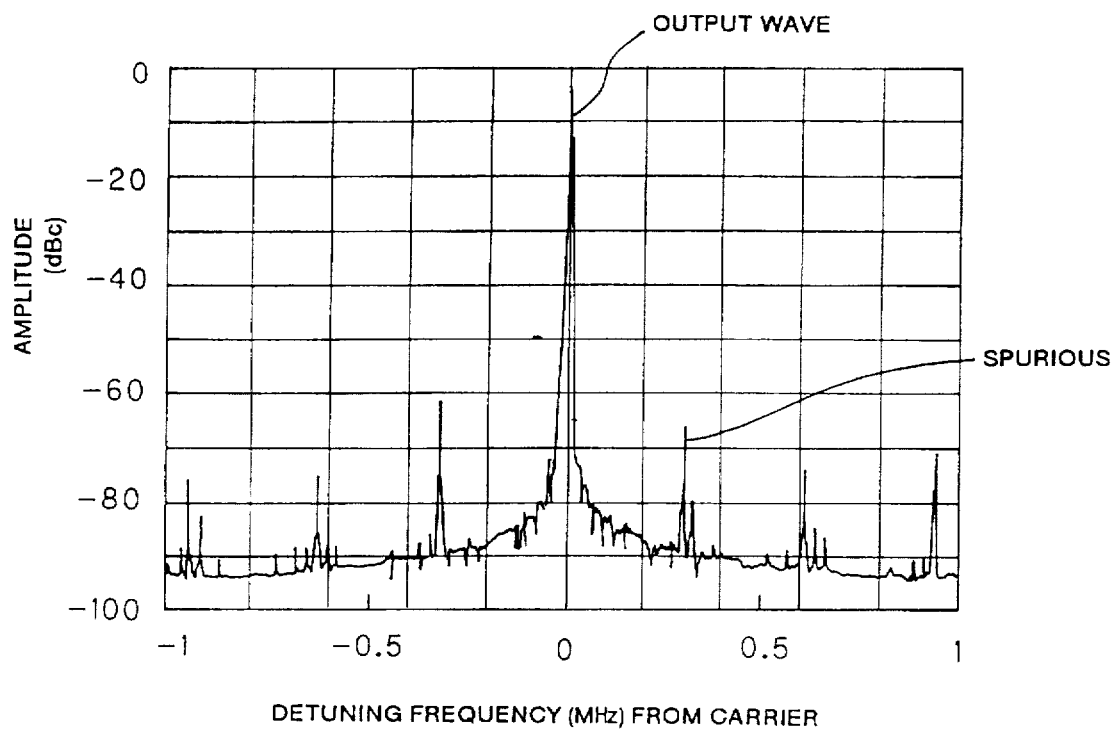
FIG. 44 is a view showing an output spectrum from the conventional DDS.
Figure 45A:
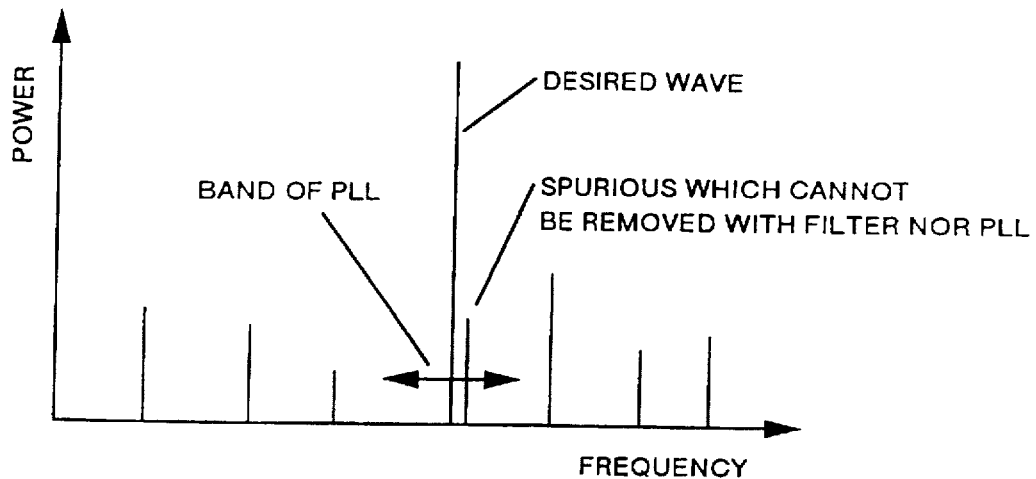
FIG. 45A is an explanatory view showing a spectrum of a spurious in the conventional DDS which can not be controlled.
Figure 45B:
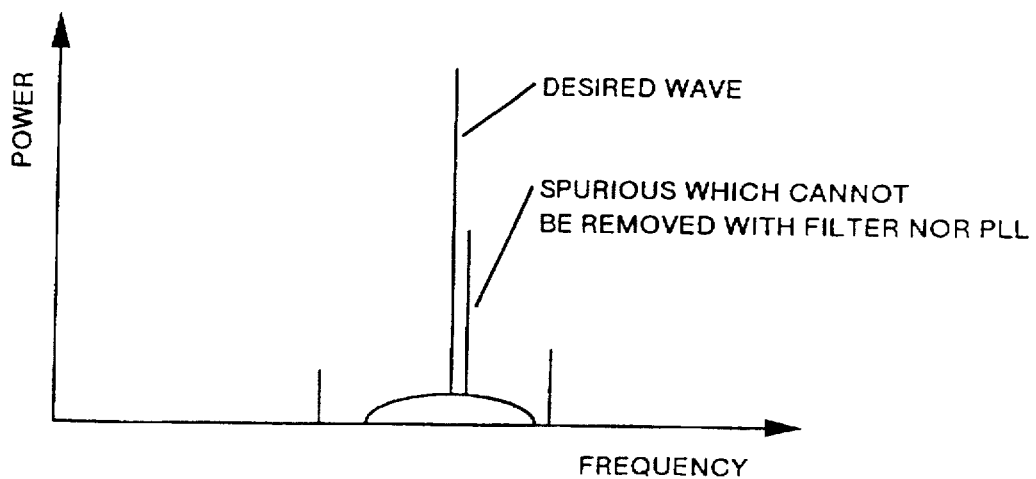
FIG. 45B is an explanatory view showing a spectrum of a spurious in the conventional DDS which can not be controlled.

As described in FIG. 44 and in Embodiment 6 described above, when an order of a spurious is a particular order m, the spurious is at a high level. In addition, if the width of change $\Delta f_d$ of an output frequency $f_d$ from the DDS 12 is further limited to a narrow band, an order m (described as ms hereinafter) in which a spurious is at a high level is further limited. For this reason, at first, assuming that ms is one (1), and if ks, in a case where a frequency $f_{dds}$ of a spurious in the particular order ms is near the output frequency $f_d$ from the DDS 12, namely in a case where $f_d$ becomes substantially equal to $f_{dds}$ ($f_d \approx f_{dds}$), is obtained with reference to the expression (3) or expression (1), the ks is expressed by the following expression (17) as described below.

$$f_d = f_{dds}$$

$$f_d = |ms \cdot f_d - n \cdot f_{ck}|$$

$$ks \cdot f_{ck}/2^L = |ms \cdot ks \cdot f_{ck}/2^L - n \cdot f_{ck}|$$

$$ks = |ms \cdot ks - n \cdot 2^L|$$

$$ks = 2^L \cdot n/(ms \pm 1) \qquad (17)$$

FIG. 19A and FIG. 19B each show how a particular frequency setting parameter ks appears in the frequency setting parameter k.

FIG. 19A shows how the particular frequency setting parameter ks appears in the frequency setting parameter k for a given order ms, and the figure shows that two of ks=$2^L \cdot$(n/ms±1) appear for each harmonic order n of an output wave $f_{ck}$ from the reference clock 11. It should be noted that, in an area near ks, a spurious is within a pass band $\Delta f_{pll}$ of the PLL 2, and is outputted from the PLL 2.

FIG. 19B shows how ks appears in a case where ms>>1, and a case shown in FIG. 19B indicates that ms>>1, which is different from the case shown in FIG. 19A, so that the case of B is regarded as $2^L \cdot N/(ms+1) \neq 2^L \cdot N/(ms-1)$, and $2^L \cdot N/(ms\pm1)$ is regarded as one point. Assuming that a range of the frequency setting parameter k for which a spurious at this point of time is at a high level is set to $\Delta kz$, the $\Delta kz$ appears in a cycle of kpd as shown in FIG. 19B, and this kpd is obtained by the following expression.

$$kpd = 2^L/ms (ms >> 1 \text{ herein}) \quad (18)$$

This expression (18) is substituted into the expression (17), and ms is deleted therein, when the order n is expressed by the following expression (19).

$$n = int[k/kpd] \quad (19)$$

Then, k exists within the $\Delta kz$, namely a conditional expression of k required for output of a high spurious is given by the following expression (20).

$$|k - n \cdot kpd| < \Delta kz/2 \quad (20)$$

Then, when the expression (18) and expression (19) are substituted into this expression (20), a conditional expression 20 of k required for output of a high spurious is given by the following expression (21).

$$int[ms \cdot k/2^L] \cdot 2^L/ms - \Delta kz/2 \leq k \leq int\ [ms \cdot k/2^L] \cdot 2^L/ms + \Delta kz/2 \quad (21)$$

Next description is made for operations of the frequency synthesizer according to Embodiment 7 with reference to the related drawing.

Figure 20:
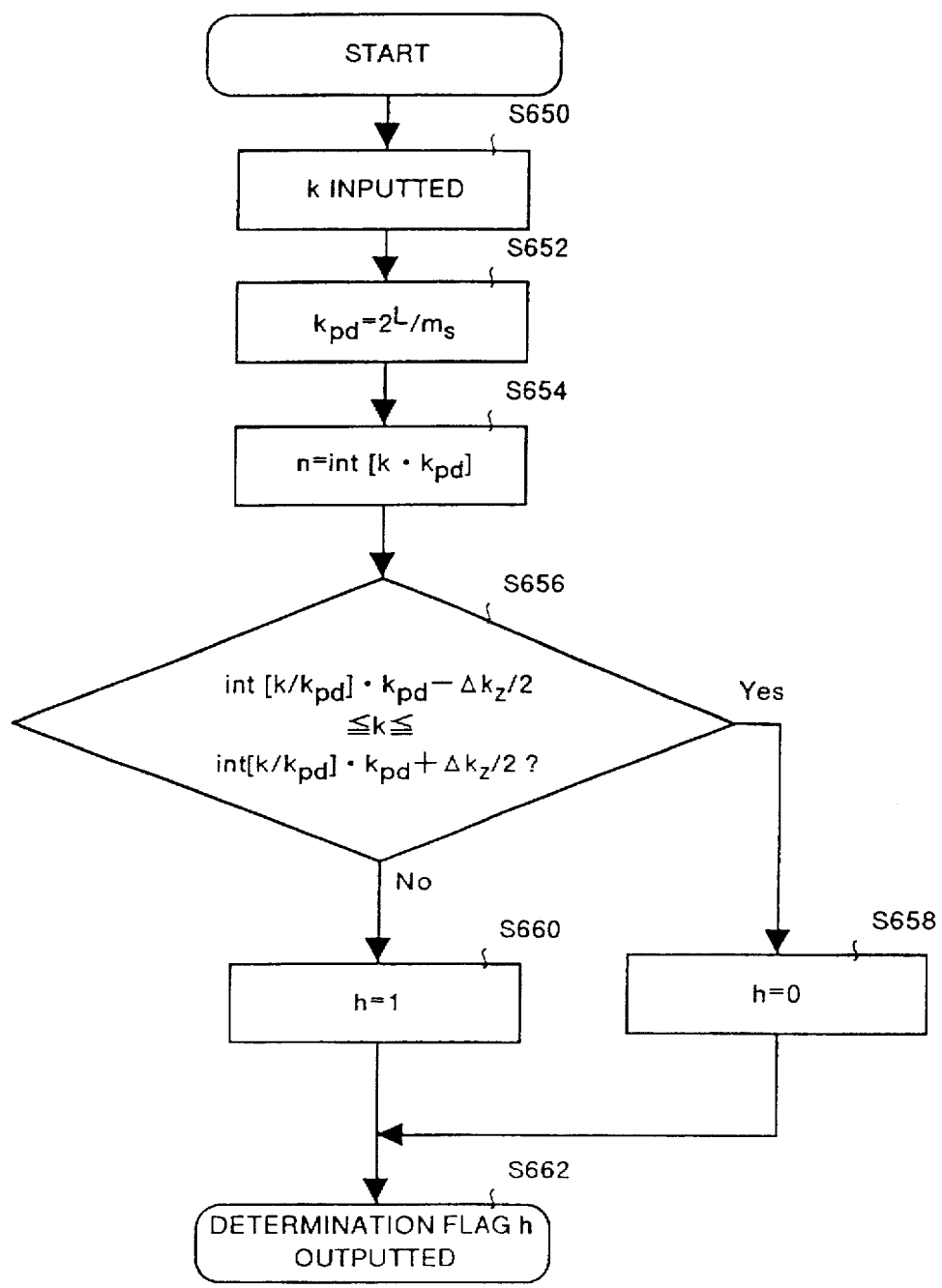
FIG. 20 is a flow chart showing a processing sequence up to output of a determination flag in the determination flag output section 35 according to Embodiment 7.

FIG. 20 shows a processing sequence up to output of a flag for determination in a determination flag output section 35 according to Embodiment 7. It should be noted that it is assumed that data $D_{out}$, $D_r$, $D_d$ have been received by the parameter computing/setting section 31, each of setting parameters k, R, and N has been computed, and the frequency setting parameter k has been outputted to the determination flag output section 5 before start of the processing, like the case in each embodiment described above.

At first, when the determination flag output section 35b have received the frequency setting parameter k from the parameter computing/setting section 31 (step S650), the section substitutes a particular order ms into the expression (18) and computes kpd (step S652), then substitutes the k and the kpd into the expression (19) for computing n (step S654) Then, the determination flag output section 35b substitutes k, $\Delta kz$, and ms into the expression (21), and makes determination as to whether the expression (21) is satisfied therewith or not, namely as to whether k exists within $\Delta kz$, and a high spurious is outputted or not (step S656).

As a result, in a case where it is determined that the condition of int $[ms \cdot k/2^L] \cdot 2^L/ms - \Delta kz/2 \leq k \leq$ int $[ms \cdot k /2^L] \cdot 2^L/ms + \Delta kz/2$ is satisfied (step S656 "YES"), the case indicates that k exists within $\Delta kz$, and a high spurious will be outputted from the PLL 2 in this setting parameter k, so that zero is set as a determination flag h (step S658), and the determination flag h=0 is outputted to the parameter computing/setting section 31 (step S662).

In contrast, in a case where it is determined that the condition of int $[ms \cdot k/2^L] \cdot 2^L/ms - \Delta kz/2 > k$, or k>int $[ms \cdot k/ 2^L] \cdot 2^L /ms + \Delta kz/2$ is satisfied (step S656 "NO"), the case indicates that k does not exist within $\Delta kz$, and a high spurious will not be outputted from the PLL 2 in this setting parameter k, so that 1 is set as a determination flag h (step S660), and the determination flag h=1 is outputted to the parameter computing/setting section 31 (step S662).

Accordingly, in the frequency synthesizer according to Embodiment 7, when data $D_{out}$ or the other data corresponding to an output frequency $f_{out}$ to be outputted from the PLL 2 is inputted to the parameter computing section 3e by the input means 4 like in each of Embodiments 2 to 6, the parameter computing section 3e automatically computes parameters k, R, and N and sets the parameters in the DDS 12 or the other place, so that a long period of time for setting parameters k, R, and N and work load are not required, and a determination is also made as to whether the setting parameter k is identical to the particular frequency setting parameter ks for a spurious at a high level or not when each of the setting parameters k, R, and N is obtained, so that output of the particular frequency setting parameter ks for a spurious at a high level to the DDS 12 can be prevented before its output, and for this reason a spurious in a frequency synthesizer can be made smaller.

Especially, in the frequency synthesizer according to Embodiment 7, a width of change $\Delta f_d$ of an output frequency $f_d$ from the DDS 12 is limited to a narrow band, so that an order m of a high spurious and a particular frequency setting parameter ks are further limited, which makes it possible to make a determination the frequency setting parameter k only by the determination flag output section 35b without providing therein a memory for the storing flags h for determination and orders m thereof, and for this reason, production cost can more largely be reduced to the point of doing away with the need for a memory as compared to the cases in Embodiments 2 to 6.

It should be noted that, in Embodiment 7, there is described a case where a number of orders m of a spurious in which a high spurious is outputted is set to one, but even if it may be set to a plurality of orders, the same effect can be achieved.

In Embodiments 2 to 7 above, description is made for a method of deciding a frequency setting parameter k or the like and the configuration thereof assuming a case where, once an output frequency from the DDS 12 is decided, the output frequency is kept fixed.

In contrast, in the frequency synthesizer according to Embodiment 8, like in the frequency synthesizer filed by the present assignee and disclosed in Japanese Patent Application No. HEI 6-23579, when the frequency synthesizer is used as a transmitter/receiver for a radio communication system or the like, in addition to adjustment by an automatic frequency control unit (described as "AFC" hereinafter) for adjusting a transmission frequency to a receiving frequency in a receiver side, fine adjustment is executed by sweeping only the output frequency from a DDS with the AFC even after the output frequency $f_{out}$ from the frequency synthesizer is once decided.

Figure 21:
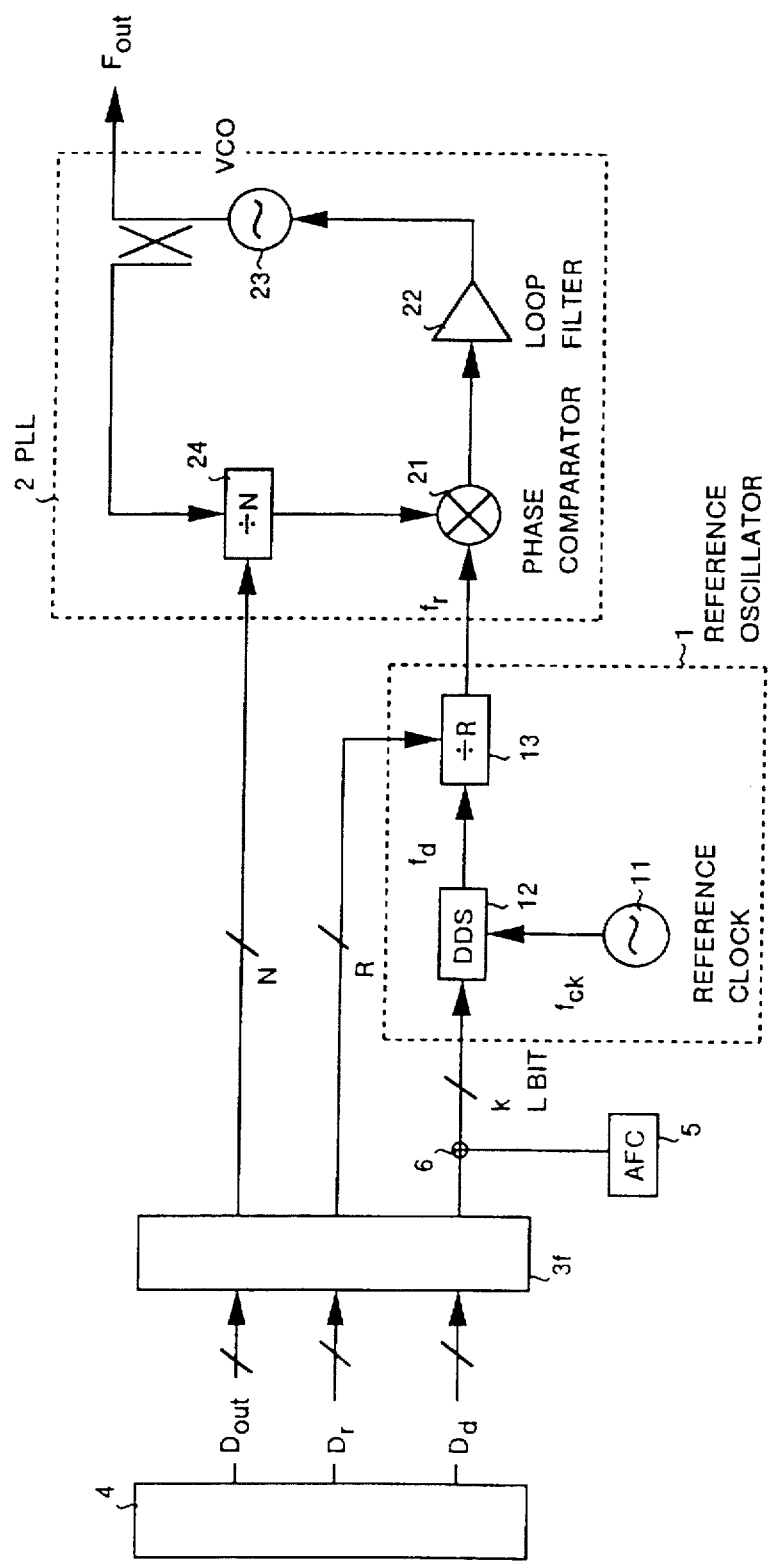
FIG. 21 is a view showing the configuration of the frequency synthesizer according to Embodiment 8.

FIG. 21 shows configuration of the frequency synthesizer according to Embodiment 8 of the present invention. As understood from FIG. 21, in the configuration of the frequency synthesizer according to Embodiment 8, the AFC 5 and the adder 6 for adding output from the AFC 5 to the frequency setting parameter k from the parameter computing section 3 are added between the reference oscillator 1 and the parameter computing section 3f both like those in the embodiments described above.

The AFC 5 executes fine adjustment for a transmission or receiving frequency, as described above, in a radio communication system or the like (not shown herein), so that a receiving frequency of a receiver coincides with a transmission frequency of a transmitter, and in Embodiment 8, the output frequency $f_d$ from the DDS 12 is subjected to fine adjustment by changing the frequency setting parameter k to be set in the DDS 12 via the adder 6. It should be noted that the same reference numerals are assigned to sections corresponding to those in Embodiment 2 shown in FIG. 2.

Figure 22:
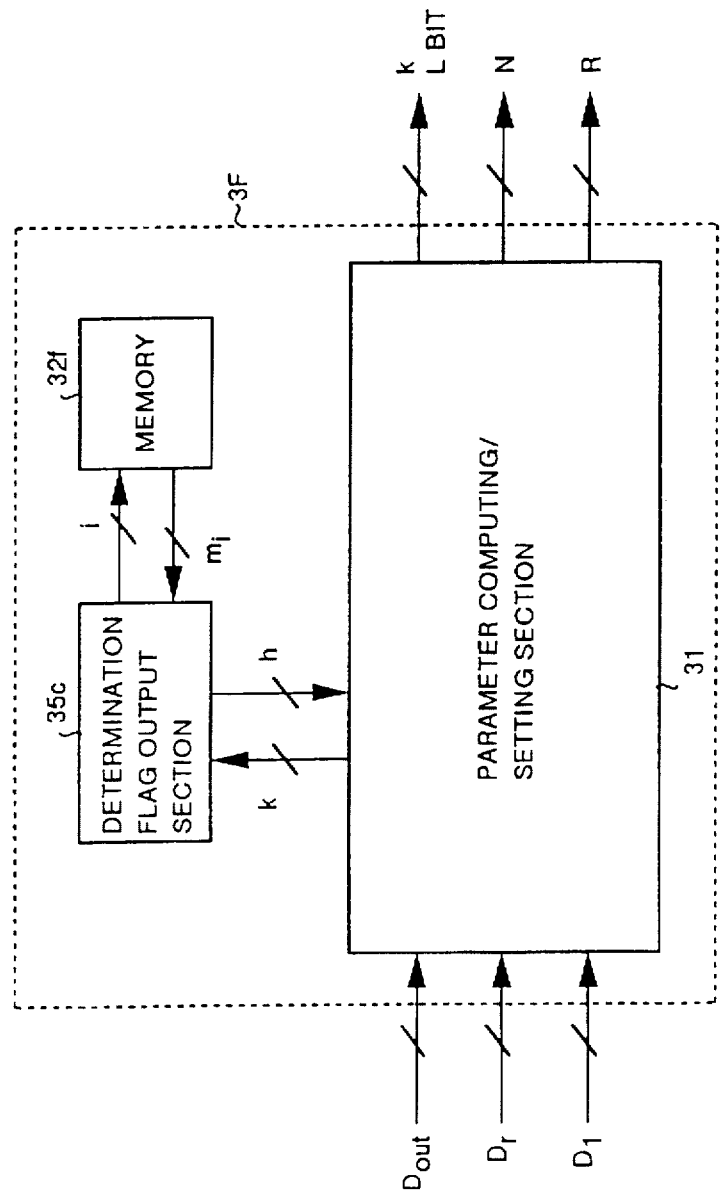
FIG. 22 is a view showing the configuration of the parameter computing section 3 according to Embodiment 8.

FIG. 22 shows the configuration of the parameter computing section 3f according to Embodiment 8. In this figure, designated at the reference numeral 31 is a parameter computing/setting section like that according to the embodiments described above, at 32f a memory with an order m of a high spurious appearing in output from the DDS 12 previously stored therein, and at 35c a determination flag output section for determining whether the frequency setting parameter k is ks for a high spurious level or not according to the order m of the spurious stored in the memory 32f and outputting a result of determination as a determination flag h.

Next description is made determining whether a frequency setting parameter is ks or not in the determination flag output section 35 according to Embodiment 8.

At first, in a case where the maximum sweeping width of a frequency setting parameter k of the DDS 12 swept by the AFC 5 or the other is $\Delta k$, condition for $f_d$ in a case where the frequency $f_{dds}$ of a high level spurious in a range from $k_{min}$ (=$k-\Delta k/2$) to $k_{max}$ (=$k+\Delta k/2$) is close to the output frequency $f_d$ from the DDS 12 ($f_d = f_{dds}$) is given through the following expression 22.

$$k_{min} \cdot f_{ck}/2^L < f_d < k_{max} \cdot f_{ck}/2^L \quad (22)$$

Then in the expression (3), if $f_{dds}$ is replaced with $f_d$ and the result is used for this express (22) to express an order m of the spurious, the following expression (23) is given:

$$n \cdot 2^L/k_{max} \pm 1 < m < n \cdot 2^L/k_{min} \pm 1 \quad (23)$$

As m indicates an integer herein, taking into considerations this fact, the expression (23) can also be expressed by the expression (24) as follows.

$$\text{int}[k_{max} \pm 1] < m < \text{round}[0.5 + n \cdot 2^L/k_{min} \pm 1] \quad (24)$$

For this reason, in a case where a spurious is at a high level with an order m satisfying the expression (24), when a frequency setting parameter k is changed with the AFC 5 from $k_{min}$ to $k_{max}$, high spurious appears in output from the DDS 12, so that it is possible to determine whether the frequency setting parameter k is ks or not by determining whether there is any order of high spurious satisfying this expression (24) or not.

FIG. 23 shows contents stored in a memory 32f in Embodiment 8. Contents stored in this memory 32f is the same as that in Embodiment 6 shown in FIG. 16, and orders $m_i$ of high spuriouses at a specified level or at a level higher than the specified level in output from DDS 12 are previously registered as 2, 3, 4, . . . at addresses 1 (i=0,1,2, . . . , q) of the memory 32f.

Then description is made for operation of the frequency synthesizer according to Embodiment 8 with reference to the related drawings.

Figure 24:
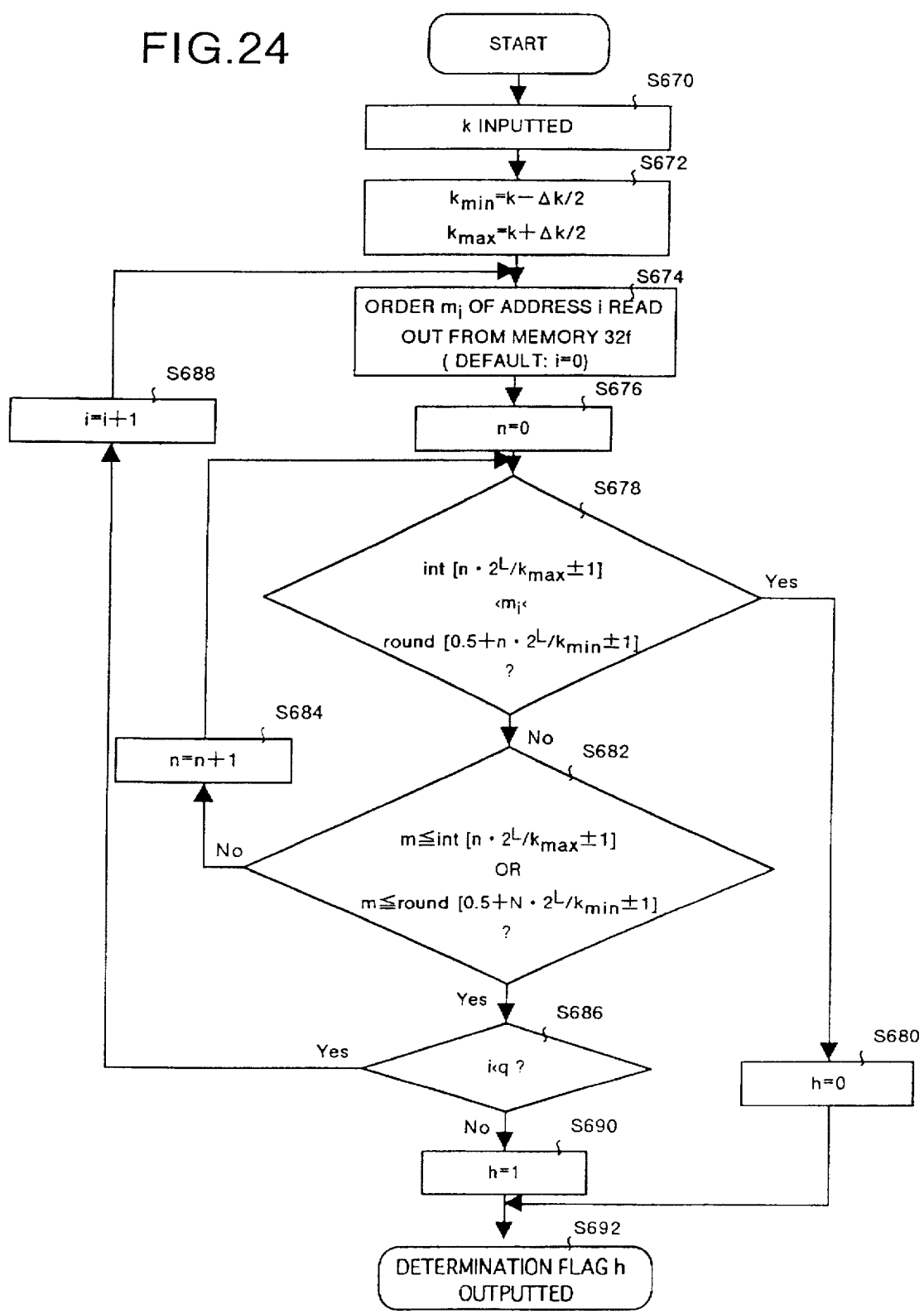
FIG. 24 is a flow chart showing a processing sequence up to output of a determination flag in the determination flag output section 35 according to Embodiment 8.

FIG. 24 shows a processing sequence up to output of an determination flag in the determination flag output section 35c according to Embodiment 8. It should be noted that, in Embodiment 8, like in each of the embodiments described above, each of the setting parameters k, R, and N are obtained by inputting $D_{out}$ or the like into the parameter computing/setting section 31 and the frequency setting parameter k is outputted to the determination flag output section 35c.

At first, when the determination flag output section 35c receives a frequency setting parameter k from the parameter computing/setting section 31 (step S670), $k_{min}$ and $k_{max}$ are obtained according to the maximum sweeping width $\Delta k$ for the frequency setting parameter k for the DDS 12 under control by the AFC 5 (step S672). Herein it is assumed that the $\Delta k$ is previously registered in the determination flag output section 35c or any other related section.

Then the determination flag output section 35c reads an order $m_i$ of a spurious according to address i (default: 0) of the memory 32f (step S674), sets an order n of harmonic in an output wave $f_{ck}$ from the reference clock 11 to 0 (n=0) (step S676), and determines whether the order $m_i$ of the spurious read out as described above satisfies the expression (24), namely the conditions of $\text{int}[n \cdot 2^L/k_{max} \pm 1] < m_i < \text{round}[0.5 + n \cdot 2^L/k_{min} \pm 1]$ or not (step S678).

In this step, in a case where it is determined that the order $m_i$ of the spurious read out satisfies the expression (24) (step S678 "YES"), it indicates that a high spurious appears in output from the DDS 12 when the frequency setting parameter k is changed in a range from $k_{min}$ to $k_{max}$ with the AFC 5, so that 0 indicating output of a high spurious is set as a determination flag h (step S680) and determination flag h=0 is outputted to the parameter computing/setting section 31 (step S692).

In contrast, in a case where it is determined that the order $m_i$ of the spurious read out as described above does not satisfy the expression (24) (step S678 "NO"), determination is made as to the condition of $m_i \leq \text{round}[0.5 + n \cdot 2^L/k_{min} \pm 1]$ or $m_i \leq \text{int}[n \cdot 2^L/k_{max} \pm 1]$ is satisfied or not (step S682), and in cases of $m_i \geq \text{round}[0.5 + n \cdot 2^L/k_{min} \pm 1]$ and $m_i \geq \text{int}[n \cdot 2^L/k_{max} \pm 1]$ (step S683 "NO"), system control returned to the processing step S678 with n changed to n+1 to again execute determination with a different value of n (step S684), and determination is executed with the new value of n again as to whether the order $m_i$ of the spurious satisfies the expression (24) or not.

On the other hand, in a case of $m_i \leq \text{round}[0.5 + n \cdot 2^L/k_{min} \pm 1]$ or $m_i \leq \text{int}[n \cdot 2^L/k_{max} \pm 1]$ (step S682 "YES"), it indicates that there is not $m_i$ nor n satisfying the expression (24), so that, to determine whether for the order $m_i$ all the spuriouses has been finished or not, a determination is made as to whether the address i is smaller than the maximum value q or not (step S686), and in a case where it is determined that the address i is smaller than the maximum value q (step S686 "YES"), the address i is incremented by 1 (step S688), system control returns to the step S674, an order $m_i$ of the next spurious is read out from the memory 32f according to the new address i, and the same processing is executed again. In contrast, in a case where the address i is equal to the maximum value q (step S686 "YES"), it indicates that $m_i$ does not satisfy the expression (24) for all values of $m_i$ and n, 1 indicating that a high spurious is not outputted is set as a determination flag h (step S690), and determination flag h=1 is outputted to the parameter computing/setting section 31 (step S692).

For the reasons described above, with the frequency synthesizer according to Embodiment 8, like in the embodiments 2 to 7 described above, when data $D_{out}$ corresponding to the output frequency $f_{out}$ to be outputted from the PLL 2 is inputted into the parameter computing section 3f, the parameter computing section 3f automatically computes the setting parameters k, R, and N and sets the parameters in the DDS 12 or the other sections, so that no heavy work load is required for setting the setting parameters k, R, N, and when the setting parameters k, R, and N are computed, a determination is made as to whether the setting parameter k is identical to the particular frequency setting parameter ks for a high spurious level or not to prevent the frequency setting parameter ks for a high spurious level from being outputted to the DDS 12, so that spuriouses appearing in output from a frequency synthesizer can be made lower.

Also in the frequency synthesizer according to Embodiment 8, like Embodiment 6 described above, only an order m for a high spurious appearing in output from the DDS 12 is stored in the memory 32f, and a determination for the frequency setting parameter k is executed according to the order m, so that a capacity of the memory 32f can largely be reduced as compared to that in each of Embodiments 2 to 5. As a result, like in Embodiment 6 described above, a low-cost memory can be used because of reduction of memory capacity, so that reduction of production cost can be realized.

In the frequency synthesizer according to Embodiment 9 of the present invention, processing for re-computing the setting parameters k, R, and N in step S80 in FIG. 5 for Embodiment 2 described above is simplified as compared to Embodiment 2, and an appropriate increment for each of the parameters R, N is previously stored in a memory so that solutions for k, R, and N can easily be obtained using the memory. For this reason, in the frequency synthesizer according to Embodiment 9, configuration other than that of the parameter computing section is the same as that of Embodiment 2 shown in FIG. 1, so that description is made for configuration of the parameter computing section or operations for re-computing the parameters or the like with reference to the related drawings.

Figure 25:
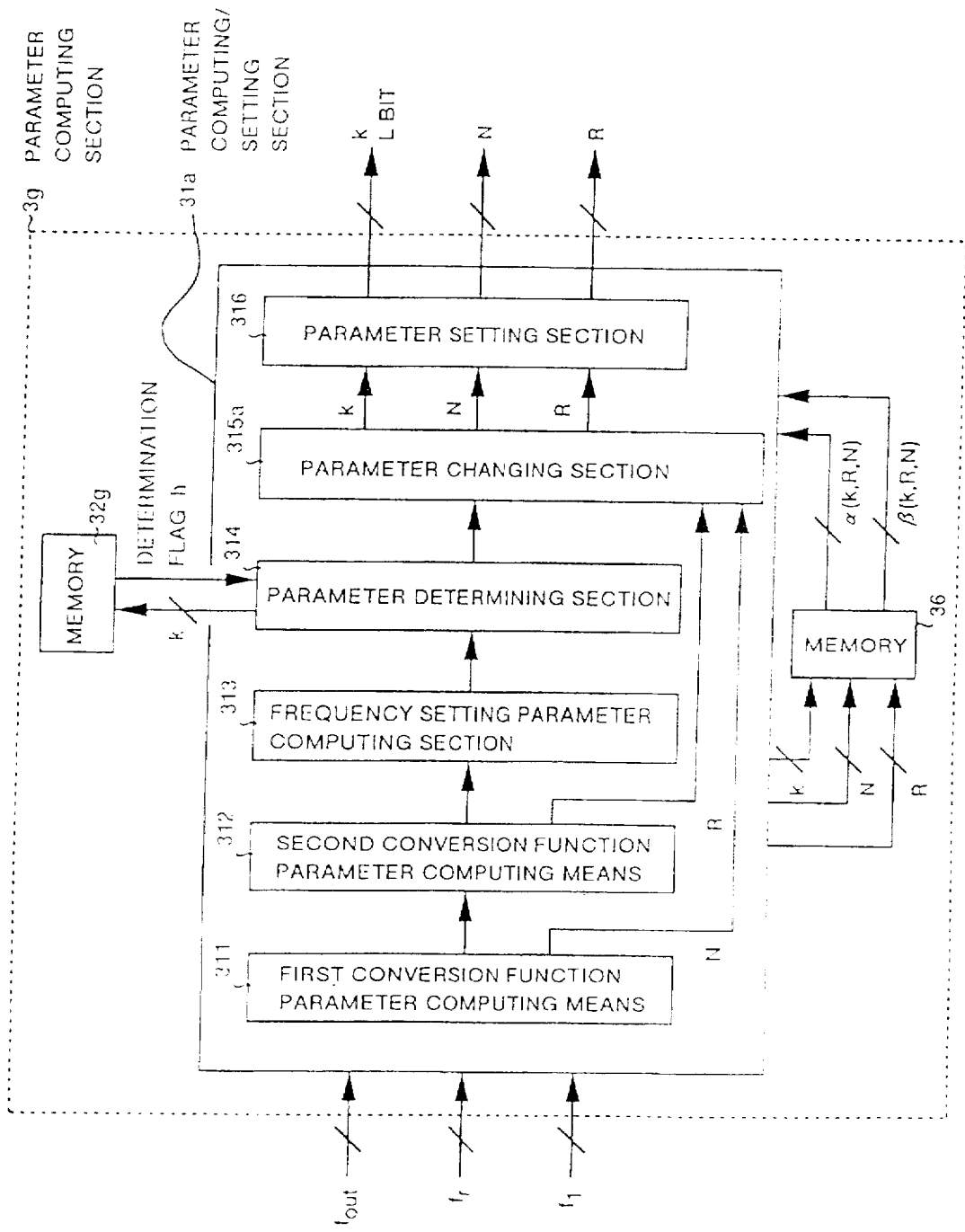
FIG. 25 is a view showing the configuration of the parameter computing section 3 according to Embodiment 9.

FIG. 25 shows the configuration of a parameter computing section 3g according to Embodiment 9. In this figure, designated at the reference numeral 31a is a parameter computing/setting section, at 32g a memory in which a determination flag h used for determination as to whether each frequency setting parameter k is ks for output of a high spurious for each frequency setting parameter k like in the memory 32a in Embodiment 3 described above is previously stored, at 36 a memory in which appropriate increments α, β for the parameters R, N are previously stored as described later.

FIG. 26 shows contents stored in the memory 36 according to Embodiment 9. As shown in FIG. 26, in this memory 36, an address is expressed with 15 bits, and 5-bit setting parameters k, R, N are responded to an upper address, an intermediate address, and a lower address in each memory 35, and appropriate increments α, β for setting parameters for each combination of setting parameters k, R, N; namely increments α, β for setting parameters R, N so that, in a case of setting parameter k, k is not ks are previously stored therein. For instance, in a case where setting parameters k, R, N are 00010, 00010, 00010 respectively, the appropriate increments α, β for the parameters R, N are 00010, 00010 respectively. In the following description, the appropriate increments α, β for the parameters R, N corresponding to a combination of setting parameters k, R, N are expressed with (k, R, N) for α and with (k, R, N) for β.

Next description is made for operation of the frequency synthesizer according to Embodiment 9 with reference to the related drawings.

Figure 27:
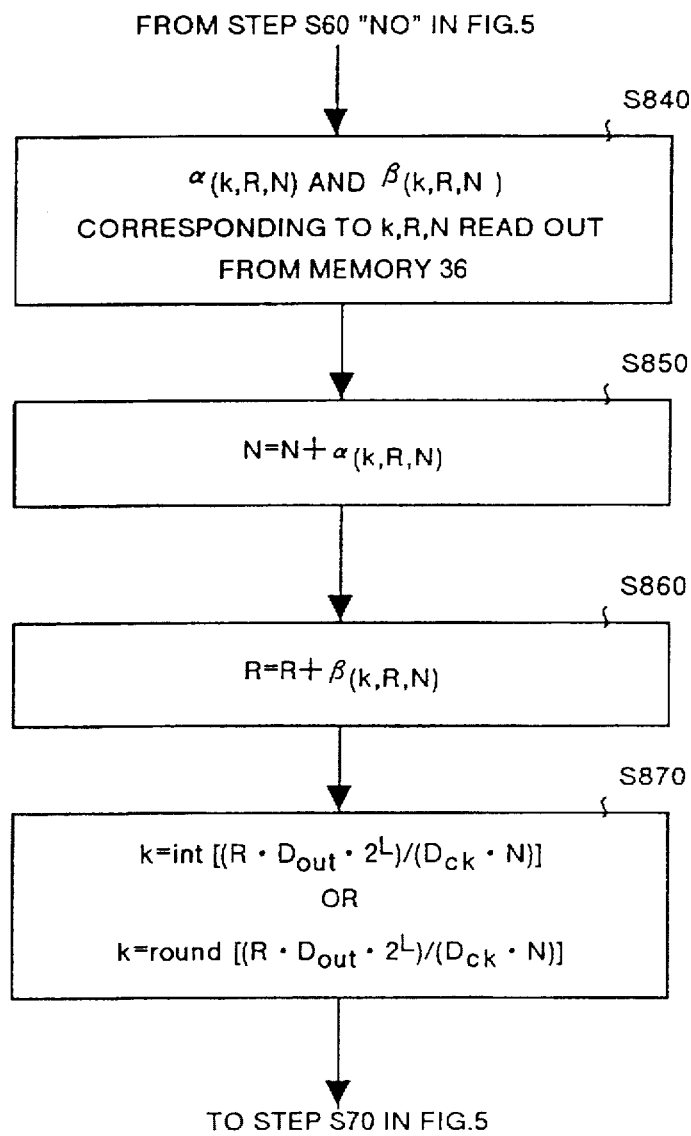
FIG. 27 is a flow chart showing a processing of re-computing parameters in the parameter computing/setting section 31.

FIG. 27 shows a processing flow for re-computing parameters in a parameter changing section 315a in the parameter computing/setting section 31a.

Also in the frequency synthesizer according to Embodiment 9, until a point of time when the processing for computing parameters as shown in FIG. 27 is started, like in Embodiment 2, the setting parameters k, R, N are computed through the steps S10 to S50 as shown in FIG. 5, a determination is made as to whether the setting parameter k obtained through the steps is ks for a high level spurious or not (step S60 "NO"), and according to a result of the determination, it is determined that k is equal to ks (k=ks), and the processing for re-computing parameters shown in FIG. 27 is started.

At first, when it is determined that k is ks, and the processing for re-computing the parameters is started, the parameter changing section 315a accesses the memory 36 according to the upper address, intermediate address, and lower address corresponding to the setting parameters k, R, N obtained through the steps 20 to 50 in FIG. 50, and reads the increments α(k, R, N) and β(k, R, N) for the parameters R, N corresponding to a combination of the setting parameters k, R, N. And the increments α (k, R, N) and β (k, R, N) are added to the parameters R, N respectively as expressed by the following expressions (25) to change the parameters R, N (steps S850, S860).

$$R=R+\alpha(k, R, N)$$

$$N=N+\beta(k, R, N) \quad (25)$$

Then the parameters R, N changed as expressed by the expressions (25) are substituted into the expression (8) like in a case of Embodiment 2, the setting parameter k is re-computed as expressed by the following expression (26) (step S870).

$$k=\text{int}[R \cdot D_{out} \cdot 2^L)/(f_{ck} \cdot N)] \text{ or}$$

$$k=\text{round}[(R \cdot D_{out} \cdot 2^L)/(f_{ck} \cdot N)] \quad (26)$$

The setting parameters k, R and N are re-computed and changed as described above, the parameters R and N are changed with increments α (k, R, N) and β (k, R, N) so that k is not equal to ks (k≠ks), and with this change k becomes not equal to ks, different from the case shown in Embodiment 2, system control does not return to the processing step 60 for determining the setting parameter k, and directly shifts to step S70 for setting and outputting the parameters k, R, and N.

For the reasons as described above, with the frequency synthesizer according to this embodiment, like Embodiments 2 to 8 described above, when data $D_{out}$ or the like corresponding to the output frequency $f_{out}$ to be outputted from the PLL 2 is inputted into the parameter computing section 3g, the parameter computing section 3g automatically computes each of the setting parameters k, R, N and sets the parameters in the DDS 12 or the like, so that no heavy work load is required for setting the setting parameters k, R, N, and once the setting parameters k, R, N are set, the determination is made as to whether the setting parameter k coincides with the particular frequency setting parameter ks for a high level spurious or not, and output of the particular frequency setting parameter ks for a high level spurious to the DDS 12 is previously prevented, so that spuriouses appearing in output from a frequency synthesizer can be made lower.

Also with the frequency synthesizer according to Embodiment 9, optimal increments α, β for the parameters R, N, namely increments α, β for setting parameters R, N preventing coincidence of setting parameters k, ks and output of high spuriouses from the PLL 2, are previously set in the memory 36, and in a case where the setting parameter coincides with the particular frequency setting parameter ks, the setting parameters k, R, N are changed according to the optimal increments α, β previously stored, so that change of the setting parameters k, R and N has only to be executed once, and a time required for changing the setting parameters k, R, N can be reduced. As a result, a frequency select speed for a frequency synthesizer can be made faster.

Also with the frequency synthesizer according to this embodiment, although both the parameters R and N are changed, by previously storing an optimal increment or decrement for either one of the parameters R, N, either one of the parameters may be increased or decreased.

In Embodiments 2 to 9 described above, the parameter computing sections 3 receives, in addition to data $D_{out}$ corresponding to the output frequency $f_{out}$ to be outputted from the PLL 2, data $D_r$ corresponding to the output frequency $f_r$ from the variable divider 13 or data $D_d$ corresponding to an output frequency $f_d$ from the DDS 12, and computes the setting parameters k, R, N, and in a case where the setting parameter k coincides with ks for output of a high spurious, the parameter computing section 3 further computes the setting parameters k, R, N again, and output the setting parameters k, R, N in a case where k does not coincide with ks, but in this arrangement, a long time is required for computing and re-computing the setting parameters k, R, N in the parameter computing section, and also the circuit becomes disadvantageously complicated.

For this reason, with the frequency synthesizer according to Embodiment 10, the problems as described above are solved by using a memory in place of the parameter computing section.

Figure 28:
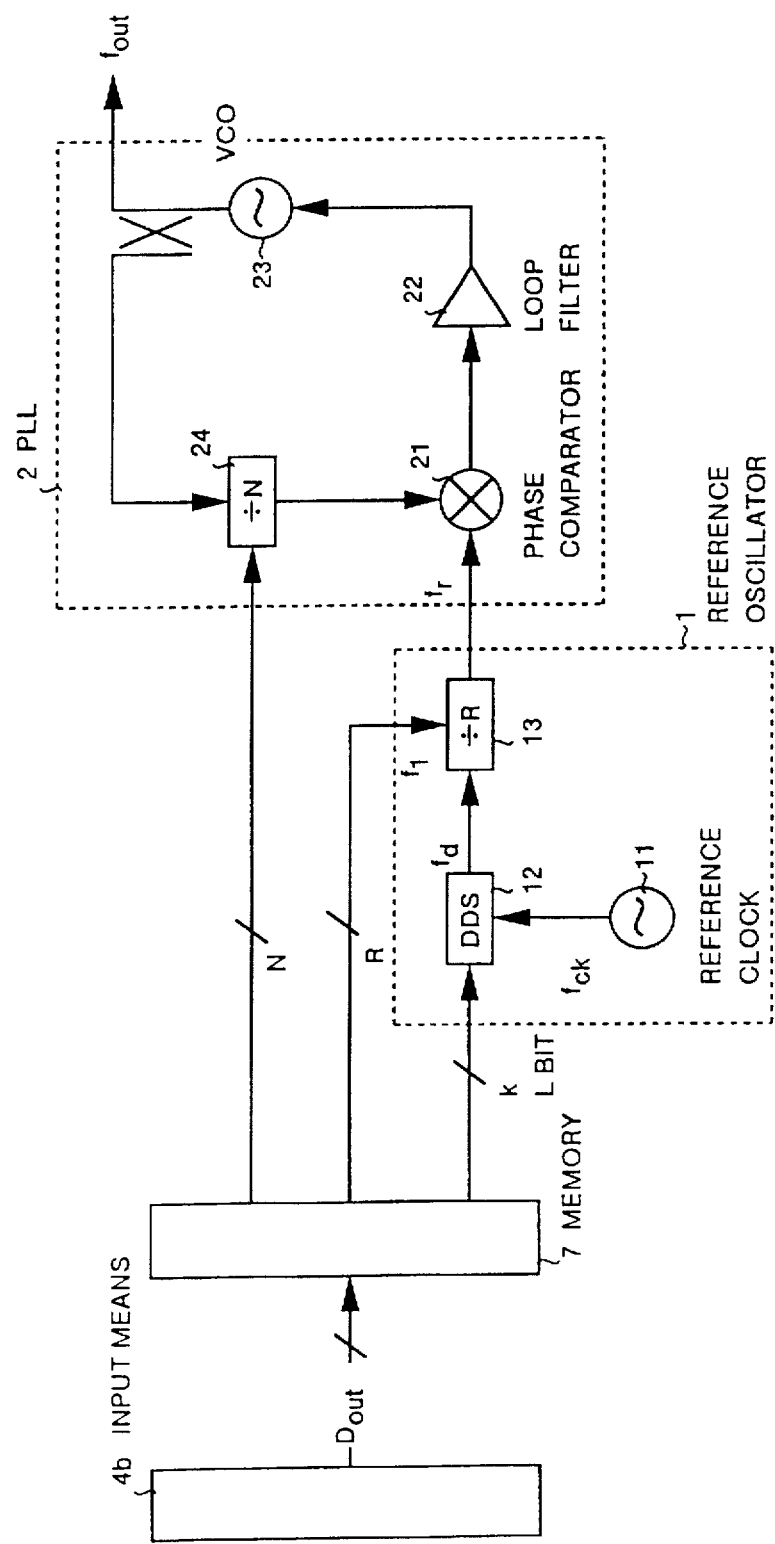
FIG. 28 is a view showing the configuration of Embodiment 10.

FIG. 28 shows the configuration of the frequency synthesizer according to Embodiment 10 of the present invention. In FIG. 28, reference numeral 1 is a reference oscillator, 2 a PLL, 4b an input device 4B for inputting only the data $D_{out}$ corresponding to the output frequency $f_{out}$ to be outputted from the PLL 2, and 7 is a memory in which previously stored are the setting parameters k, R, N corresponding to the data $D_{out}$ for the output frequency $f_{out}$ as shown in FIG. 29. It should be noted that, in FIG. 28, the same reference numerals are assigned to the same components as those in FIG. 1 and description thereof is omitted herein.

FIG. 29 shows contents stored in the memory 7 according to this embodiment. In this memory 7, as shown in FIG. 29, values of the setting parameters k, R, N are specified so that a high spurious will not be outputted for each data $D_{out}$ for each output frequency $f_{out}$ are stored with data $D_{out}$ corresponding to the output frequency $f_{out}$ from the PLL 2 expressed with 5 bits as addresses. It should be noted that values of the setting parameters k, R, and N are previously obtained in correspondence to the data $D_{out}$ corresponding to each output frequency $f_{out}$ according to a configuration of the frequency synthesizer as shown in FIG. 28 or other factors.

Next description is made for operation of the frequency synthesizer according to Embodiment 10 with reference to the related drawings.

Figure 30:
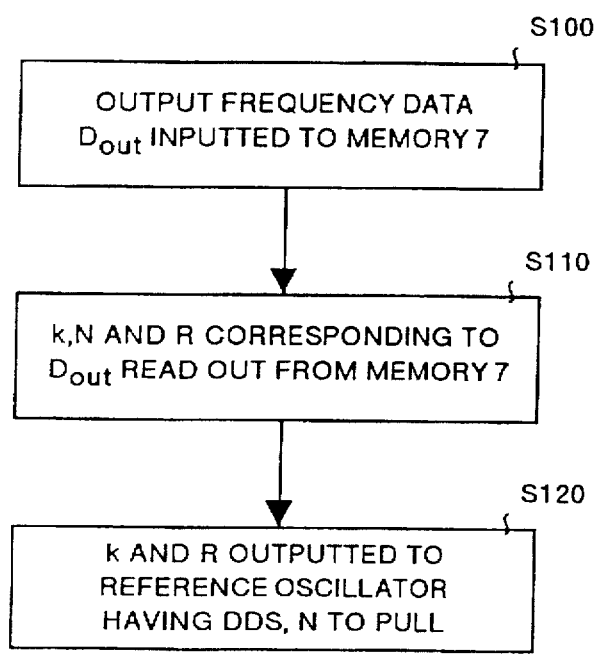
FIG. 30 is a flow chart showing operations in Embodiment 10.

FIG. 30 shows operations of the frequency synthesizer according to Embodiment 10 of the present invention.

At first, the input device 4b inputs data $D_{out}$ corresponding to the output frequency $f_{out}$ to be outputted from the PLL 2 to the memory 7 (step S100), when the setting parameters k, R, N each having an address specified by the data $D_{out}$, namely each corresponding to the data $D_{out}$ are read out from the memory 7 (step S110), and the setting parameters k, R, N read out as described above are outputted to and set in the DDS 12 and the variable divider 13 of the reference oscillator 1 and the variable divider 24 of the PLL 2 respectively (step S120).

Herein, as the setting parameters k, R, N have been specified so that a high spurious will not be outputted for each data $D_{out}$ corresponding to the output frequency $f_{out}$ to be outputted from the PLL 2 according to configuration of the frequency synthesizer or other factors, when the setting parameters k, R, N are once set, the frequency synthesizer does not output a high spurious from the PLL 2, but outputs the received $D_{out}$ as the output frequency $f_{out}$.

For this reason, with the frequency synthesizer according to Embodiment 10, the setting parameters k, R, N are previously stored in the memory 7 so that a high spurious will not be outputted for each data $D_{out}$ corresponding to the output frequency $f_{out}$ to be outputted from the PLL 2, and in a case where the input device 4b inputs the data $D_{out}$ corresponding to the output frequency $f_{out}$, the setting parameters k, R, N corresponding to the data $D_{out}$ are outputted, so that it is not necessary to compute the setting parameters k, R, N corresponding to the data $D_{out}$ or other data nor to execute re-computing for determination of the setting parameter k or for changing the setting parameters k, R, N.

With the frequency synthesizer according to Embodiment 10, different from Embodiments 2 to 9 described above, the parameter computing/setting section formed with a DSP or a CPU is not required with a simplified configuration, and also a time for changing the setting parameters k, R, N is not required, so that a period of time required for setting parameters can be reduced. As a result, it becomes possible to increase a frequency selecting speed in the frequency synthesizer.

It should be noted that, although the above description assumed a frequency synthesizer having one variable divider 13 within the reference oscillator 1 and also a case where one unit of parameter R corresponding to the one unit of variable divider 13 is stored in the memory 7, but in the present invention, as shown in FIG. 7, n variable dividers 13 may be provided within the reference oscillator 1, and in that case it is required to previously store the parameters k, N and parameters $R_1$ to $R_n$ in the memory 7.

In the frequency synthesizer according to Embodiment 11, a frequency mixing device such as a mixer is provided between a DDS and a variable oscillator within a reference oscillator, so the configuration of the reference oscillator in this embodiment is differentiated from that in each of Embodiments 2 to 10 so that a spurious level will become lower as compared to that in Embodiments 2 to 10, and this configuration is applicable to any of the frequency synthesizers according to Embodiments 2 to 10. The following description assumes a case where the reference oscillator according to Embodiment 11 is applied to the reference oscillator according to Embodiment 2.

It should be noted that, in Embodiment 11, expressions for computing the setting parameters k, R, N are different from the expressions for re-computing the setting parameters k, R, N because of difference in configuration according to this embodiment from that in Embodiment 2, and description is made below mainly for the differences between the expressions.

Figure 31:
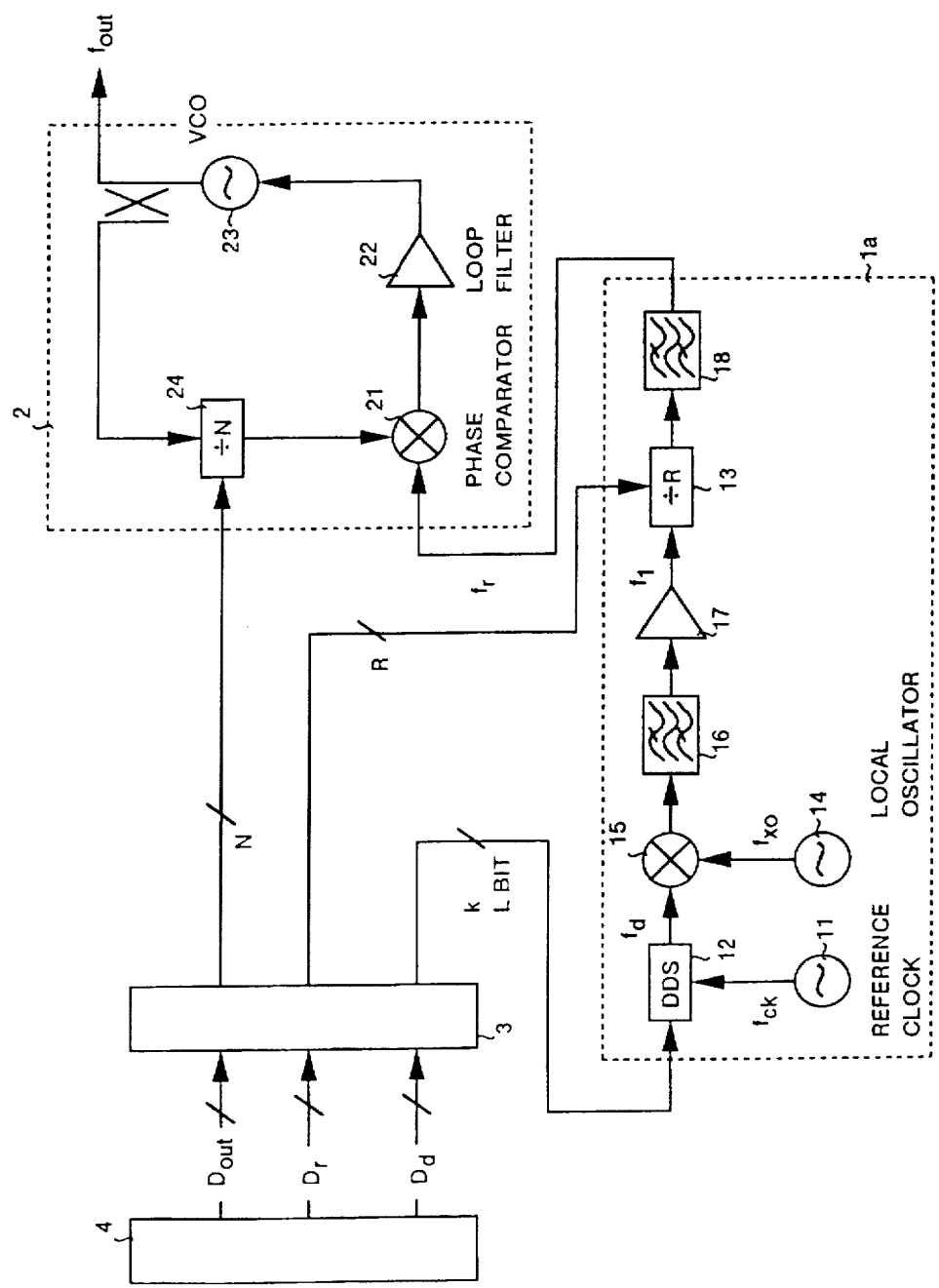
FIG. 31 is a view showing the configuration of Embodiment 11.

FIG. 31 shows the configuration of the frequency synthesizer according to Embodiment 11 of the present invention. It should be noted that, in the frequency synthesizer according to Embodiment 11, configurations of the PLL 2, parameter computing section 3, and input device 4 other than that in the reference oscillator 1a are the same as those in Embodiment 2, so that the same reference numerals are assigned to the corresponding sections and description thereof is omitted herein.

The reference oscillator 1a in Embodiment 11 has the reference clock 11, DDS 12, and variable divider 13 like that in Embodiment 2, and furthermore it has a mixer 15 for mixing the output frequency $f_d$ from the DDS 12 with an oscillation frequency from a local oscillator 14, a BPF 16 for removing unnecessary waves from the mixed output, and an amplifier (AMP) 17 each provided between the DDS 12 and the variable divider 13. Also a BPF 18 for suppressing a harmonic in the variable divider 13 is provided in the latter stage of the variable divider 13. It should be noted that $f_1$ in the figure indicates an input frequency to the variable divider 13 and $f_{xo}$ indicates an output frequency from the local oscillator 14.

Next description is made for the fact that lowering a spurious level as compared to that in Embodiments 2 to 10 can be realized with the reference oscillator 1a according to Embodiment 11 with reference to several expressions.

At first, with the configuration according to Embodiment 2, assuming that a spurious level in the DDS 12 is $SP_{dds}$ (dBc), a spurious level $SP_{out}$ in synthesizer output finally outputted from the PLL 2 is as expressed by the expression (27).

$$SP_{out} = 20 \cdot LOG_{10}(f_{out}/f_d) + SP_{out}(dBc) \tag{27}$$

In contrast, in Embodiment 11, the spurious level $SP_{out}$ in synthesizer output finally outputted from the PLL 2 is as expressed by the expression (28), assuming that an input frequency for the variable divider 13 is $f_1$.

$$SP_{out} = 20 \cdot LOG_{10}(f_{out}/f_1) + SP_{out}(dBc) \tag{28}$$

For this reason, from this expression (28), if it is assumed that $f_1$ is set to a value larger than $f_d$ ($f_1 \gg f_d$) through frequency conversion by the mixer 15, the condition of $20 \cdot LOG_{10}(f_{out}/f_d) \gg 20 \cdot LOG_{10}(f_{out}/f_1)$ is obtained, so that it is understood that the spurious level $SP_{out}$ in the frequency synthesizer according to Embodiment 11 is lower than that in other embodiments.

Operations for parameter setting in the parameter computing section 3 according to Embodiment 11 are executed according to processing sequences shown in FIG. 5 like in Embodiment 2, so that description thereof is omitted herein, and description is made for different points in the expression for computing the setting parameters k, R, N due to change of configuration of the reference oscillator 1 from that in Embodiment 2.

In Embodiment 11, at first the parameters R, N, which are dividing numbers, can be obtained through the expressions (5) and (7) in Embodiment 2.

Then, to obtain the setting parameter k, $D'_d$ is obtained from $D_{out}$, R, and B through the expression (29).

$$D'_d = D_{out} \cdot R/N \tag{29}$$

From this expression (29), the output frequency data $D_d$ corresponding to the output frequency $f_d$ from the DDS 12 to be inputted can be obtained through the following expression (30).

$$D_d = |D_{xo} - D'_d| \tag{30}$$

Herein the $D_{xo}$ is output frequency data corresponding to the output frequency $f_{xo}$ from the local oscillator 14, which is previously given as data to the parameter computing section 3.

For this reason, in Embodiment 11, the frequency setting parameter k from the DDS 12 is given, not through the expression (8) in Embodiment 2, but from the following expression (31), and it can be understood that a freedom in setting the setting parameter k is higher as compared to Embodiment 2 in which the frequency setting parameter k is given through the expression (8).

$$k = int[(2^L/D_{ck}) \cdot |(D_{out} \cdot R/N) - D_{xo}|] \text{ or }$$
$$k = round[(2^L/D_{ck}) \cdot |(D_{out} \cdot R/N) - D_{xo}|] \tag{31}$$

It should be noted that the method of changing the setting parameters k, R, N by re-computing them is the same as that in Embodiment 2, and the setting parameter k is changed by adding α, β to the parameters R, N respectively and then substituting the changed parameters R, N into the expression (31).

For this reason, with the frequency synthesizer according to Embodiment 11, by adding the mixer or the like to a section between the DDS 12 and variable divider 13 within the reference oscillator 1, freedom in setting the frequency setting parameter k for the DDS 12 can be made higher as compared to that in Embodiment 2, it become easier to set the setting parameters k, R, and N for evading generation of spuriouses at a high level.

Figure 32:
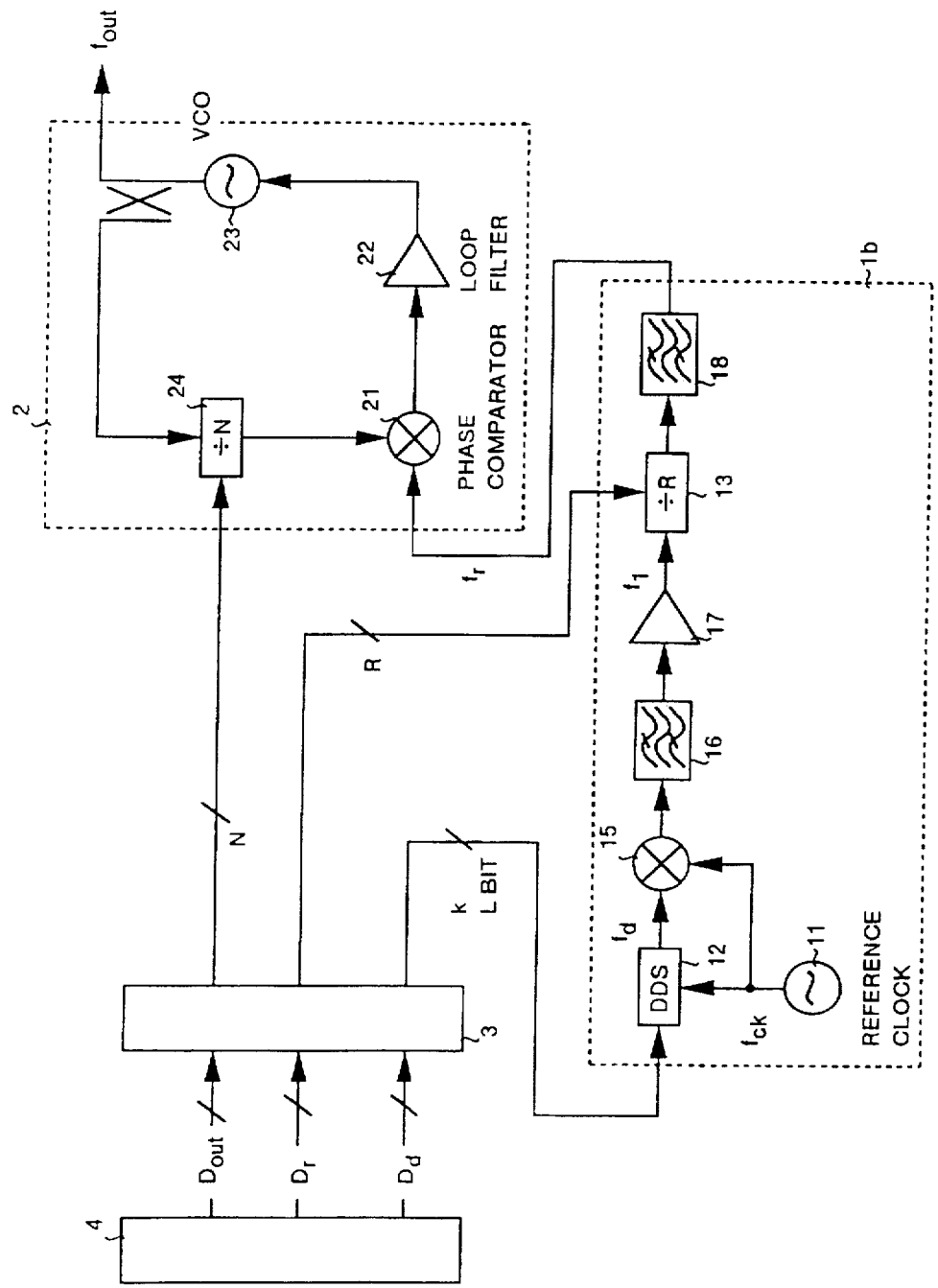
FIG. 32 is a view showing another configuration of Embodiment 11.

It should be noted that, although the above description assumes a case where the local oscillator 14 for the mixer 15 and the reference clock 11 for the DDS 12 were provided in the reference oscillator 1a as shown in FIG. 31, an oscillator in the reference oscillator 1b may be limited only to the reference clock 11 as shown in FIG. 32 and output from the reference clock 11 may be shared by the DDS 12 and the mixer 15. In that case, it is not necessary to provide the local oscillator 14 within the reference oscillator 1b, and it is possible to reduce a number of oscillators, so that the cost becomes lower as compared to the case shown in FIG. 31.

In the frequency synthesizer according to Embodiment 12 of the present invention, like in Embodiment 11 described above, the reference oscillator has different configuration from that in Embodiments 2 to 10 for lowering a spurious level as compared to that in Embodiments 2 to 10, and is applicable to the frequency synthesizer according to Embodiments 2 to 10 described above. The following description assumes that configuration of the reference oscillator in the frequency synthesizer according to Embodiment 12 is applied to the reference oscillator according to Embodiment 2.

It should be noted that the frequency synthesizer according to Embodiment 12 has a reference oscillator with a different configuration from that in Embodiment 2 and the expression for computing the setting parameters k, R, N and expression for re-computing the setting parameters k, R, N applicable in Embodiment 12 are different from those applicable in Embodiment 2, and that for the reason described above description is made herein only for the different points.

Figure 33:
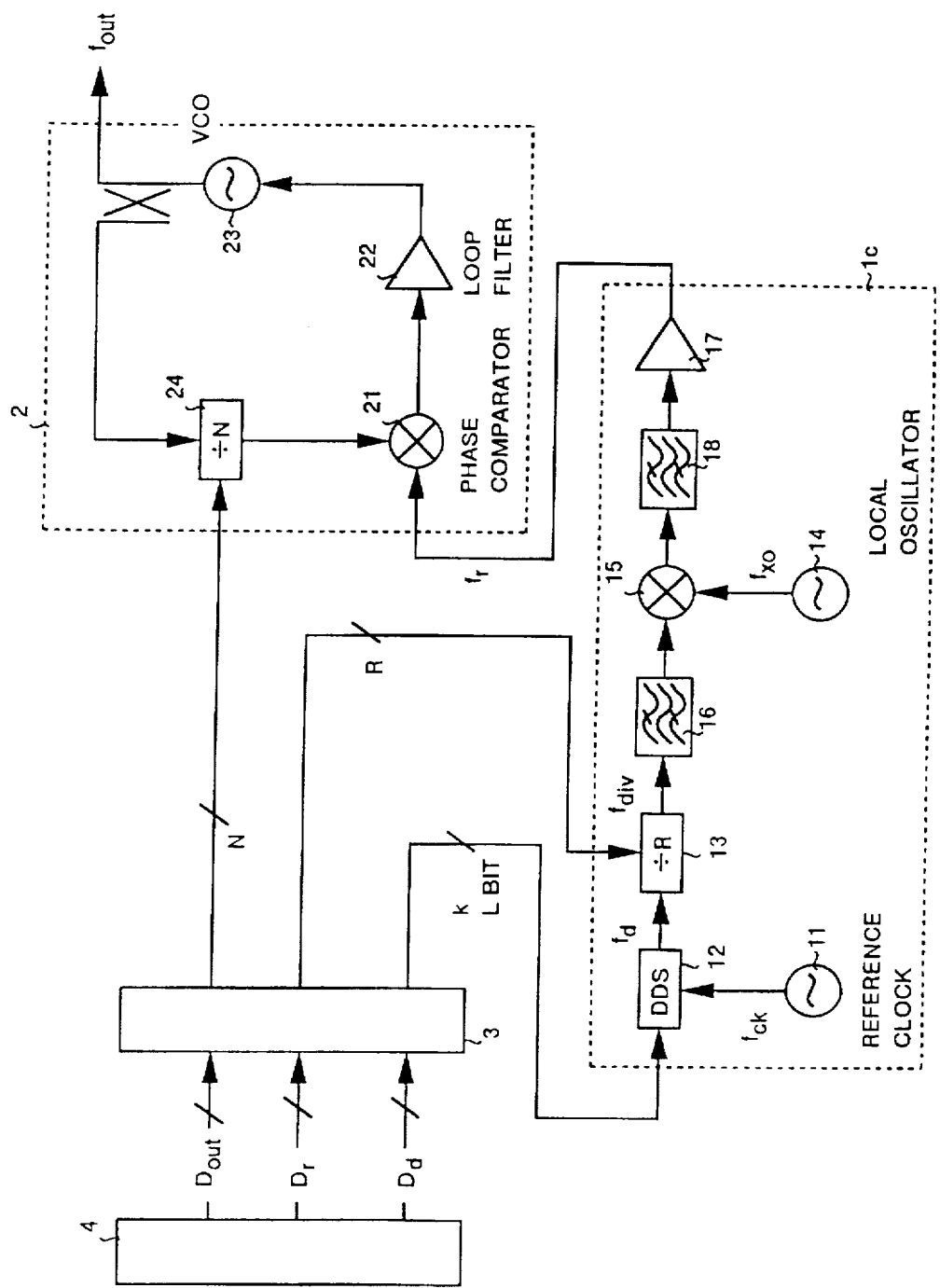
FIG. 33 is a view showing the configuration of Embodiment 12.

FIG. 33 shows configuration of the frequency synthesizer according to Embodiment 12 of the present invention. It should be noted that, in Embodiment 12, configurations of the PLL 2, parameter computing section 3, and input device 4 other than the reference oscillator 1c are the same as those in Embodiment 2, and that the same reference numerals are assigned to the corresponding sections and description thereof is omitted herein.

The reference oscillator 1c according to Embodiment 12 has the reference clock 11, DDS 12, and variable divider 13, and further includes a BPF 18 for suppressing a harmonic in the variable divider 13, a mixer 15 for executing frequency conversion by mixing an output frequency $f_{div}$ from the variable divider 13 with an oscillation frequency $f_{xo}$ from the local oscillator 15, a BPF 16 for removing unnecessary waves from the mixed output, and an amplifier (AMP) 17 each provided in the latter stage of the variable divider 13 and connected in series to each other.

Next description is made for the fact that, with the reference oscillator 1c according to Embodiment 12, a spurious level can be made lower as compared to that in Embodiments 2 to 10, with reference to related expressions.

At first in the configuration in Embodiment 2 described above, assuming that a spurious level in the DDS 12 is $SP_{dds}$ (dBc), a spurious level $SP_{out}$ in synthesizer output finally outputted from the PLL 2 is given through the expression (27).

In contrast, in the frequency synthesizer according to Embodiment 12, the spurious level $SP_{out}$ in synthesizer output finally outputted from the PLL 2 is given by the following expression (32), assuming that an output frequency from the mixer 15 is $f_r$.

$$SP_{out}=20 \cdot LOG_{10}(f_{out}/R \cdot f_r)+SP_{dds}(dBc) \tag{32}$$

Accordingly, if $f_r$ is converted to a value larger than $f_d$ ($f_r \gg f_d$) through frequency conversion by the mixer 15 or other provided in the latter stage of the variable divider 13 using this expression (32), the condition of $20 \cdot LOG_{10}(f_{out}/f_d) \gg 20 \cdot LOG_{10}(f_{out}/R \cdot f_r)$ is satisfied, and for this reason it can be understood from the spurious level in Embodiment 2 that the spurious level $SP_{out}$ in this embodiment 12 is lower as compared to that in Embodiment 2.

The parameter setting operation by the parameter computing section 3 according to Embodiment 3 is executed to the sequence shown in FIG. 5 like in Embodiment 2, so that description thereof is omitted herein, and herein description is made for different points in the expression for computing the setting parameters k, R, N due to a difference in configuration of the reference oscillator 1 from that in Embodiment 2.

In Embodiment 12, at first parameters N and $D'_r$, which are dividing numbers, are similarly obtained through the expression (5) and expression (6) in Embodiment 2. Then $D_{div}$ corresponding to an output frequency $f_{div}$ from the variable divider 13 is computed through the following expression (33).

$$D_{div}=|D'_r-D_{xo}| \tag{33}$$

As the parameter R is given by the expression (7) in Embodiment 2, the frequency setting parameter k for the DDS 12 is given not by the expression (8) in Embodiment 2, but by the following expression (34), and when compared to a case of Embodiment 2 in which the frequency setting parameter k for the DDS 12 is given by the expression (8), it can be understood that a freedom in setting the setting parameter k is higher.

$$k=int[(2^L \cdot R/D_{ck}) \cdot |(D_{out}/N)-D_{xo}|] \text{ or}$$

$$k=round[(2^L \cdot R/D_{ck}) \cdot |(D_{out}/N)-D_{xo}|] \tag{34}$$

It should be noted that the method of changing the setting parameters k, R, N by re-computing them is the same as that in Embodiment 2, and at first the parameters R, N are changed by adding α, β to the parameters R, N, respectively, and then the setting parameter k is changed by substituting the changed parameters R and N into the expression (34).

For this reason, with the frequency synthesizer according to Embodiment 12, the reference oscillator has a configuration in which the mixer 16 or the like is added to the latter stage of the variable divider 13 in the reference oscillator 1 for dividing a frequency of output from the DDS 12, and then the output is subjected to up conversion by the mixer 16, so that not only a high spurious in output from the DDS 12 can be suppressed, but also power consumption can be made lower as compared to that in Embodiment 2 with a freedom in setting the frequency setting parameter k for the DDS 12 and also it becomes easier to set the setting parameters k, R, N for preventing a high level spurious.

Also as the mixer 16 or the like is added to the latter stage of the variable divider 13 in the reference oscillator 1, an input frequency into the PLL 2 can be made higher without raising an operating frequency of the DDS 12, so that there is also provided a merit of being capable of reducing a multiplexing number for a frequency of output from the PLL 2.

Figure 34:
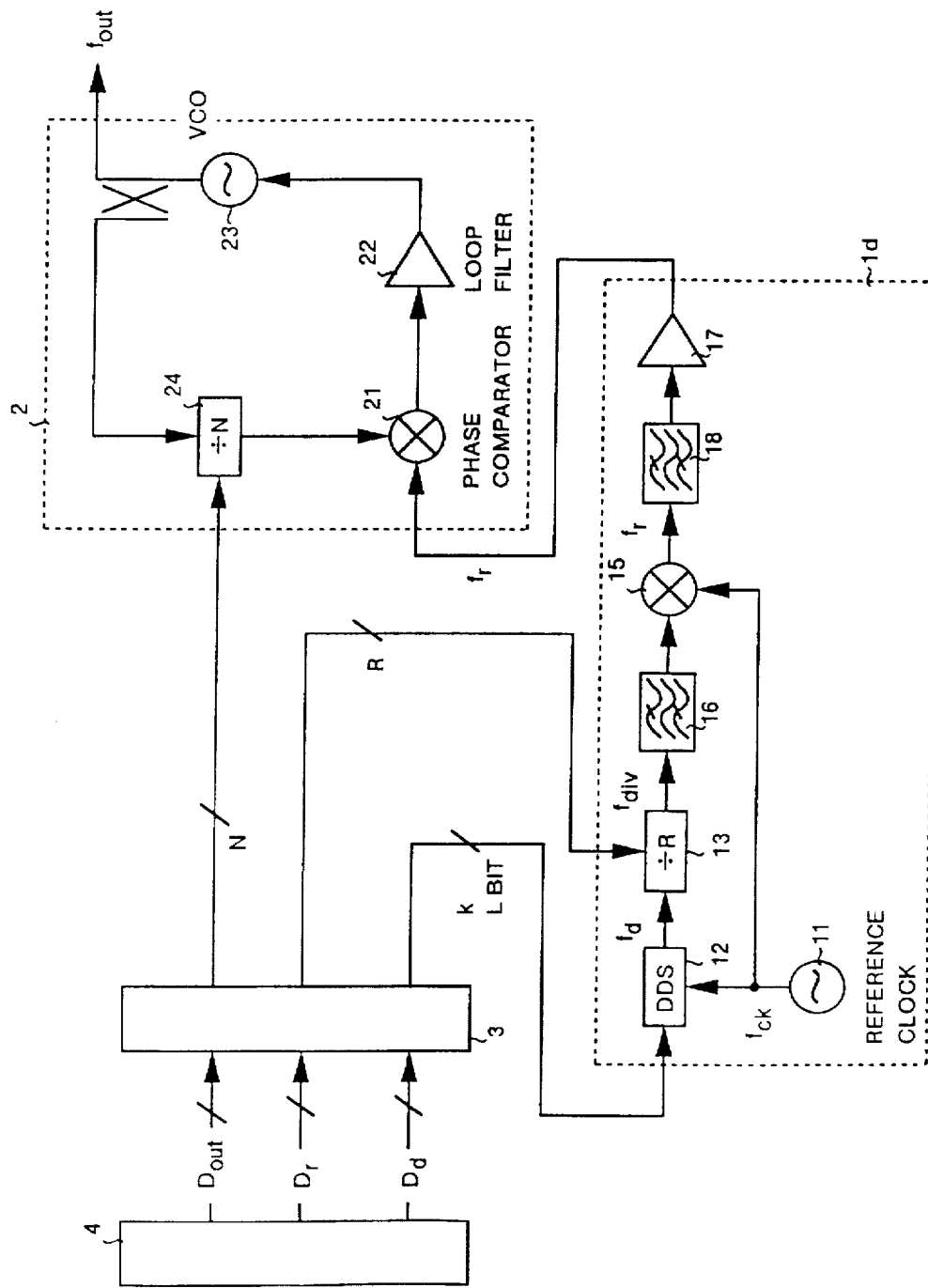
FIG. 34 is a view showing another configuration of Embodiment 12.

It should be noted that, although the above description assumes a case where the local oscillator 15 of the mixer 16 and the reference clock 11 of the DDS 12 are provided in the reference oscillator 1c respectively as shown in FIG. 33, an oscillator in the reference oscillator 1d may be limited to the reference clock 11 as shown in FIG. 34 and output from the reference clock 11 may be shared by the DDS 12 and the mixer 15. In that case, it is not required to provided the local oscillator 14 inside the reference oscillator 13 and a number of oscillators can be reduced, so that the cost can be made lower as compared to that in the case shown in FIG. 33.

The frequency synthesizer according to Embodiment 13 of the present invention has a reference oscillator, like Embodiments 11 and 12, with different configuration from that in Embodiments 2 to 10 to make lower a spurious level as compared to that in Embodiments 2 to 10, and is applicable to the frequency synthesizer according to Embodiments 2 to 10. Description is made hereinafter of the configuration of the frequency synthesizer according to Embodiment 13 assuming application thereof to the reference oscillator according to Embodiment 2.

It should be noted that the expression for computing the setting parameters k, R, N and the expression for re-computing the setting parameters k, R and N applicable for the frequency synthesizer according to Embodiment 13 are different from those applicable in the frequency synthesizer according to Embodiment 2 because of difference between the reference oscillator 1 in Embodiment 13 and Embodiment 2, and that the following description is made mainly for this difference.

Figure 35:
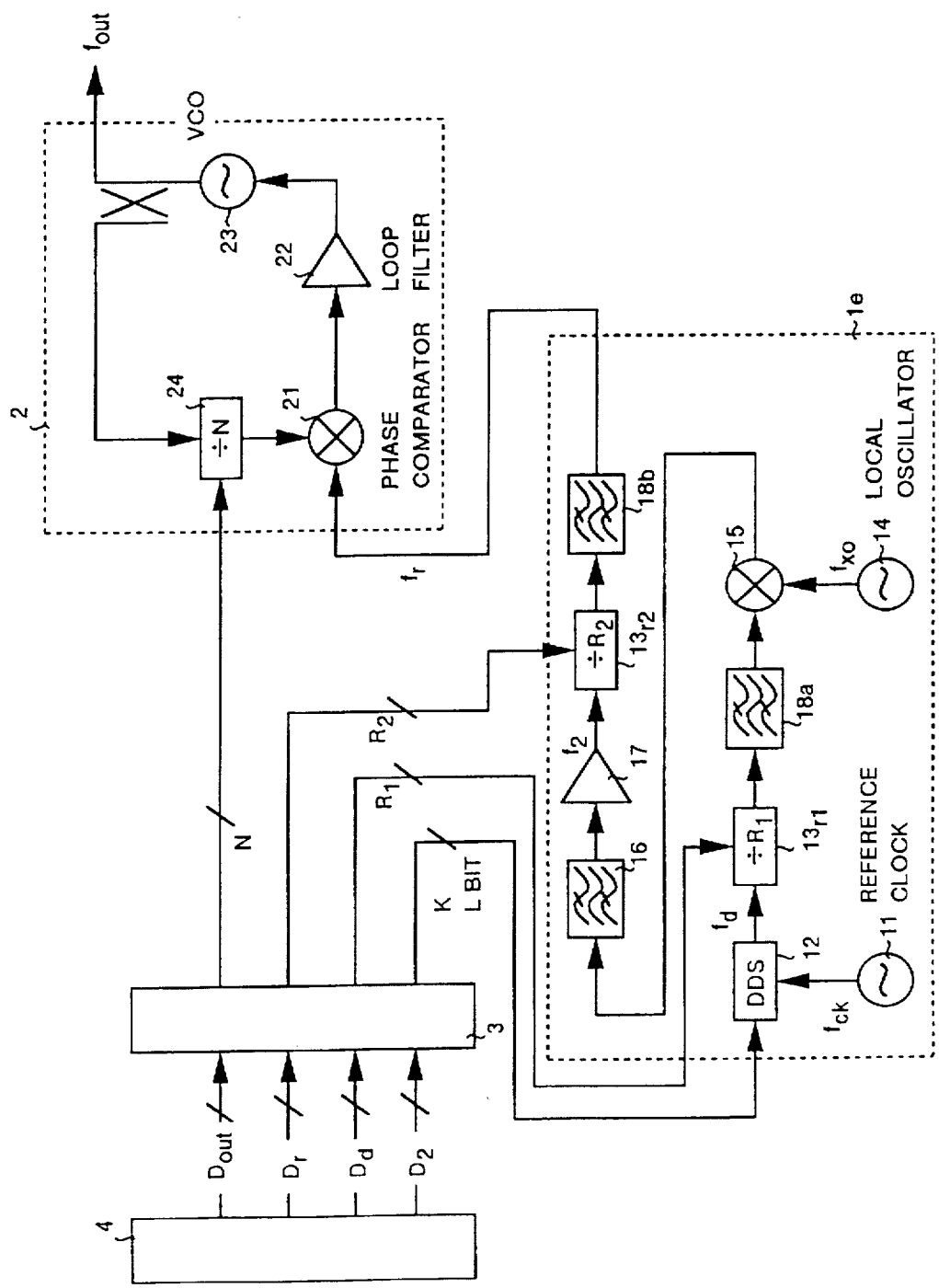
FIG. 35 is a view showing the configuration of Embodiment 13.

FIG. 35 shows the configuration of the frequency synthesizer according to Embodiment 13. It should be noted that, in the frequency synthesizer according to Embodiment 13, configurations of the PLL 2, parameter computing section 3 and input means 4 other than that in the reference oscillator 1e, are the same as those in Embodiment 2, and that, for the reason described above, the same reference numerals are assigned to the corresponding section and description thereof is omitted herein.

The reference oscillator 1e according to Embodiment 13 has the reference clock 11, DDS 12, and two variable dividers $13_{r1}$ and $13_{r2}$, and further includes a BPF 18a for suppressing a harmonic in output from the variable divider $13_{r1}$, a mixer 15 for executing frequency conversion by mixing an output frequency via the BPF 18a from the variable divider $13_{r1}$ with the oscillation frequency $f_{xo}$ from the local oscillator 14, a BPF 16 for removing unnecessary waves from the mixed output from the mixer, and an amplifier (AMP) 17 each provided in a section between the variable divider $13_{r1}$ and the variable divider $13_{r2}$. Also, provided in the latter stage of the variable divider $13_{r2}$ is a BPF 18b for suppressing a harmonic in output from the variable divider $13_{r2}$. It should be noted that, in the figure, $f_{xo}$ indicates an output frequency from the local oscillator 15 and $f_2$ indicates an input frequency into the variable divider $13_{r2}$. Also the BPF 18a and BPF 18b may be low-pass filters.

Next description is made with reference to the expression for the fact that, with the reference oscillator 1e for frequency synthesizer according to Embodiment 13, it is possible to make lower a spurious level as compared to that in Embodiments 2 to 10.

At first, in the configuration according to Embodiment 2, assuming that a spurious level in the DDS 12 was $SP_{dds}$ (dBc), the spurious level $SP_{out}$ in synthesizer output finally outputted was given through the expression (27).

In contrast, in the configuration of the frequency synthesizer according to Embodiment 13, the spurious level $SP_{out}$ in synthesizer output is given by the following expression (35).

$$SP_{out}=20 \cdot LOG_{10}\{f_{out}(R \cdot |f_{xo} \pm f_2|)\}+SP_{dds}(dBc) \quad (35)$$

For this reason, it is understood from this expression that, if it is assumed that frequency conversion to $R \cdot |f_{xo} \pm f_2| >> f_d$ is executed by the mixer 15 or the like provided between the variable dividers $13_{r1}$ and $13_{r2}$, the condition of $20 \cdot LOG_{10} (f_{out}/f_d) >> 20LOG_{10}\{(f_{out}/R \cdot |f_{xo} \pm f_2|)\}$ is realized, and it is understood that the spurious level $SP_{out}$ in Embodiment 13 is lower than that in Embodiment 2.

The parameter setting operation by the parameter computing section 3 in Embodiment 13 is executed according to the same sequence as shown in FIG. 5 in Embodiment 5, so that description thereof is omitted herein and description is made herein only for the different points in the expression for computing the setting parameters k, R, and N due to difference of configuration of the reference oscillator 1e in Embodiment 13 from that in Embodiment 2.

In Embodiment 13, at first the parameters N and $D'_r$, which are dividing numbers for the variable divider 24 in the PLL 2 are obtained through the expression (5) and expression (6) in Embodiment 2. Then the parameter $R_2$, which is a dividing number for the variable divider $13_{r2}$, is obtained through the following expression (36).

$$R_2=int[D'_r/D_2] \text{ or } R_2=round [D'_r/D_2] \quad (36)$$

Herein $D_2$ indicates data corresponding to $f_2$. $D'_2$ can be obtained through the following expression (37) by using $R_2$ and re-computing $D_2$.

$$D'_2=D'r/R_2 \quad (37)$$

For this reason, the parameter $R_1$, which is a dividing number for the variable divider $13_{r1}$, can be obtained through the following expression.

$$R_1=int[D'_2/D_d] \text{ or } R_1=round [D'_2/D_d] \quad (38)$$

So, the frequency setting parameter k for the DDS 12 is given not by the expression (8) in Embodiment 2, but by the following expression (39), and it can be understood that the freedom in setting the setting parameter k is higher as compared to that given by the expression (8) in Embodiment 2.

$$k=int[(2^L \cdot R_1/D_{ck}) \cdot |(D_{out} \cdot R_2/N) - D_{xo}|] \text{ or}$$

$$k=round[(2^L \cdot R_1/D_{ck}) \cdot |(D_{out} \cdot R_2/N) - D_{xo}|] \quad (39)$$

In this embodiment, the method of changing the setting parameters k, R, N by re-computing them is the same as that in Embodiment 2, and at first the parameters R, N are changed by adding α, β to the parameters R, N, and then the changed parameters R, N are substituted into the expression (39) to change the setting parameter k.

For the reasons as described above, in the reference oscillator 1e in the frequency synthesizer according to Embodiment 13, two units of variable dividers $13_{r1}$ and $13_{r2}$ are provided, the mixer 15 or the like is provided in the section between the variable dividers $13_{r1}$ and $13_{r2}$, a frequency of output from the DDS 12 is divided and then subjected to up conversion by the mixer 16, and is further subjected to frequency division, so that not only a high spurious in output from the DDS 12 can be suppressed, but also the power consumption can be made lower as compared to that in Embodiment 12 with a freedom in setting the frequency setting parameter k for the DDS 12 raised, and it becomes easier to set the setting parameters k, R, N for preventing a high level spurious. Also it is possible to make higher an input frequency into the PLL 2 without making higher an operating frequency of the DDS 12, so that there is also a merit of reducing a multiplexing number for a frequency of the PLL 2.

Figure 36:
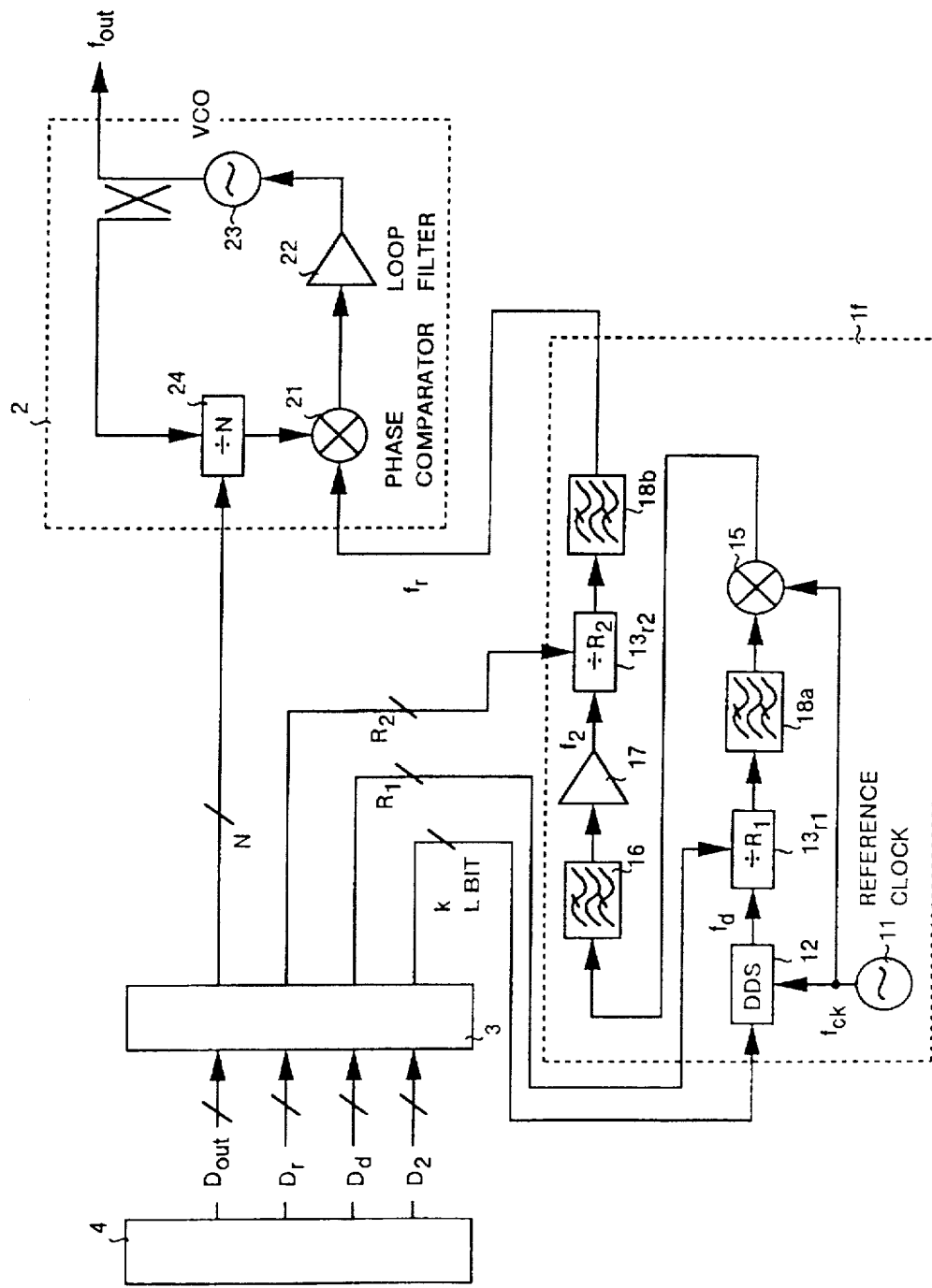
FIG. 36 is a view showing another configuration of Embodiment 13.

Although the above description assumes a case where the local oscillator 14 for the mixer 15 and the reference clock 11 for the DDS 12 are provided in the reference oscillator 1e respectively as shown in FIG. 35, but an oscillator in the reference oscillator 1f may be limited only to the reference clock 11 as shown in FIG. 36, and output from the reference clock 11 may be shared by the DDS 12 and the mixer 15. In that case, it is not necessary to provide the local oscillator 14 inside the reference oscillator 1f, which means the possibility of reducing a number of required oscillators as well as the lower cost as compared to that in the case shown in FIG. 35.

In the frequency synthesizer according to Embodiment 14 of the present invention, like in Embodiments 12, 13 described above, a spurious is made lower as compared to that in Embodiments 2 to 10 by changing the configuration of the reference oscillator as compared to that according to Embodiments 1 to 10, and for this reason the configuration described above can be applied to the frequency synthesizers according to Embodiments 2 to 10 described above. Description is made hereinafter of the configuration of the reference oscillator in the frequency synthesizer according to Embodiment 14 assumed to be applied to the reference oscillator according to Embodiment 2.

In the frequency synthesizer according to Embodiment 14 of the present invention, expressions for computing setting parameters k, R and N and expressions for re-computing the setting parameters k, R and N are different from those in Embodiment 2 because of difference in configuration of the reference oscillator from that according to Embodiment 2, so that description is made mainly for this point of difference therebetween described above.

Figure 37:
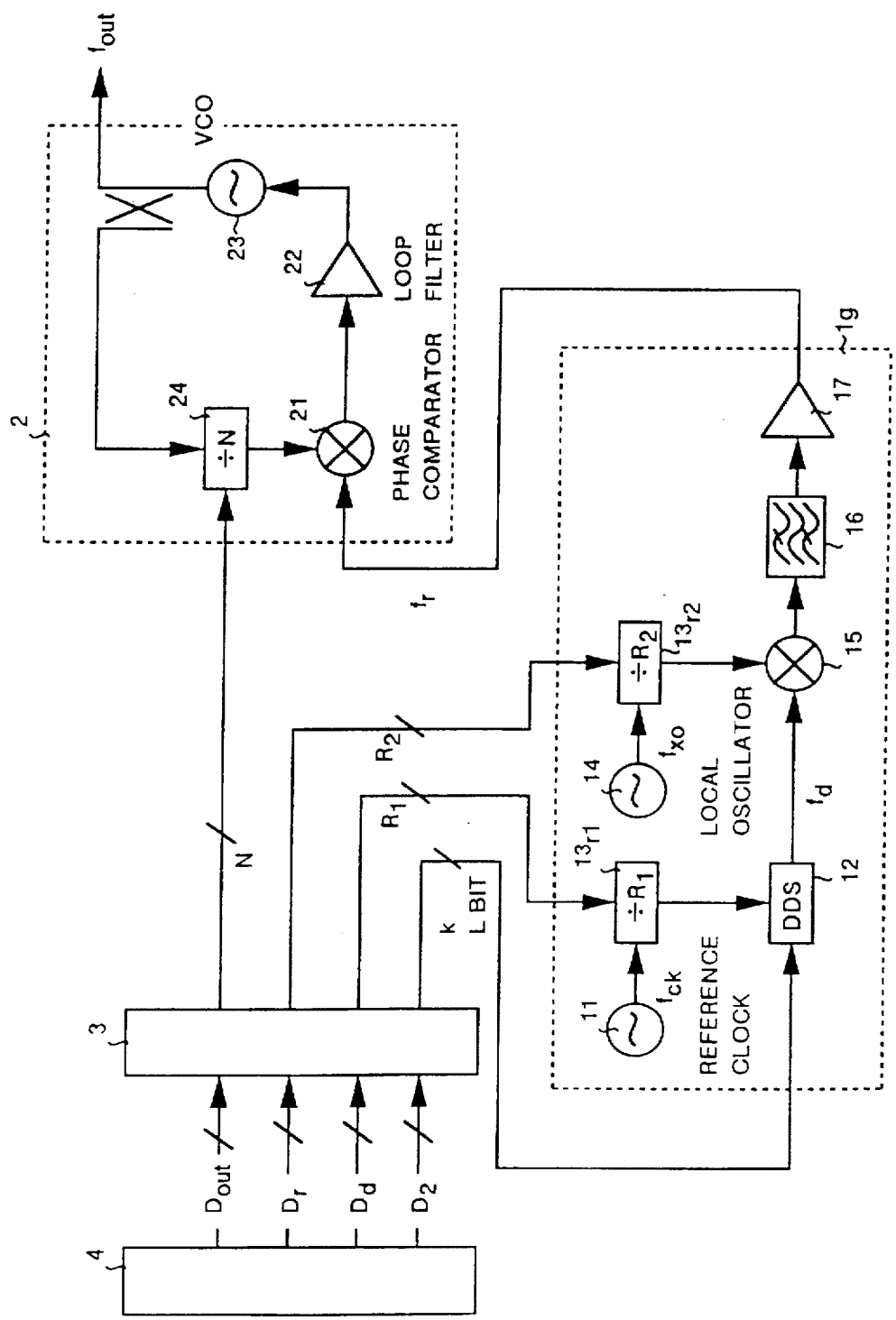
FIG. 37 is a view showing the configuration of Embodiment 14.

FIG. 37 shows the configuration of the frequency synthesizer according to Embodiment 14 of the present invention. It should be noted that, in Embodiment 14, as configurations of the PLL 2 and the parameter computing section 3 other than the reference oscillator 1g is the same as those according to Embodiment 2 described above, the same reference numerals are assigned to sections corresponding to those in Embodiment 2 and description thereof is omitted herein.

The reference oscillator 1g according to Embodiment 14 has a mixer 15 for mixing an output frequency $f_d$ from the DDS 12 with other frequency and converting the mixed frequency, a BPF 16 for controlling any unwanted wave included in output from the mixer 16, and the amplifier 17 each provided in the latter stage of the DDS 12 and connected in series to each other, and makes an output frequency from the amplifier 17 be an input frequency $f_r$ of the PLL 2, and also has a variable divider $13_{r1}$ for dividing an output wave from the reference clock 11 according to a dividing number setting parameter $R_1$ to be a reference clock in the DDS 12, and a variable divider $13_{r2}$ for dividing an output wave from the local oscillator 14 according to a dividing number setting parameter $R_2$ to output the divided wave to the mixer 15.

As setting parameters in the parameter computing section 3 in Embodiment 14 is operated according to the same sequence as that shown in FIG. 5 as that in Embodiment 2 described above, description thereof is omitted herein, and description is made herein for changed points in expressions for computing setting parameters k, R, and N due to change of the configuration of the reference oscillator from that according to Embodiment 2.

At first, in a case of Embodiment 14 of the present invention, dividing numbers N and $D'_r$ of the variable divider 24 in the PLL 2 are obtained by the expression (5) and expression (6) in Embodiment 2. Then a parameter $R_2$ which is a dividing number of the variable divider $13_{r2}$ in the reference oscillator 1f is obtained by the following expression (40).

$$R_2 = \text{int}[(D'_r - D_d)/D_2], \text{ or}$$

$$R_2 = \text{round}[(D'_r - D_d)/D_2] \quad (40)$$

Then a parameter $R_1$ which is a dividing number of a variable divider $13_{r1}$ is obtained by the following expression (41).

$$R_1 = \text{int}[D_{ck}/D'_{ck}], \text{ or}$$

$$R_1 = \text{round}[D_{ck}/D'_{ck}] \quad (41)$$

Herein, $D_{ck}$ indicates data corresponding to the reference clock $f_{ck}$. $D'_{ck}$ indicates data corresponding to an output frequency from the variable divider 13a. It should be noted that $D'_{ck}$ is supposed to be previously stored in the parameter computing section 3.

As a result, a frequency setting parameter k for the DDS 12 is given by the following expression (42) different from that given by the expression (8) in Embodiment 2, and as compared to the case of Embodiment 2 given by the expression (8), it is understood that a freedom in setting of setting parameter k is increased.

$$k = \text{int}[(2^L \cdot R_1/D_{ck}) \cdot ((D_{out}/N) - D_{xo}/R_2], \text{ or}$$

$$k = \text{round}[(2^L \cdot R_1/D_{ck}) \cdot ((D_{out}/N) - D_{xo}/R_2)] \quad (42)$$

It should be noted that, in a method of changing setting parameters k, R, and N by re-computing, like in Embodiment 2, at first, parameters R and N are changed by adding α and β to the parameters R and N respectively, and the setting parameter k is changed by substituting the changed parameters into the expression (42).

For this reason, with the frequency synthesizer according to Embodiment 14, the mixer 15 is not only provided in the reference oscillator 1g, but also the variable divider $13_{r1}$ is provided between the reference clock 11 and the DDS 12, and also the variable divider $13_{r2}$ is provided between the local oscillator 14 and the mixer 15, so that not only a high spurious in the DDS 12 can be controlled, but also power consumption in the DDS 12 can be reduced as compared to the case of Embodiment 12, whereby a freedom in setting of the frequency setting parameter k for the DDS 12 is increased, and each of setting parameters k, R, and N to prevent a high level spurious can easily be set. Also an input frequency to the PLL 2 can be enhanced without enhancing a frequency for operation in the DDS 12, so that a frequency multiplexing number of the PLL 2 can be reduced.

Figure 38:
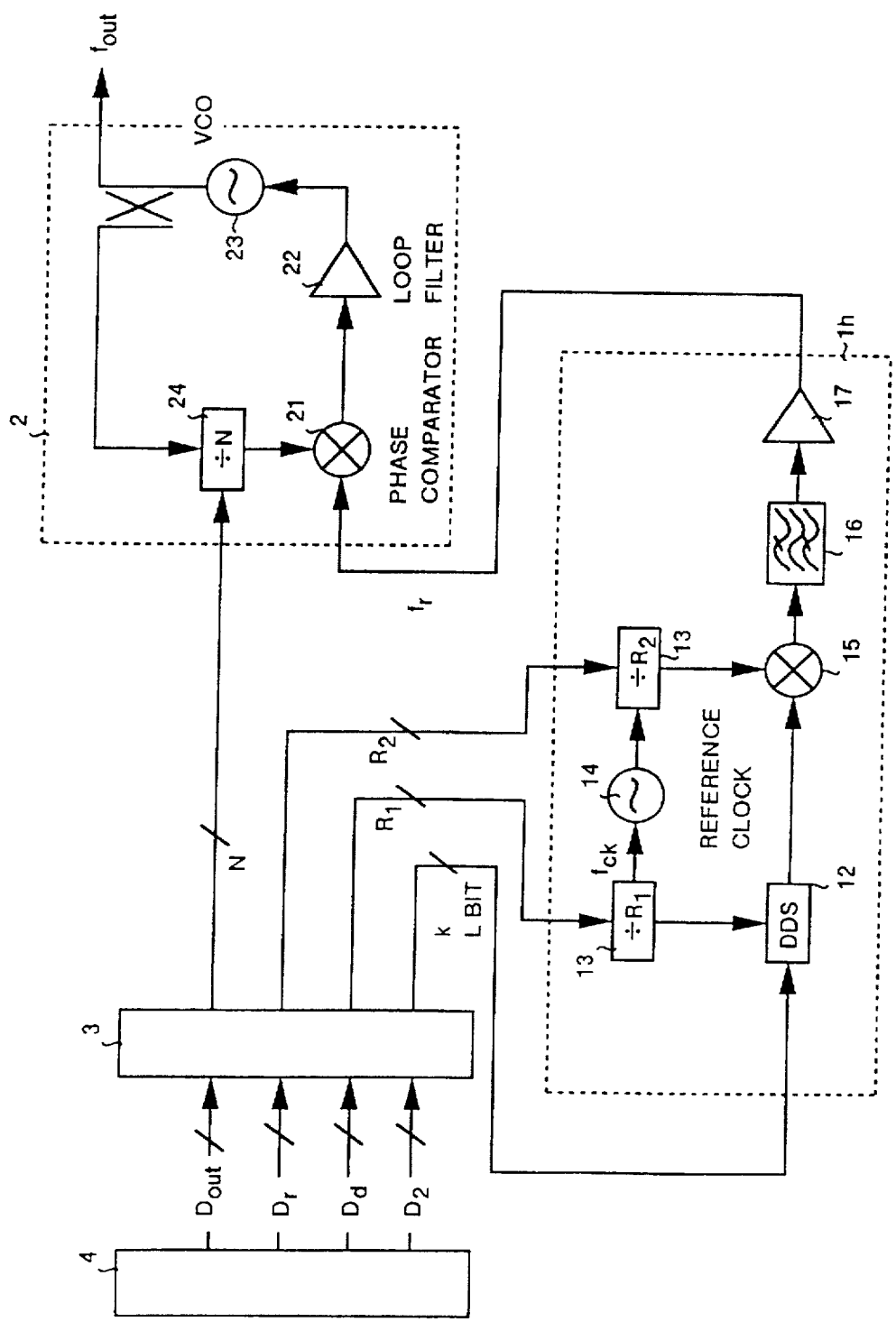
FIG. 38 is a view showing another configuration of Embodiment 14.
Figure 39:
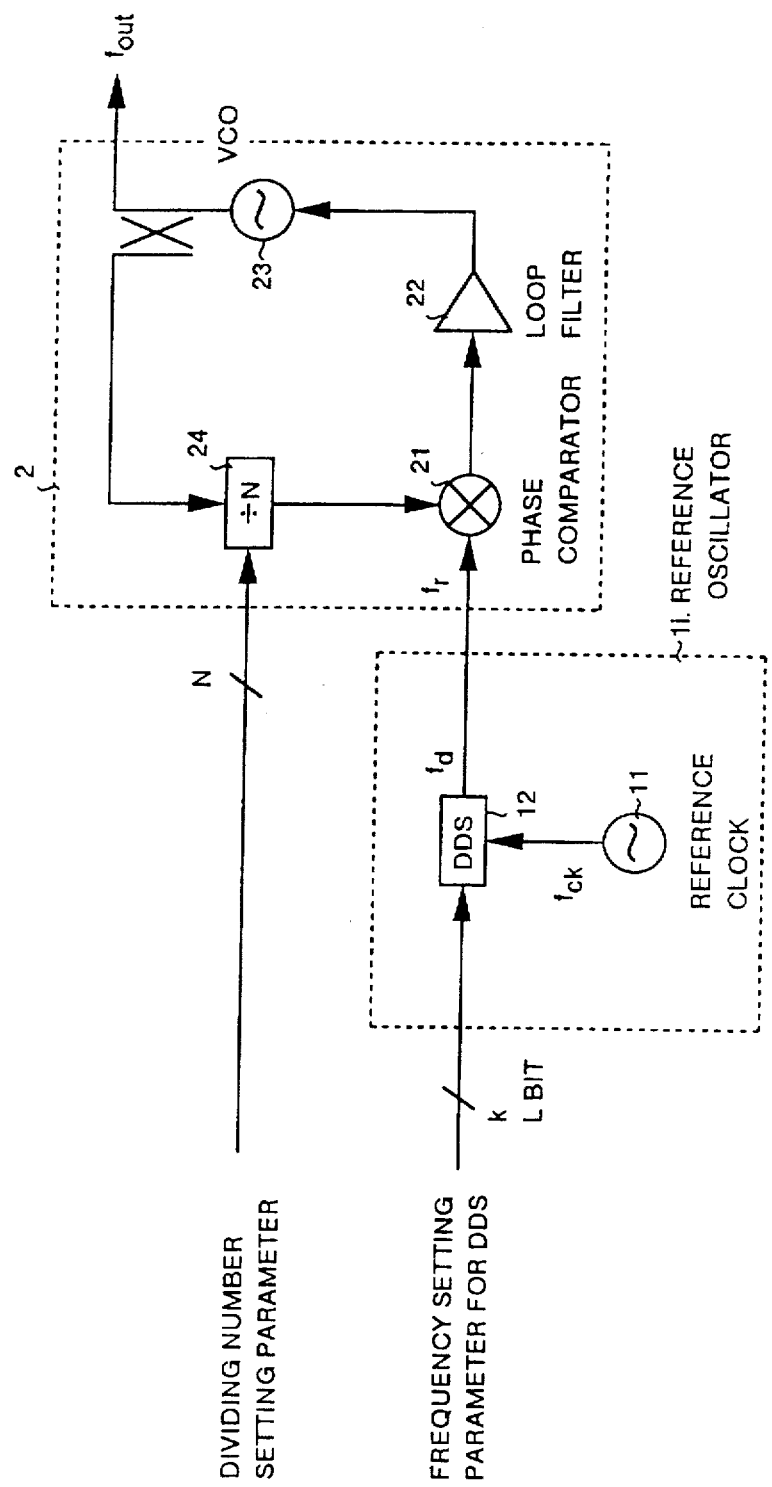
FIG. 39 is a block diagram showing configuration of the frequency synthesizer based on conventional technology.
Figure 40:
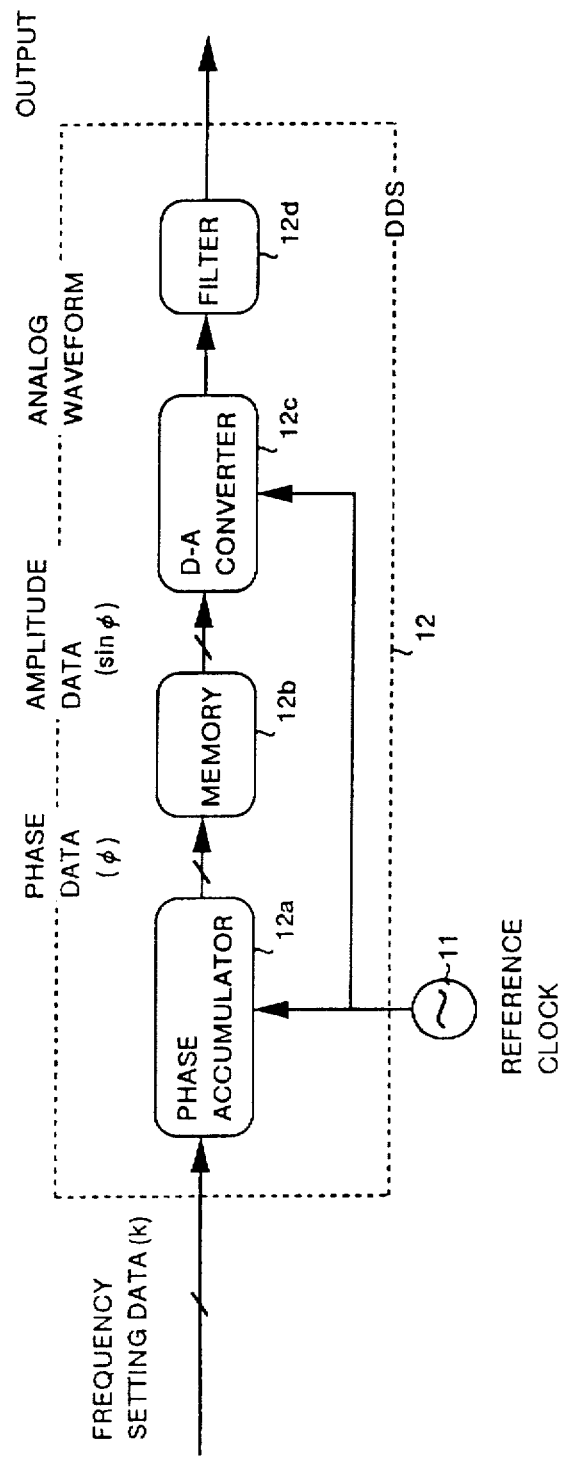
FIG. 40 is a block diagram showing the DDS based on conventional technology.
Figure 41:
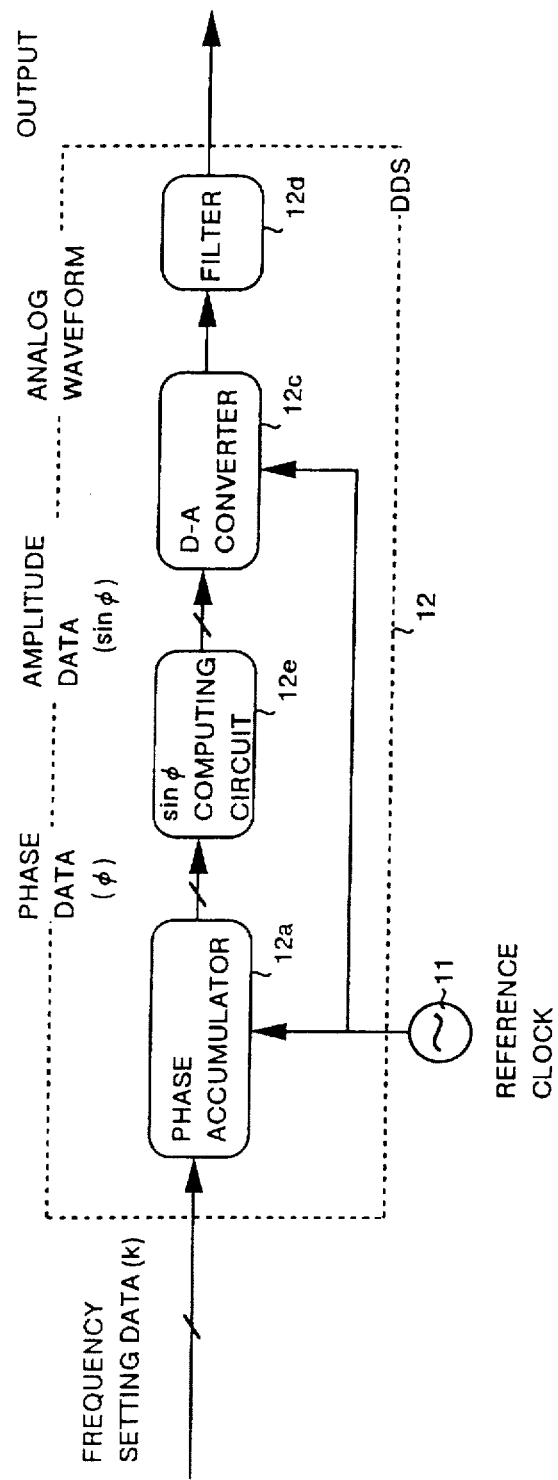
FIG. 41 is another type of block diagram showing the DDS based on conventional technology.

It should be noted that, in the description above, a case where a local oscillator 14 in the mixer 15 and a reference clock 11 in the DDS 12 are provided respectively in the reference oscillator 1g as shown in FIG. 37 is used, but as shown in FIG. 38, only a reference clock 11 is provided in the reference oscillator 1h as an oscillator, and output from the reference clock 11 may be used by the DDS 12 as well as by the mixer 15. In the case as described above, it is not required to provide the local oscillator 14 inside the reference oscillator 1h, and for this reason a number of units of oscillator can be reduced, which makes it possible to achieve low-cost as compared to the case shown in FIG. 37.

This application is based on Japanese patent application No. HEI 8-169949 filed in the Japanese Patent Office on Jun. 28, 1996, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A frequency synthesizer comprising;
   a first frequency synthesizer having a direct digital synthesizer synchronizing to a reference clock and outputting signals at a frequency based on a frequency setting parameter;
   a frequency converter for converting an output frequency from said direct digital synthesizer according to a conversion function setting parameter and outputting the converted frequency; and
   a second frequency synthesizer for converting an output frequency from said frequency converter according to a conversion function setting parameter and outputting the converted frequency; wherein the frequency setting parameter for said direct digital synthesizer, the conversion function setting parameter for said frequency converter, and the conversion function setting parameter for said second frequency synthesizer can be set according to the output frequency from said second frequency synthesizer.

2. The frequency synthesizer of claim 1 further comprising:
   input means for inputting data corresponding to an output frequency to be outputted from said second frequency synthesizer;
   first conversion function setting parameter computing means for computing a conversion function setting parameter for said second frequency synthesizer according to the data received by said input means;
   second conversion function setting parameter computing means for computing a conversion function setting parameter for said frequency converter according to the data received by said input means and to a conversion function setting parameter computed by said first conversion function setting parameter computing means;
   frequency setting parameter computing means for computing a frequency setting parameter for said direct digital synthesizer according to the data received by said input means, the conversion function setting parameter computed by said first conversion function setting parameter means, and to the conversion function setting parameter computed by said second conversion function setting parameter; and parameter setting means for setting the conversion function setting parameter computed by said first conversion function setting computing means, the conversion function setting parameter computed by said second parameter computing means, and the frequency setting parameter computed by said frequency setting parameter computing means in said second frequency synthesizer, said frequency converter, and said direct digital synthesizer, respectively.

3. The frequency synthesizer of claim 2, further comprising:

parameter determining means for determining, when said frequency setting parameter computing means has computed the frequency setting parameter, whether the frequency setting parameter is for outputting a spurious at a specified level or at a level higher than the specified level within an output band of said second frequency synthesizer from the direct digital synthesizer or not; and parameter changing means for changing the conversion function setting parameter and the frequency setting parameter so that the spurious will not be included in the output band of said second frequency synthesizer, when said parameter determining means determines that the frequency setting parameter is for outputting the spurious, and outputting the changed parameter to said parameter setting means.

4. The frequency synthesizer of claim 3, further comprising:

storage means for previously storing therein data used for determining whether a spurious at a specified level or a level higher than the specified level appearing in the output from said direct digital synthesizer for each frequency setting parameter to be set in said direct digital synthesizer is outputted from said second frequency synthesizer or not; wherein said parameter determining means reads out the data used for determining corresponding to the frequency setting parameter from said storage means, when said parameter determining means determines whether the frequency setting parameter is for outputting a spurious at a specified level or at a level higher than the specified level within the output band of said second frequency synthesizer from said direct digital synthesizer or not, according to the data used for determining.

5. The frequency synthesizer of claim 3, further comprising:

storage means for previously storing therein data used for determining, regarding a frequency setting parameter of a direct digital synthesizer as an address, as to whether the frequency setting parameter as an address in each data storage area indicated by each address is for outputting a spurious at a specified level or at a level higher than the specified level within an output band of said second frequency synthesizer from said direct digital synthesizer or not; wherein said parameter determining means accesses said storage means according to the frequency setting parameter as an address and reads out the data used for determining, in a case where a determination is made as to whether the frequency setting parameter is for outputting a spurious at a specified level or at a level higher than the specified level within an output band of said second frequency synthesizer from said direct digital synthesizer or not, according to the data used for determining.

6. The frequency synthesizer of claim 3, further comprising:

storage means for previously storing therein data used for determining, regarding a specified upper bit of a frequency setting parameter for said direct digital synthesizer as an address, as to whether the frequency setting parameter having a specified upper bit at each address in each data storage area indicated by each address is for outputting a spurious at a specified level or at a level higher than the specified level within an output band of said second frequency synthesizer from said direct digital synthesizer or not; wherein said parameter determining means accesses said storage means according to a specified upper bit of the frequency setting parameter as an address for reading the data used for determining when said parameter determining means determines whether the frequency setting parameter is for outputting a spurious at a specified level or a level higher than the specified level within an output band of said second frequency synthesizer from said direct digital synthesizer or not, according to the data used for determining.

7. The frequency synthesizer of claim 3, further comprising:

storage means for previously storing therein, in a case where a direct digital synthesizer outputs a spurious at a specified level or at a level higher than the specified level within an output band of said second frequency synthesizer, a range of a frequency setting parameter for said direct digital synthesizer;

wherein said parameter determining means reads out, in a case where said parameter determining means determines whether a frequency setting parameter is for outputting a spurious at a specified level or a level higher than the specified level within an output band of said second frequency synthesizer from a direct digital synthesizer or not, a range of the frequency setting parameter from said storage means and determines whether the frequency setting parameter is within a range of the frequency setting parameter.

8. The frequency synthesizer of claim 3; further comprising:

storage means for previously storing therein an order of a spurious at a specified level or a level higher than the specified level to be outputted within an output band of said second frequency synthesizer by said direct digital synthesizer; wherein said parameter determining means reads out, in a case where said parameter determining means determines whether a frequency setting parameter is for outputting a spurious at a specified level or at a level higher than the specified level within an output band of said second frequency synthesizer from a direct digital synthesizer or not, an order of the spurious from said storage means, obtains a frequency of a spurious at a specified level or at a level higher than the specified level contained in an output from the said direct digital synthesizer according to the order of said spurious and the frequency setting parameter, and determines whether a frequency of the spurious at a specified level or at a level higher than the specified level obtained is outputted from said second frequency synthesizer.

9. The frequency synthesizer of claim 3; wherein said parameter determining means obtains a specified cycle in a range of the frequency setting parameter according to a particular order when a width of change of an output frequency from a direct digital synthesizer is narrow, a range of a frequency setting parameter of said direct digital synthesizer in which a spurious at a specified level or at a level higher than the specified level appears is almost identical to the specified cycle, and at the same time an order of a spurious at a specified level or at a level higher than the specified level appears in an output from a direct digital synthesizer is limited to a particular order, and if said parameter determining means determines whether a frequency setting parameter is for outputting a spurious at a specified level or a level higher than the specified level within an output band of the second frequency synthesizer from a direct digital synthesizer or not, and determines whether the frequency setting parameter is within a range of the frequency setting parameter for each of the specified cycles.

10. The frequency synthesizer of claim 3, further comprising;

parameter adjusting means for adjusting a frequency setting parameter for said direct digital synthesizer so that an output frequency from said direct digital synthesizer is swept, and storage means for previously storing therein an order of a spurious at a specified level or at a level higher than the specified level appearing in an output from said direct digital synthesizer; wherein said parameter determining means obtains, in a case where said parameter determining means determines whether a frequency setting parameter is for outputting a spurious at a specified level or at a level higher than the specified level within an output band of said second frequency synthesizer from a direct digital synthesizer or not, a range of an order of spurious at a specified level or at a level higher than the specified level appearing in an output from said direct digital synthesizer by adjustment by said parameter adjusting means, reads out an order of the spurious from said storage means, and determines whether the order of the spurious is within a range of the order or not.

11. The frequency synthesizer of claim 3; wherein said parameter changing means increments or decrements at least one of the conversion function setting parameter of said second frequency synthesizer and the conversion setting parameter of said frequency converter by a specified rate when a conversion function setting parameter and a frequency setting parameter are changed so that a spurious at a specified level or at a level higher than the specified level will not be included in an output band of said second frequency synthesizer, and changes a frequency setting parameter of said direct digital synthesizer according to at least one of the incremented or decremented conversion function parameters.

12. The frequency synthesizer of claim 3, further comprising:

storage means for previously storing therein an increment or a decrement of at least one of a conversion function setting parameter for said second frequency synthesizer and a conversion function setting parameter of said frequency converter, said converter function not allowing output of a spurious at a specified level or at a level higher than the specified level within an output band of said second frequency synthesizer from a direct digital synthesizer, in correspondence to a conversion function setting parameter for said second frequency synthesizer, a conversion function setting parameter of said frequency converter, and a frequency setting parameter for said direct digital synthesizer; wherein said parameter changing means reads out the increment or decrement corresponding to a conversion function setting parameter for said second frequency synthesizer, a conversion function setting parameter for said frequency converter, and a frequency setting parameter for said direct digital synthesizer from said storage means when the conversion function setting parameter and the frequency setting parameter are changed so that a spurious at a specified level or at a level higher than the specified level will not be included in an output band of said second frequency synthesizer, increments or decrements at least one of the conversion function setting parameters according to the increment or decrement, and at the same time changes a frequency setting parameter for a direct digital synthesizer according to at least one of said incremented or decremented conversion function setting parameters.

13. A frequency synthesizer comprising:

a first frequency synthesizer having a direct digital synthesizer synchronizing to a reference clock and outputting signals with a frequency based on a frequency setting parameter;

a frequency converter for converting an output frequency from said direct digital synthesizer according to a conversion function setting parameter and outputting the converted frequency;

a second frequency synthesizer for converting an output frequency from said frequency converter according to a conversion function setting parameter and outputting the converted frequency;

input means for inputting data corresponding to an output frequency to be outputted from said second frequency synthesizer as an address; and storage means for previously storing therein, data corresponding to an output frequency to be outputted from said second frequency synthesizer as an address, a frequency setting parameter for said direct digital synthesizer, a conversion function setting parameter for said frequency converter, and a conversion function setting parameter for said second frequency synthesizer, for each of which a spurious at a specified level or at a level higher then the specified level appearing in an output from a direct digital synthesizer in each data storage area indicated by each address will not be included in an output band of said second frequency synthesizer and which said second frequency synthesizer outputs with the output frequency, and outputting, in a case where the address is inputted by said input means, the frequency setting parameter for said direct digital synthesizer, the conversion setting parameter for said frequency converter, and the conversion function setting parameter for said second frequency synthesizer to said direct digital synthesizer, said frequency converter, and said second frequency synthesizer, respectively.

14. The frequency synthesizer of claim 13; wherein said first frequency synthesizer includes a variable divider for dividing an output frequency from a direct digital synthesizer according to a conversion function setting parameter.

15. The frequency synthesizer of claim 13; wherein said first frequency synthesizer includes a frequency mixer for mixing an output frequency from a direct digital synthesizer with another signal frequency and outputting the mixed frequency and a variable divider for dividing an output frequency from said frequency mixer according to a conversion function setting parameter.

16. The frequency synthesizer of claim 13; wherein said first frequency synthesizer includes a variable divider for dividing an output frequency from a direct digital synthesizer according to a conversion function setting parameter and a frequency mixer for mixing an output frequency from said variable divider with another signal frequency and outputting the mixed frequency.

17. The frequency synthesizer of claim 13; wherein said first frequency synthesizer includes a plurality of variable dividers connected in series to each other each for dividing an output frequency from a front stage of a direct digital synthesizer according to a conversion function setting parameter, each of said plurality of variable dividers being provided in a latter stage of said direct digital synthesizer.

18. The frequency synthesizer of claim 13; wherein said first frequency synthesizer includes a plurality of variable dividers connected in series to each other each for dividing an output frequency from a front stage of a direct digital synthesizer according to a conversion function setting parameter, each of said plurality of variable dividers being provided in a latter stage of the direct digital synthesizer, and a frequency mixer for mixing an output frequency from a variable divider in a front stage with another signal frequency between each of said plurality of variable dividers.

19. The frequency synthesizer of claim 13; wherein said first frequency synthesizer includes a first variable divider for dividing a reference clock according to a conversion function setting parameter and having the divided frequency inputted into a direct digital synthesizer, a frequency mixer for mixing an output frequency from the direct digital synthesizer with another signal frequency and outputting the mixed frequency; and a second variable divider for dividing another signal frequency according to a dividing setting parameter and inputting the divided frequency into said frequency mixer.

20. The frequency synthesizer of claim 13; wherein said second frequency synthesizer is a phase locked loop, when converting an output frequency from said first frequency synthesizer according to a conversion function setting parameter and outputting the converted frequency as data corresponding to an output frequency to be outputted from the second frequency synthesizer, for outputting the data so that a frequency obtained by dividing the output frequency by a variable divider according to the conversion function setting parameter will coincide with an output frequency from said first frequency synthesizer.

* * * * *